(12) United States Patent
Mizutani et al.

(10) Patent No.: US 6,939,662 B2
(45) Date of Patent: Sep. 6, 2005

(54) POSITIVE-WORKING RESIST COMPOSITION

(75) Inventors: Kazuyoshi Mizutani, Shizuoka (JP); Shinichi Kanna, Shizuoka (JP); Tomoya Sasaki, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 29 days.

(21) Appl. No.: 10/448,041

(22) Filed: May 30, 2003

(65) Prior Publication Data

US 2004/0005512 A1 Jan. 8, 2004

(30) Foreign Application Priority Data

| May 31, 2002 | (JP) | P. 2002-158821 |
| May 31, 2002 | (JP) | P. 2002-158822 |
| Jun. 3, 2002 | (JP) | P. 2002-161617 |
| Sep. 30, 2002 | (JP) | P. 2002-285486 |

(51) Int. Cl.$^7$ ............................................. G03F 7/039
(52) U.S. Cl. .................... 430/270.1; 430/913; 526/242; 526/280; 526/281
(58) Field of Search ............................ 430/270.1, 913; 526/242, 280, 281

(56) References Cited

U.S. PATENT DOCUMENTS

2001/0038969 A1   11/2001   Hatakeyama et al.

FOREIGN PATENT DOCUMENTS

| EP | 1 142 928 A1 | 10/2001 |
| EP | 1 273 969 A2 | 1/2003 |
| EP | 1 341 038 A2 | 9/2003 |
| WO | WO 00/17712 A1 | 3/2000 |
| WO | WO 00/67072 A1 | 11/2000 |
| WO | WO 01/37047 A2 | 5/2001 |
| WO | WO 02/44814 A2 | 6/2002 |
| WO | WO 02/077712 A2 | 10/2002 |

OTHER PUBLICATIONS

R.R. Kunz et al., "Outlook for 157–nm resist design" SPIE vol. 367 (1999), pp. 12–23.
Ralph R Dammel et al., "Transparent Resins for 157 nm Lithography" SPIE vol. 4345 (2001) pp. 350–360.
Raymond J. Hung et al., "Resist Materials for 157 nm Microlithography: An Update" SPIE vol. 4345 (2001), pp. 385–395.
Dirk Schmaljohann et al., "Design Strategies for 157 nm Single–Layer Photoresists: Lithographic Evaluation of a Poly($\alpha$–trifluoromethyl vinyl alcohol) Copolymer" SPIE vol. 3999 (2000), pp. 330–335.
Michael K. Crawford et al., "New Materials for 157 nm Photoresists: Characterization and Properties" SPIE vol. 3999 (2000), pp. 356–375.
Partial Search Report dated Oct. 15, 2003.
Vaishali R. Vohra et al., "Highly Transparent Resist Platforms for 157 nm Microlithography: An Update", Proceedings of the SPIE, 2002, vol. 4690, No. 1, pp. 84–93.
Will Conley et al., "Dissolution Inhibitors for 157 nm Microlithography", The International Society For Optical Engineering, 2002, vol. 4690, No. 1, pp. 69–75.
European Search Report dated May 18, 2004.

*Primary Examiner*—Hoa Van Le
(74) *Attorney, Agent, or Firm*—Sughrue Mion, PLLC

(57) ABSTRACT

A positive-working resist composition comprising:
  (A1) a resin containing a repeating unit represented by the specific formula, which increases the solubility in an alkali developing solution by the action of an acid, and
  (B) a compound capable of generating an acid upon irradiation with one of actinic rays and radiation.

11 Claims, No Drawings

POSITIVE-WORKING RESIST COMPOSITION

FIELD OF THE INVENTION

The present invention relates to a positive-working resist composition for use in microlithographic process for the production of super LSI or high capacity microchip or other photofabrication processes. More particularly, the invention relates to a positive-working resist composition which can be processed with ultraviolet rays having a wavelength of not greater than 160 nm in vacuo to form a high precision pattern.

BACKGROUND OF THE INVENTION

The degree of integration of integrated circuits has increased more and more. Under these circumstances, it has become necessary to work ultrafine patterns comprising lines with a width of less than quarter micron in the art of production of semiconductor substrates for super LSI, etc. As a means for providing a finer pattern there is known a method involving the use of an exposing light source having a shorter wavelength for the formation of resist pattern.

For the production of semiconductor elements having an integration degree of up to 64 M bits, i-ray (365 nm) emitted by a high voltage mercury vapor lamp has been used to date. As positive-working resists adapted for this light source there have been developed many compositions containing a novolac resin and a naphthoquinonediazide compound as a photosensitive material. These compositions have produced sufficient results in the work of lines having a width of about 0.3 µm or greater. For the production of semiconductor elements having an integration degree of 256 M bits or greater, KrF excima laser beam (248 nm) has been employed as an exposing light source instead of i-ray.

For the purpose of producing semiconductor elements having an integration degree of 1 G bits or greater, the use of ArF excima laser beam (193 nm), which has a shorter wavelength, has been studied. Further, the use of F2 excima laser beam (157 nm) has been studied for the formation of patterns having a line width of not greater than 0.1 µm.

In order to cope with the reduction of the wavelength of these light sources, the constituents of resist material and the compound structure thereof have been changed drastically.

As a resist composition adapted for exposure to KrF excima laser beam there has been developed a so-called chemically-sensitized resist, i.e., composition comprising in combination a resin protected by an acid-decomposable group having a basic skeleton made of a poly (hydroxystyrene) having a small absorption at 248 nm as a main component and a compound which produces an acid when irradiated with far ultraviolet ray (photo-acid generator).

As a resin composition adapted for exposure to ArF excima laser beam (193 nm) there has been developed a chemically-sensitized resist comprising an acid-decomposable resin having an alicyclic structure having no absorption at 193 nm incorporated therein in its polymer main chain or side chain.

Referring to $F_2$ excima laser beam (157 nm), it was found that even the aforementioned alicyclic resin shows a great absorption at 157 nm and thus leaves something to be desired in the formation of desired patterns having a line width of not greater than 0.1 µm. It is reported in Proc. SPIE. Vol. 3678. page 13 (1999) that a resin having fluorine atom (perfluoro structure) incorporated therein has a sufficient transparency to $F_2$ excima laser beam (157 nm). The structure of effective fluororesins are proposed in Proc. SPIE. Vol. 3999. page 330 (2000), page 357 (2000), page 365 (2000), WO-00/17712, etc. Thus, resist compositions containing fluororesin have been studied.

However, these resist compositions leave something to be desired in various properties such as transparency, sensitivity and resolving power. These fluororesins also are disadvantageous in that they have a poor coatability.

Moreover, resist compositions containing fluororesin adapted for exposure to $F_2$ excima laser beam have problems with line edge roughness, defective development and development residue (scum). It has been thus desired to solve these problems.

The term "line edge roughness" as used herein is meant to indicate that the edge on the border of the line pattern on the resist with the substrate has a shape having an irregular change in the direction perpendicular to the line direction. When this pattern is observed from above, the edge shows unevenness (± few nanometers to scores of nanometers). This roughness can be transferred to the substrate at the etching step. Thus, when this roughness is great, electrical defectives occur, resulting in the drop of yield.

SUMMARY OF THE INVENTION

It is therefore an object of the invention to provide appositive-working resist composition suitable for use with an exposing light source which emits light having a wavelength of not greater than 160 nm, particularly $F_2$ excima laser beam (157 nm). Specifically, the object of the invention is to provide a positive-working resist composition which exhibits a sufficient transmission during the use of a light source having a wavelength of 157 nm.

It is an additional object of the invention to provide a positive-working resist composition which exhibits a sufficient transmission during the use of a light source having a wavelength of 157 nm and shows a high sensitivity, a high resolving power and an excellent coatability.

It is a still additional object of the invention to provide a positive-working resist composition which exhibits a sufficient transmission during the use of a light source having a wavelength of 157 nm and shows less line edge roughness, defective development and scum.

The inventors made extensive studies paying their attention to the aforementioned properties. As a result, it was found that the aims of the invention are accomplished by the use of the following specific composition. The invention has been thus worked out.

In other words, the invention has the following constitution.

(1) A positive-working resist composition comprising:

(A1) a resin containing a repeating unit represented by the following formula (I), which increases the solubility in an alkali developing solution by the action of an acid, and (B) a compound capable of generating an acid upon irradiation with one of actinic rays and radiation:

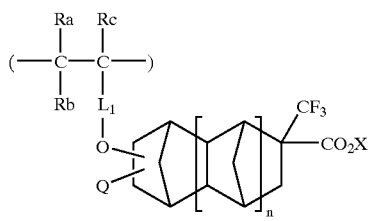

wherein Ra, Rb and Rc each independently represents a hydrogen atom, a fluorine atom or a fluoroalkyl group, $L_1$ represents a single bond or divalent connecting group, X represents a hydrogen atom or a group capable of decomposing by the action of an acid, n represents 0 or 1, Q represents a hydrogen atom or a hydroxyl group.

(2) The composition according to the above (1), wherein the resin (A1) further contains at least one selected from the group consisting of repeating units represented by the following formulae (II) to (IV):

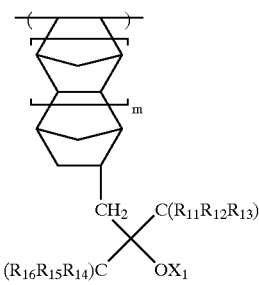

wherein $R_{11}$ to $R_{16}$ each independently represents a hydrogen atom, a fluorine atom or a fluoroalkyl group, with the proviso that at least one of $R_{11}$ to $R_{16}$ is not a hydrogen atom, $X_1$ represents a hydrogen atom or a group capable of decomposing by the action of an acid, and m represents 0 or 1:

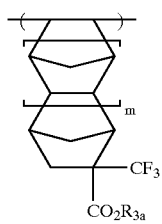

wherein $R_{3a}$ represents a hydrogen atom or a group capable of decomposing by the action of an acid, m represents 0 or 1:

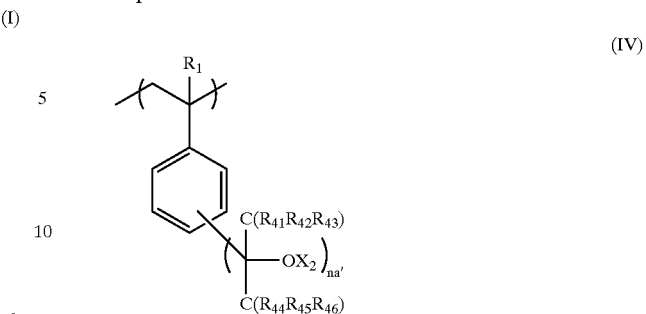

wherein $R_1$ represents a hydrogen atom, a fluorine atom, a chlorine atom, a bromine atom, a cyano group or a trifluoromethyl group, $R_{41}$ to $R_{46}$ each independently represents a hydrogen atom, a fluorine atom or a fluoroalkyl group, with the proviso that at least one of $R_{41}$ to $R_{46}$ is not a hydrogen atom, $X_2$ represents a hydrogen atom or a group capable of decomposing by the action of an acid, na' represents an integer of from 1 to 5, with the proviso that when na' is 2 or more, the two or more $R_{41}$'s to $R_{46}$'s and $X_2$'s may be the same or different.

(3) A positive-working resist composition comprising:

(A2) a resin containing a repeating unit represented by the following formula (Ia) and at least one selected from the group consisting of repeating units represented by the following formulae (II) to (IV), which increases the solubility in an alkali developing solution by the action of an acid, and (B) a compound capable of generating an acid upon irradiation with one of actinic rays and radiation:

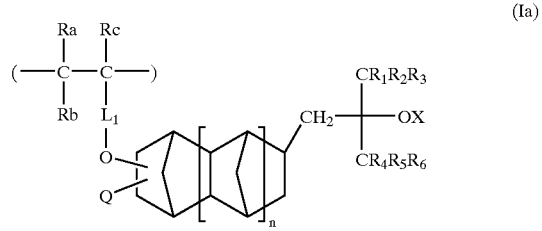

wherein Ra, Rb and Rc each independently represents a hydrogen atom, a fluorine atom or a fluoroalkyl group, $L_1$ represents a single bond or a divalent connecting group, $R_1$ to $R_6$ each independently represents a hydrogen atom, a fluorine atom or a fluoroalkyl group, with the proviso that at least one of $R_1$ to $R_6$ is not a hydrogen atom, X represents a hydrogen atom or a group capable of decomposing by the action of an acid, n represents 0 or 1, Q represents a hydrogen atom or a hydroxyl group:

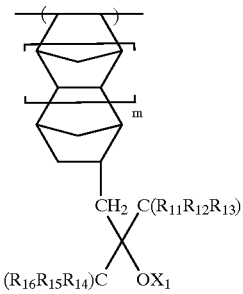

(II)

wherein $R_{11}$ to $R_{16}$ each independently represents a hydrogen atom, a fluorine atom or a fluoroalkyl group, with the proviso that at least one of $R_{11}$ to $R_{16}$ is not a hydrogen atom, $X_1$ represents a hydrogen atom or a group capable of decomposing by the action of an acid, m represents 0 or 1:

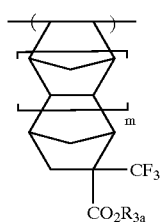

(III)

wherein $R_{3a}$ represents a hydrogen atom or a group capable of decomposing by the action of an acid, m represents 0 or 1:

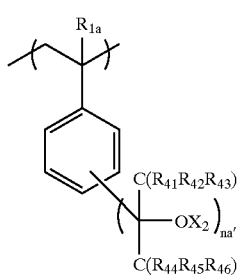

(IV)

wherein R1a represents a hydrogen atom, a fluorine atom, a chlorine atom, a bromine atom, a cyano group or a trifluoromethyl group, $R_{41}$ to $R_{46}$ each independently represents a hydrogen atom, a fluorine atom or a fluoroalkyl group, with the proviso that at least one of $R_{41}$ to $R_{46}$ is not a hydrogen atom, $X_2$ represents a hydrogen atom or a group capable of decomposing by the action of an acid, na' represents an integer of from 1 to 5, with the proviso that when n is 2 or greater, the two or more $R_{41}$'s to $R_{46}$'s and $X_2$'s may be the same or different.

(4) The composition according to the above (1) or (3), wherein Rc is a fluorine atom or trifluoromethyl group.

(5) The composition according to the above (1) or (3), wherein $L_1$ is a carbonyl group, an ethylene group or a single bond.

(6) The composition according to the above (1) or (3), wherein $R_{3a}$ is a tertiary alkyl group having an alicyclic group.

(7) The composition according to the above (1) or (3), wherein the resin has a weight-average molecular weight of from 3,000 to 30,000 and a molecular weight dispersion degree of from 1.1 to 1.5.

(8) The composition according to the above (1) or (3), wherein the resin is obtained by a process which comprises removing low molecular components from a polymer obtained by a radical polymerization method.

(9) The composition according to the above (1) or (3), wherein the resin is obtained by a living polymerization method.

(10) The composition according to the above (1) or (3), wherein the resin is obtained by a dropping polymerization method which comprises further adding a monomer continuously or intermittently during the radical polymerization of the monomer in the presence of a radical polymerization initiator.

(11) The composition according to the above (1) or (3), wherein the compound (B) comprises a compound (B1) which is capable of generating an organic sulfonic acid by irradiation of actinic ray or radiation.

(12) The composition according to the above (1) or (3) wherein the compound (B) comprises a compound (B2) which is capable of generating a carboxylic acid by irradiation of actinic ray or radiation.

(13) The composition according to the above (1) or (3), which further comprises a solvent (C) comprising a mixture solvent of propylene glycol monoalkyl ether acetates with propylene glycol monoalkyl ethers or alkyl lactates.

(14) A positive-working resist composition comprising (A3) a resin containing at least one repeating unit having at least a group represented by the following formula (Z):

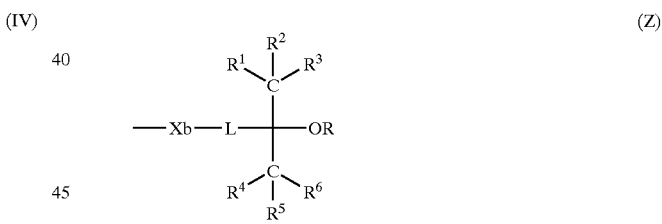

(Z)

wherein Xb represents a divalent connecting group having a hetero atom, —O—, —S—, —SO$_2$— or —NR$_{ab}$— in which R$_{ab}$ represents a hydrogen atom, an alkyl group, an aryl group or an aralkyl group, L represents a single bond or a divalent connecting group selected from the group consisting of an alkylene group, a cycloalkylene group, an arylene group, group obtained by connecting these groups and group obtained by connecting these groups to an oxy group and/or a carbonyl group, $R^1$ to $R^6$ each independently represents a hydrogen atom, a halogen atom or an organic group, with the proviso that at least one of $R^1$ to $R^6$ represents a fluorine atom or an organic group containing at least one fluorine atom, R represents a hydrogen atom or an organic group.

(15) The composition according to the above (14), wherein Xb is —C(=O)O—, —OC(=O)—, —C(=O)N(R$_{ab}$)—, —N(R$_{ab}$)C(=O)— or —O— in which R$_{ab}$ represents a hydrogen atom, an alkyl groups an aryl group or an aralkyl group.

(16) The composition according to the above (14), wherein the repeating unit is represented by the following formula (Ib) or (IIb):

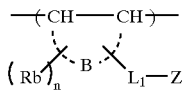
(Ib)

wherein B represents an atomic group which is connected to two carbon atoms in the main chain to form a ring, Rb represents a hydrogen atom, a halogen atom or an organic group, n represents an integer of from 0 to 3, $L_1$ represents a single bond or a divalent connecting group, Z represents a group represented by the formula (Z);

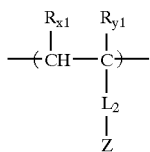
(IIb)

wherein $R_{X1}$ and $R_{Y1}$ each independently represents a hydrogen atom, a halogen atom, a cyano group or an alkyl group, which may have a substituent, $L_2$ represents a single bond or a divalent connecting group, Z represents a group represented by the formula (Z).

(17) The composition according to the above (16), wherein the repeating unit represented by the formula (Ib) is represented by the following formula (VI):

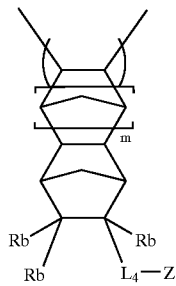
(VI)

wherein Rb represents a hydrogen atom, a halogen atom or an organic group, $L_4$ represents a single bond or a divalent connecting group, Z represents a group represented by the formula (Z), m represents 0 or 1.

(18) The composition according to the above (16), wherein the repeating unit represented by the formula (IIb) is represented by the following formula (XI):

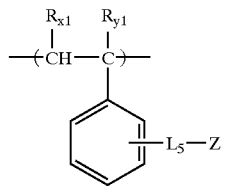
(XI)

wherein $R_{X1}$ and $R_{Y1}$ each independently represents a hydrogen atom, a halogen atom, a cyano group or an alkyl group which may have a substituent, $L_5$ represents a single bond or a divalent connecting group, Z represents a group represented by the formula (Z).

(19) The composition according to the above (14), wherein R is a hydrogen atom or a straight-chain or branched alkyl group, a cyclic alkyl group, an acyl group, an alkoxycarbonyl group, an alkoxycarbonylmethyl group, an alkoxymethyl group or a 1-alkoxyethyl group, which may have a substituent.

(20) A positive-working resist composition comprising:

(A3) a resin having at least one repeating unit selected from the group consisting of those represented by the formulae (Ib), (IIb), (VI) and (XI), which is soluble in an alkaline developing solution, (B1a) a compound which is capable of generating a fluorine-containing sulfonic acid by irradiation of actinic ray or radiation, (X) a non-polymer-based dissolution inhibitor:

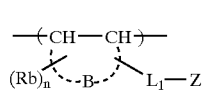
(Ib)

wherein B represents an atomic group which is connected to two carbon atoms in the main chain to form a ring, Rb represents a hydrogen atom, a halogen atom or an organic group, n represents an integer of from 0 to 3, $L_1$ represents a single bond or a divalent connecting group, Z represents a group represented by the formula (Z):

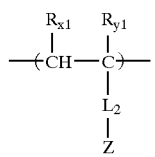
(IIb)

wherein $R_{X1}$ and $R_{Y1}$ each independently represents a hydrogen atom, a halogen atom, a cyano group or an alkyl group, which may have a substituent, $L_2$ represents a single bond or a divalent connecting group, Z represents a group represented by the formula (Z):

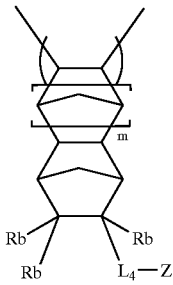
(VI)

wherein Rb represents a hydrogen atom, a halogen atom or an organic group, $L_4$ represents a single bond or a divalent connecting group, Z represents a group represented by the formula (Z), m represents 0 or 1:

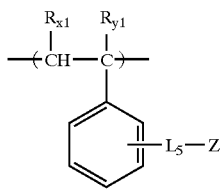
(XI)

wherein $R_{X1}$ and $R_{Y1}$ each independently represents a hydrogen atom, a halogen atom, a cyano group or an alkyl group which may have a substituent, $L_5$ represents a single bond or a divalent connecting group, Z represents a group represented by the formula (Z).

(21) A positive-working resist composition comprising:

(A) a resin having at least one repeating unit selected from the group consisting of those represented by the formulae (Ib), (IIb), (VI) and (XI), which increases the solubility in an alkali developing solution by the action of an acid, (B1a) a compound which is capable of generating a fluorine-containing sulfonic acid by irradiation of actinic ray or radiation:

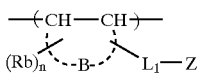
(Ib)

wherein B represents an atomic group which is connected to two carbon atoms in the main chain to form a ring, Rb represents a hydrogen atom, a halogen atom or an organic group, n represents an integer of from 0 to 3, $L_1$ represents a single bond or a divalent connecting group, Z represents a group represented by the formula (Z);

(IIb)

wherein $R_{X1}$ and $R_{Y1}$ each independently represents a hydrogen atom, a halogen atom, a cyano group or an alkyl group, which may have a substituent, $L_2$ represents a single bond or a divalent connecting group, Z represents a group represented by the formula (Z):

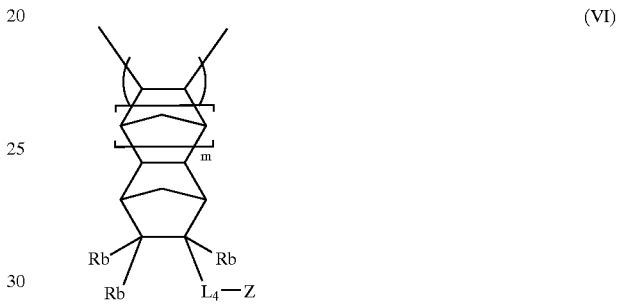
(VI)

wherein Rb represents a hydrogen atom, a halogen atom or an organic group, $L_4$ represents a single bond or a divalent connecting group, Z represents a group represented by the formula (Z), m represents 0 or 1:

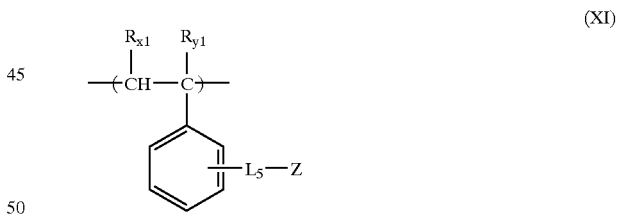
(XI)

wherein $R_{X1}$ and $R_{Y1}$ each independently represents a hydrogen atom, a halogen atom, a cyano group or an alkyl group which may have a substituent, $L_5$ represents a single bond or a divalent connecting group, Z represents a group represented by the formula (Z).

(22) The composition according to the above (21), further comprising (X) a non-polymer-based dissolution inhibitor.

(23) The composition according to the above (14), wherein the resin (A3) further contains at least one repeating unit represented by the following formula (IIIa), (IIIb) or (IVb):

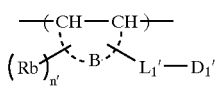
(IIIa)

wherein B represents an atomic group which is connected to two carbon atoms in the main chain to form a ring, Rb represents a hydrogen atom, a halogen atom or an organic group, n' represents an integer of from 0 to 3, $L_1'$ represents a single bond or a divalent connecting group, $D_1'$ represents an acid-decomposable group:

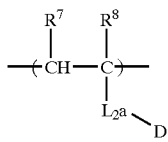
(IIIb)

wherein $R^7$ and $R^8$ each independently represents a hydrogen atom, a halogen atom, a cyano group or an alkyl group which may have a substituent, $L_2a$ represents a single bond or a divalent connecting group, $D_1$ represents an acid-decomposable group:

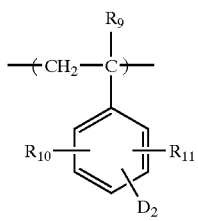
(IVb)

wherein $R_9$ represents a hydrogen atom, a halogen atom, a cyano group or an alkyl group which may have a substituent, $R_{10}$ and $R_{11}$ each independently represents a hydrogen atom, a halogen atom, a cyano group, a hydroxyl group or an organic group, $D_2$ represents an acid-decomposable group.

(24) The composition according to the above (20) or (21), further comprising (B1b) a compound capable of generating a fluorine-free sulfonic acid by irradiation of actinic ray or radiation, or (B2) a compound which is capable of generating a carboxylic acid by irradiation of actinic ray or radiation.

(25) The composition according to the above (20) or (21), further comprising a fluorine-based and/or silicon-based surfactant.

(26) The composition according to the above (20) or (21), further comprising an organic basic compound.

(27) The composition according to the above (14), which is adapted for irradiation with $F_2$ excima laser beam having a wavelength of 157 nm.

(28) A positive-working resist composition comprising:

(A4) a resin containing a repeating unit represented by the following formula (AI) or (AII), which increases the solubility in an alkali developing solution by the action of an acid, and (B) a compound capable of generating an acid upon irradiation with one of actinic rays and radiation:

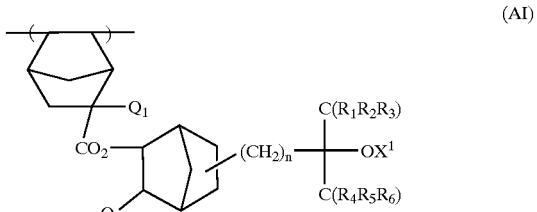
(AI)

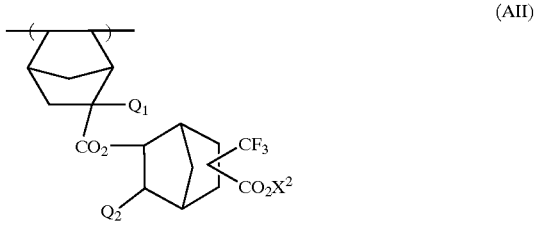
(AII)

wherein $X^1$ and $X^2$ each represents a hydrogen atom or a group capable of decomposing by the action of an acid, $Q_1$ represents a hydrogen atom, a halogen atom, a trifluoromethyl group or a cyano group, $Q_2$ represents a hydrogen atom or a hydroxyl group, $R_1$ to $R_6$ each independently represents a hydrogen atom, a fluorine atom or a fluoroalkyl group, with the proviso that at least one of $R_1$ to $R_6$ is not a hydrogen atom, n represents 0 or 1.

(29) The composition according to the above (28), wherein the resin (A4) contains at least one selected from the group consisting of repeating units represented by the following formulae (Ic) to (VIIIc):

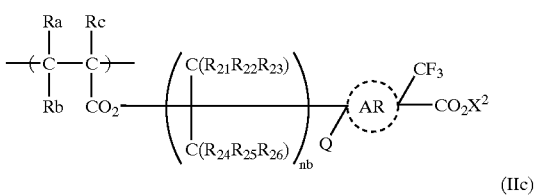
(Ic)

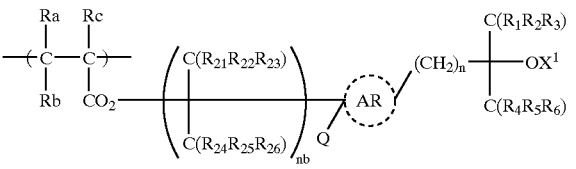
(IIc)

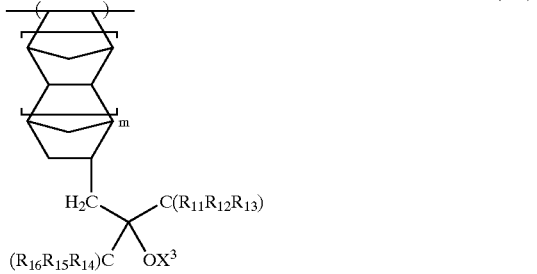
(IIIc)

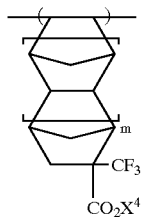

(IVc)

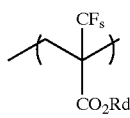

(Vc)

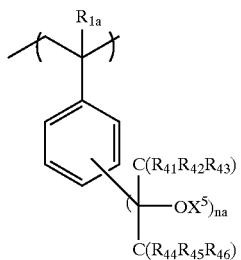

(VIc)

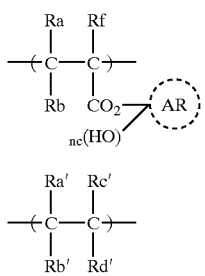

(VIIc)

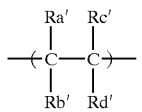

(VIIIc)

wherein $X^1$ to $X^5$ and Rd each independently represents a hydrogen atom or a group which is capable of decomposing by the action of an acid, Ra, Rb and Rc each independently represents a hydrogen atom, a fluorine atom or a fluoroalkyl group, AR represents an alicyclic hydrocarbon structure, Q represents a hydrogen atom or a hydroxyl group, $R_1$ to $R_6$ each independently represents a hydrogen atom, a fluorine atom or a fluoroalkyl group, with the proviso that at least one of $R_1$ to $R_6$ is not a hydrogen atom, $R_{21}$ to $R_{26}$ each independently represents a hydrogen atom, a fluorine atom or a fluoroalkyl group, with the proviso that at least one of $R_{21}$ to $R_{26}$ is not a hydrogen atom, $R_{11}$ to $R_{16}$ each independently represents a hydrogen atom, a fluorine atom or a fluoroalkyl group, with the proviso that at least one of $R_{11}$ to $R_{16}$ is not a hydrogen atom, $R_{41}$ to $R_{46}$ each independently represents a hydrogen atom, a fluorine atom or a fluoroalkyl group, with the proviso that at least one of $R_{41}$ to $R_{46}$ is not a hydrogen atom, R1a represents a hydrogen atom, a fluorine atom, a chlorine atom, a bromine atom, a cyano group or a trifluoromethyl group, Rf represents a fluorine atom or a trifluoromethyl group, Ra', Rb', Rc' and Rd' each independently represents a hydrogen atom, a fluorine atom or a fluoroalkyl group, with the proviso that at least one of Ra', Rb', Rc' and Rd' is not a hydrogen atom, m represents 0 or 1, n represents 0 or 1, na represents an integer of from 1 to 5, nb represents 0 or 1, nc represents an integer of from 1 to 5.

(30) The composition according to the above (28), wherein the resin has a weight-average molecular weight of from 3,000 to 30,000 and a molecular weight dispersion degree of from 1.1 to 1.5.

(31) The composition according to the above (28), wherein the resin is obtained by a process which comprises removing low molecular components from a polymer obtained by a radical polymerization method.

(32) The composition according to the above (28), wherein the resin is obtained by further adding a monomer continuously or intermittently during the radical polymerization of the monomer in the presence of a radical polymerization initiator.

(33) The composition according to the above (28), wherein the compound (B) comprises a compound (B1) which is capable of generating an organic sulfonic acid by irradiation of actinic ray or radiation.

(34) The composition according to the above (28), wherein the compound (B) comprises a compound (B2) which is capable of generating a carboxylic acid by irradiation of actinic ray or radiation.

(35) The composition according to the above (28), which further comprises a solvent (C) comprising a mixture solvent of propylene glycol monoalkyl ether acetates with propylene glycol monoalkyl ethers or alkyl lactates.

DETAILED DESCRIPTION OF THE INVENTION

The invention will be further described hereinafter.

[1] (A1) Resin Containing a Repeating Unit Represented by the Following Formula (I), Which Increases the Solubility in an Alkali Developing Solution by the Action of an Acid The positive-working resist composition of the invention contains a resin containing a repeating unit represented by the following formula (I), which increases the solubility in an alkali developing solution by the action of an acid (hereinafter referred to as "resin (A1)").

In the formula (I), Ra, Rb and Rc each independently represents a hydrogen atom, a fluorine atom or a fluoroalkyl group. $L_1$ represents a single bond or a divalent connecting group. X represents a hydrogen atom or a group which is capable of decomposing by the action of an acid. The suffix n represents 0 or 1. Q represents a hydrogen atom or a hydroxyl group.

The fluoroalkyl group represented by Ra, Rb or Rc is an alkyl group at least one hydrogen atom of which is fluorinated and preferably has from 1 to 6 carbon atoms, more preferably from 1 to 3 carbon atoms. Specific examples of the fluoroalkyl group include trifluoromethyl group, difluoromethyl group, fluoromethyl group, pentafluoroethyl group, 3,3,3-trifluoropropyl group, and 3-fluoropropyl group. Particularly preferred among these fluoroalkyl groups is trifluoromethyl group.

The fluoroalkyl group represented by Ra, Rb or Rc may have a substituent. Examples of the substituent include a chlorine atom, a bromine atom, and an iodine atom.

Examples of the group X which is capable of decomposing by the action of an acid (hereinafter referred to as "acid-decomposable group") include —$C(R_{36})(R_{37})(R_{38})$, —$C(R_{36})(R_{37})(OR_{39})$, —COO—$C(R_{36})(R_{37})(R_{38})$, —$C(R_{01})(R_{02})(OR_{39})$, and —$C(R_{01})(R_{02})COO$—$C(R_{36})(R_{37})(R_{38})$.

$R_{36}$ to $R_{39}$ each independently represents an alkyl, cycloalkyl, alkenyl, aralkyl or aryl group, which may have a substituent. $R_{36}$ and $R_{39}$ may be bonded to each other to form a ring.

$R_{01}$ and $R_{02}$ each independently represents a hydrogen atom or an alkyl, cycloalkyl, alkenyl, aralkyl or aryl group, which may have a substituent.

The alkyl groups represented by $R_{36}$ to $R_{39}$, $R_{01}$ and $R_{02}$ each are preferably a $C_1$–$C_8$ alkyl group. Examples of the alkyl group include methyl group, ethyl group, propyl group, n-butyl group, sec-butyl group, hexyl group, 2-ethylhexyl group, and octyl group.

The cycloalkyl groups represented by $R_{36}$ to $R_{39}$, $R_{01}$ and $R_{02}$ each may be monocyclic or polycyclic. Preferred examples of the monocyclic cycloalkyl group include $C_3$–$C_8$ cycloalkyl groups. Examples of the cycloalkyl group include cyclopropyl group, cyclopentyl group, cyclohexyl group, cyclobutyl group, and cyclooctyl group. Preferred examples of the polycyclic cycloalkyl group include $C_6$–$C_{20}$ cycloalkyl groups. Examples of the cycloalkyl group include adamanthyl group, norbornyl group, isoboronyl group, camphanyl group, dicyclopentyl group, α-pinene group, tricyclodecanyl group, tetracyclododecyl group, and androstanyl group. Some of the carbon atoms in the cycloalkyl group may be substituted by heteroatoms such as oxygen atom.

Preferred examples of the aryl groups represented by $R_{36}$ to $R_{39}$, $R_{01}$ and $R_{02}$ include $C_6$–$C_{10}$ aryl groups. Examples of the aryl group include phenyl group, tolyl group, dimethylphenyl group, 2,4,6-trimethylphenyl group, naphthyl group, anthryl group, and 9,10-dimethoxyanthryl group.

Preferred examples of the aralkyl groups represented by $R_{36}$ to $R_{39}$, $R_{01}$ and $R_{02}$ include $C_7$–$C_{12}$ aralkyl groups. Examples of the aralkyl group include benzyl group, phenethyl group, and naphthylmethyl group.

Preferred examples of the alkenyl groups represented by $R_{36}$ to $R_{39}$, $R_{01}$ and $R_{02}$ include $C_2$–$C_8$ alkenyl groups. Examples of the alkenyl group include vinyl group, allyl group, butenyl group, and cyclohexenyl group.

Examples of the substituents which may be possessed by $R_{36}$ to $R_{39}$, $R_{01}$ and $R_{02}$ include alkyl group, cycloalkyl group, aryl group, amino group, amide group, ureide group, urethane group, hydroxyl group, carboxyl group, halogen atom, alkoxy group, thioether group, acyl group, acyloxy group, alkoxycarbonyl group, cyano group, and nitro group.

Preferred examples of the acid-decomposable group include acetal group such as 1-alkoxy-1-ethoxy, 1-alkoxy-1-methoxy and tetrahydropyranyl, t-alkyloxycarbonyl group, ethoxymethyl group, methoxyethoxymethyl group, and t-alkylcarbonylmethyl group.

Examples of the divalent connecting group represented by $L_1$ include carbonyl group, alkylene group, and carbonyloxyalkylene group. Examples of the alkylene group and the alkylene group in carbonyloxyalkylene group include $C_1$–$C_6$ straight-chain, branched or cyclic alkylene groups. Specific examples of the alkylene group include methylene group, ethylene group, propylene group, butylene group, pentylene group, hexylene group, and cyclohexylene group. Preferred examples of $L_1$ include single bond, carbonyl group, and ethylene group.

Specific examples of the repeating unit represented by the formula (I) will be given below, but the invention is not limited thereto.

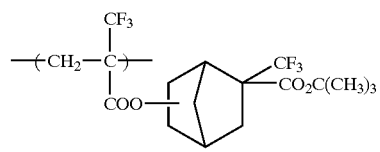

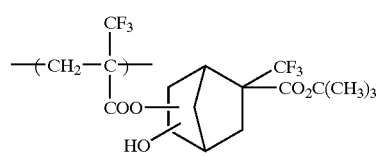

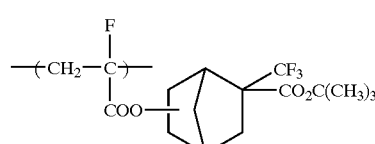

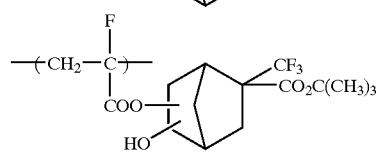

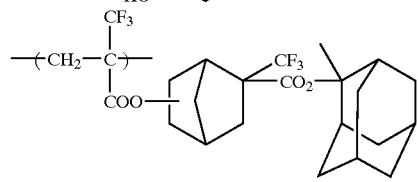

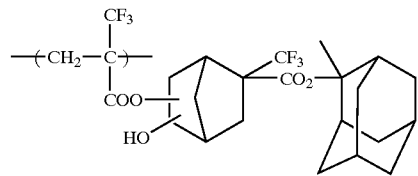

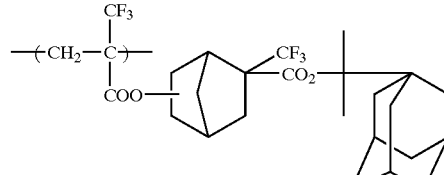

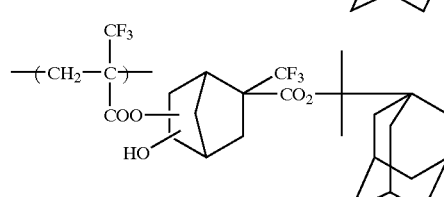

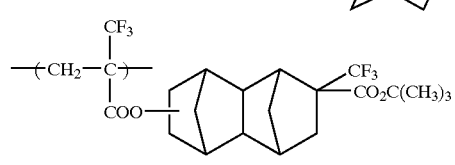

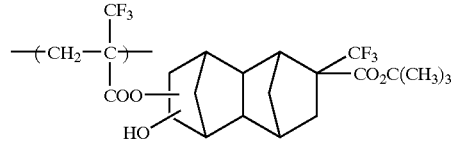

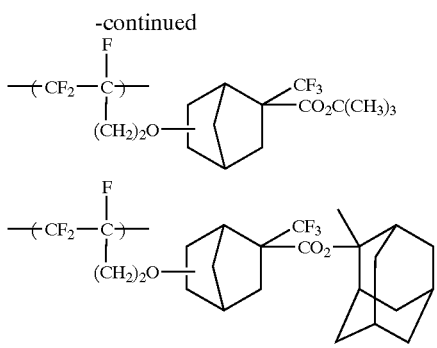

The resin (A1) preferably further contains at least one selected from the group consisting of repeating units represented by the formulae (II) to (IV).

In the formula (II), $R_{11}$ to $R_{16}$ each independently represents a hydrogen atom, a fluorine atom or a fluoroalkyl group, with the proviso that at least one of $R_{11}$ to $R_{16}$ is not a hydrogen atom. $X_1$ represents a hydrogen atom or a group which is capable of decomposing by the action of an acid. The suffix m represents 0 or 1.

Examples of the fluoroalkyl groups represented by $R_{11}$ to $R_{16}$ include the same fluoroalkyl groups as those represented by Ra to Rc in the formula (I).

Examples of the group $X_1$ which is capable of decomposing by the action of an acid include the same group as represented by X in the formula (I).

Specific examples of the repeating unit represented by the formula (II) will be given below, but the invention is not limited thereto.

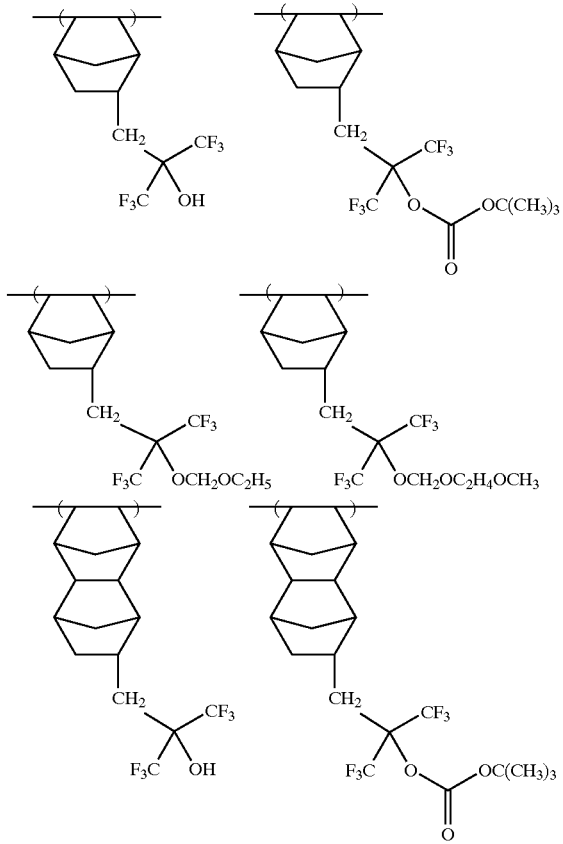

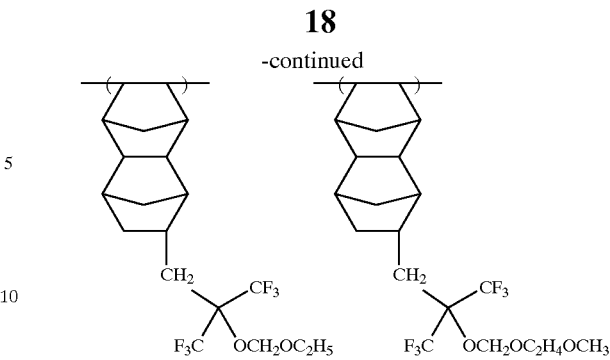

In the formula (III), $R_{3a}$ represents a hydrogen atom or a group which is capable of decomposing by the action of an acid. The suffix m represents 0 or 1.

Examples of the group represented by $R_{3a}$ which is capable of decomposing by the action of an acid include —$C(R_{36})(R_{37})(R_{38})$, and —$C(R_{36})(R_{37})(OR_{39})$.

$R_{36}$ to $R_{39}$ each independently represents an alkyl, cycloalkyl, alkenyl, aralkyl or aryl group, which may have a substituent. $R_{36}$ and $R_{39}$ may be bonded to each other to form a ring.

The alkyl groups represented by $R_{36}$ to $R_{39}$, $R_{01}$ and $R_{02}$ each are preferably a $C_1$–$C_8$ alkyl group. Examples of the alkyl group include a methyl group, an ethyl group, a propyl group, a n-butyl group, a sec-butyl group, a hexyl group, a 2-ethylhexyl group, and an octyl group.

The cycloalkyl groups represented by $R_{36}$ to $R_{39}$ each may be monocyclic or polycyclic. Preferred examples of the monocyclic cycloalkyl group include $C_3$–$C_8$ cycloalkyl groups. Examples of the cycloalkyl group include cyclopropyl group, cyclopentyl group, cyclohexyl group, cyclobutyl group, and cyclooctyl group. Preferred examples of the polycyclic cycloalkyl group include $C_6$–$C_{20}$ cycloalkyl groups. Examples of the cycloalkyl group include adamantyl group, norbornyl group, isobornyl group, camphanyl group, dicyclopentyl group, α-pinene group, tricyclodecanyl group, tetracyclododecyl group, and androstanyl group. Some of the carbon atoms in the cycloalkyl group may be substituted by heteroatoms such as oxygen atom.

Preferred examples of the aryl groups represented by $R_{36}$ to $R_{39}$ include $C_6$–$C_{10}$ aryl groups. Examples of the aryl group include phenyl group, tolyl group, dimethylphenyl group, 2,4,6-trimethylphenyl group, naphthyl group, anthryl group, and 9,10-dimethoxyanthryl group.

Preferred examples of the aralkyl groups represented by $R_{36}$ to $R_{39}$ include $C_7$–$C_{12}$ aralkyl groups. Examples of the aralkyl group include benzyl group, phenethyl group, and naphthylmethyl group.

Preferred examples of the alkenyl groups represented by $R_{36}$ to $R_{39}$ include $C_2$–$C_8$ alkenyl groups. Examples of the alkenyl group include vinyl group, allyl group, butenyl group, and cyclohexenyl group.

Examples of the substituents which may be possessed by $R_{36}$ to $R_{39}$ include alkyl group, cycloalkyl group, aryl group, amino group, amide group, ureide group, urethane group, hydroxyl group, carboxyl group, halogen atom, alkoxy group, thioether group, acyl group, acyloxy group, alkoxycarbonyl group, cyano group, and nitro group.

Specific preferred examples of the group which is capable of decomposing by the action of an acid include a tertiary alkyl group such as t-butyl, t-amyl, 1-alkyl-1-cyclohexyl, 2-alkyl-2-adamanthyl, 2-adamanthyl-2-propyl and 2-(4-methylcyclohexyl)-2-propyl, acetal group such as 1-alkoxy-1-ethoxy, 1-alkoxy-1-methoxy and tetrahydropyranyl, and t-alkylcarbonylmethyl. The group which decomposes when acted on by an acid is preferably a tertiary alkyl group, particularly a tertiary alkyl group having an alicyclic group.

Specific preferred examples of the repeating unit represented by the formula (III) will be given below, but the invention is not limited thereto.

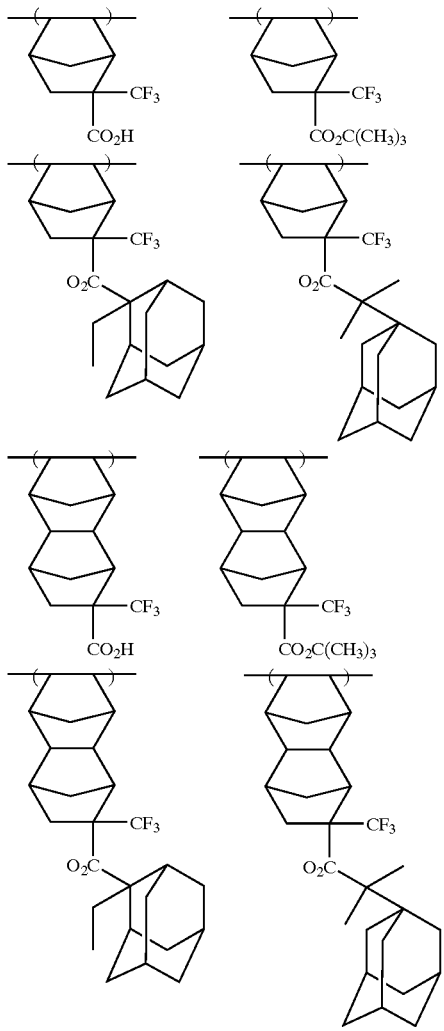

In the formula (IV), $R_1$ represents a hydrogen atom, a fluorine atom, a chlorine atom, a bromine atom, a cyano group or trifluoromethyl group. $R_{41}$ to $R_{46}$ each independently represents a hydrogen atom, a fluorine atom or a fluoroalkyl group, with the proviso that at least one of $R_{41}$ to $R_{46}$ is not a hydrogen atom. $X_2$ represents a hydrogen atom or a group which is capable of decomposing by the action of an acid. The suffix na' represents an integer of from 1 to 5. When na' is 2 or more, the two or more $R_{41}$'s to $R_{46}$'s and $X_2$'s may be the same or different.

Examples of the fluoroalkyl groups represented by $R_{41}$ to $R_{46}$ include the same fluoroalkyl groups as those represented by Ra to Rc in the formula (I).

Examples of the group represented by $X_2$ which is capable of decomposing by the action of an acid include the same as those of X in the formula (I).

Preferred examples of the repeating unit represented by the formula (IV) will be given below, but the invention is not limited thereto.

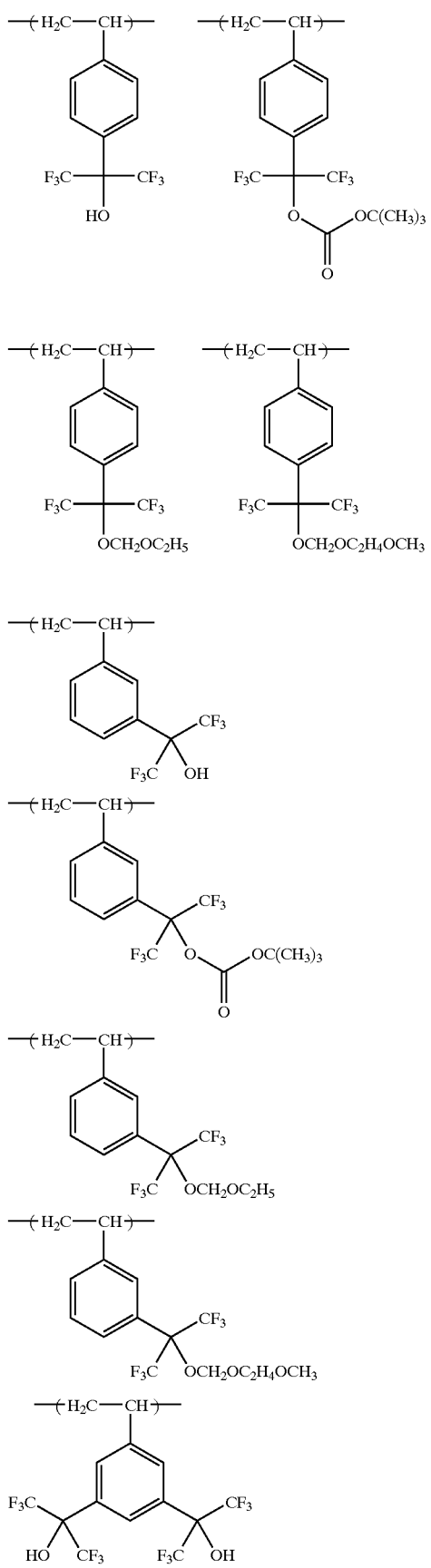

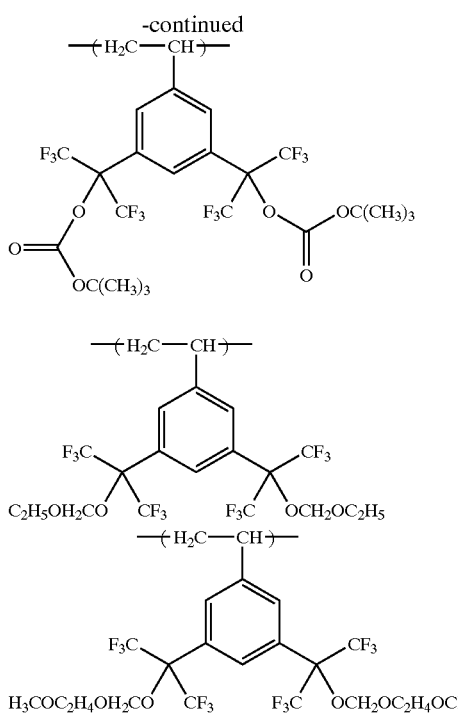

The resin (A1) may be polymerized with other polymerizable monomers besides the aforementioned repeating units.

Examples of the copolymerizable monomer to be used in combination with the resin (A1) include acrylic acid esters, acrylamides, methacrylic acid esters, methacrylamides, allyl compounds, vinyl ethers, vinyl esters, styrenes, crotonic acid esters, maleic acid dialkylesters, fumaric acid dialkylesters, maleic anhydride, maleimides, acrylonitrile, methacrylonitrile, maleilonitrile, and $C(R_{101a})(R_{102a})=C(R_{103a})(R_{104a})$ (in which $R_{101a}$ to $R_{104a}$ may be the same or different and each represent a hydrogen atom, a halogen atom or an alkyl group substituted by halogen atom (preferably having from 1 to 10 carbon atoms). Particularly preferred among these copolymerizable monomers are acrylonitrile, methacrylonitrile, maleic anhydride, maleimide, N-hydroxymaleimide, N-(t-butoxycarbonyloxy)-maleimide, and $C(R_{101a})(R_{102a})=C(R_{103a})(R_{104a})$. Further, any copolymerizable addition-polymerizable unsaturated compounds may be used.

Specific examples of the resin (A1) will be given below, the invention is not limited thereto.

(F-1)

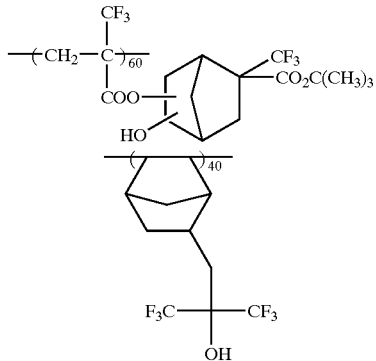

(F-2)

(F-3)

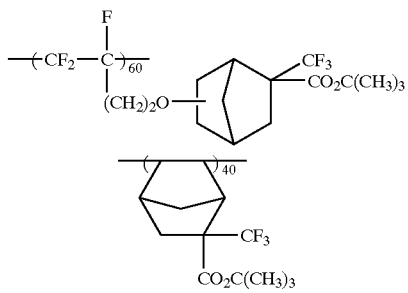

(F-4)

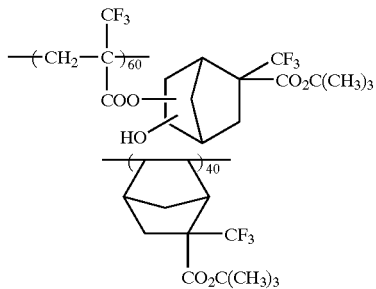

(F-5)

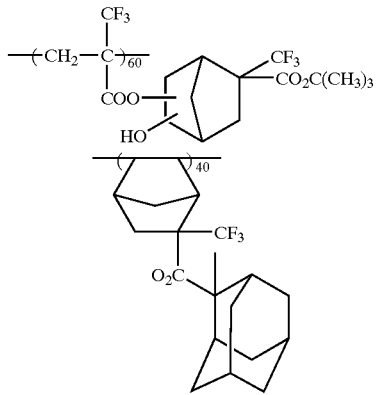

-continued (F-6)

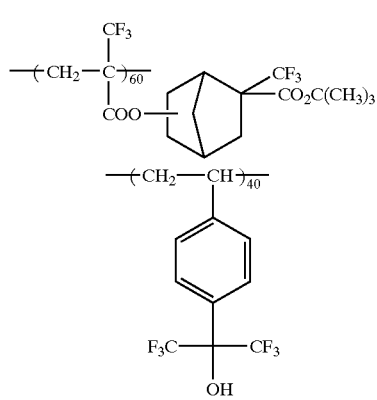

The content of the repeating unit represented by the formula (I) in the resin (A1) is preferably from 10 to 90 mol %, more preferably from 20 to 80 mol %.

The content of the repeating units represented by the formulae (II) to (IV) in the resin (A1) is preferably from 20 to 60 mol %, more preferably from 25 to 50 mol %.

The content of the repeating unit having a group which is capable of decomposing by the action of an acid in the resin (A1) is preferably from 15 to 50 mol %, more preferably from 20 to 40 mol %.

The resin (A1) increases in its solubility in an alkaline developer when the acid-decomposable group is acted on by an acid to decompose and produce a hydrophilic group such as hydroxyl group and carboxyl group.

The molecular weight of the resin (A1) is preferably from 2,000 to 50,000, more preferably from 3,000 to 30,000 as calculated in terms of weight-average molecular weight. When the molecular weight of the resin (A1) is too low, the resulting resist exhibits a deteriorated heat resistance. On the contrary, when the molecular weight of the resin (A1) is too high, the resulting resist exhibits a deteriorated solubility in the developer and hence a deteriorated sensitivity and resolving power.

The molecular weight dispersion degree (Mw/Mn) of the resin (A1) is preferably from 1.0 to 3.0, more preferably from 1.1 to 2.0, particularly, from 1.1 to 1.5. Examples of the method for reducing the molecular weight dispersion degree include a method which comprises dissolving a polymer obtained by an ordinary radical polymerization method in a good solvent, and then adding a poor solvent to the solution to remove components having a low molecular weight, and a living polymerization method such as living radical polymerization method. All these methods may be used to advantage.

As the living radical polymerization method there may be used any of Georges' method involving the use of nitroxide and Sawamoto and Machavski's method involving the use of metal complex.

From the standpoint of elimination of roughness of pattern, as the aforementioned ordinary radical polymerization method there is preferably used the dropping polymerization method (method which comprises further adding a monomer continuously or intermittently during the radical polymerization of the monomer in the presence of a radical polymerization initiator).

In the dropping polymerization method, the kind and composition of the monomer to be initially charged in the reaction vessel may be the same as or different from that of the monomer to be added during the progress of radical polymerization.

Further, a method which comprises additionally adding the polymerization initiator together with the monomer to be subsequently added can be employed to reduce the amount of the monomer left unreacted to advantage.

The amount of the resin (A1) to be added is normally from 50% to 99.5% by weight, preferably from 80% to 99% by weight, particularly from 90% to 98% by weight based on the total solid content in the composition.

[2] (A2) a resin containing a repeating unit represented by the following formula (Ia) and at least one selected from the group consisting of repeating units represented by the following formulae (II) to (IV), which increases the solubility in an alkali developing solution by the action of an acid The positive-working resist composition of the invention contains a resin having a repeating unit represented by the formula (Ia) and at least one selected from the group consisting of repeating units represented by the following formulae (II) to (IV) which increases in its solubility in an alkaline developer when acted on by an acid which increases in its solubility in an alkaline developer when acted on by an acid (hereinafter referred to as "resin (A2)").

In the formula (Ia), Ra, Rb and Rc each independently represents a hydrogen atom, a fluorine atom or a fluoroalkyl group. $L_1$ represents a single bond or a divalent connecting group. $R_1$ to $R_6$ each independently represents a hydrogen atom, a fluorine atom or a fluoroalkyl group, with the proviso that at least one of $R_1$ to $R_6$ is not a hydrogen atom. X represents a hydrogen atom or a group which is capable of decomposing by the action of an acid, The suffix n represents 0 or 1. Q represents a hydrogen atom or a hydroxyl group.

The fluoroalkyl group represented by Ra, Rb, Rc or $R_1$ to $R_6$ is an alkyl group at least one hydrogen atom of which is fluorinated and preferably has from 1 to 6 carbon atoms, more preferably from 1 to 3 carbon atoms. Specific examples of the fluoroalkyl group include a trifluoromethyl group, a difluoromethyl group, a fluoromethyl group, a pentafluoroethyl group, a 3,3,3-trifluoropropyl group, and a 3-fluoropropyl group. Particularly preferred among these fluoroalkyl groups is a trifluoromethyl group The fluoroalkyl group represented by Ra, Rb, Rc or $R_1$ to $R_6$ may have a substituent. Examples of the substituent includes a chlorine atom, a bromine atom, and an iodine atom.

Rc is preferably a fluorine atom or a trifluoromethyl group.

Examples of the group X which is capable of decomposing by the action of an acid (hereinafter referred to as "acid-decomposable group") include —C($R_{36}$)($R_{37}$)($R_{38}$), —C($R_{36}$)($R_{37}$)(O$R_{39}$), —COO—C($R_{36}$)($R_{37}$)($R_{38}$), —C($R_{01}$)($R_{02}$)(O$R_{39}$), and —C($R_{01}$)($R_{02}$)COO—C($R_{36}$)($R_{37}$)($R_{39}$).

$R_{36}$ to $R_{39}$ each independently represents an alkyl, cycloalkyl, alkenyl, aralkyl or aryl group, which may have a substituent. $R_{36}$ and $R_{39}$ may be bonded to each other to form a ring.

$R_{01}$ and $R_{02}$ each independently represents a hydrogen atom or an alkyl, cycloalkyl, alkenyl, aralkyl or aryl group, which may have a substituent.

The alkyl groups represented by $R_{36}$ to $R_{39}$, $R_{01}$ and $R_{02}$ each are preferably a $C_1$–$C_8$ alkyl group. Examples of the alkyl group include methyl group, ethyl group, propyl group, n-butyl group, sec-butyl group, hexyl group, 2-ethylhexyl group, and octyl group.

The cycloalkyl groups represented by $R_{36}$ to $R_{39}$, $R_{01}$ and $R_{02}$ each may be monocyclic or polycyclic. Preferred examples of the monocyclic cycloalkyl group include $C_3$–$C_8$ cycloalkyl groups. Examples of the cycloalkyl group include cyclopropyl group, cyclopentyl group, cyclohexyl group, cyclobutyl group, and cyclooctyl group. Preferred examples of the polycyclic cycloalkyl group include $C_6$–$C_{20}$ cycloalkyl groups. Examples of the cycloalkyl group include adamanthyl group, norbornyl group, isoboronyl group, camphanyl group, dicyclopentyl group, α-pinene group, tricyclodecanyl group, tetracyclododecyl group, and androstanyl group. Some of the carbon atoms in the cycloalkyl group may be substituted by heteroatoms such as oxygen atom.

Preferred examples of the aryl groups represented by $R_{35}$ to $R_{39}$, $R_{01}$ and $R_{02}$ include $C_6$–$C_{10}$ aryl groups. Examples of the aryl group include phenyl group, tolyl group, dimethylphenyl group, 2,4,6-trimethylphenyl group, naphthyl group, anthryl group, and 9,10-dimethoxyanthryl group.

Preferred examples of the aralkyl groups represented by $R_{36}$ to $R_{39}$, $R_{01}$ and $R_{02}$ include $C_7$–$C_{12}$ aralkyl groups. Examples of the aralkyl group include benzyl group, phenethyl group, and naphthylmethyl group.

Preferred examples of the alkenyl groups represented by $R_{36}$ to $R_{39}$, $R_{01}$ and $R_{02}$ include $C_2$–$C_8$ alkenyl groups. Examples of the alkenyl group include vinyl group, allyl group, butenyl group, and cyclohexenyl group.

Examples of the substituents which may be possessed by $R_{36}$ to $R_{39}$, $R_{01}$ and $R_{02}$ include alkyl group, cycloalkyl group, aryl group, amino group, amide group, ureide group, urethane group, hydroxyl group, carboxyl group, halogen atom, alkoxy group, thioether group, acyl group, acyloxy group, alkoxycarbonyl group, cyano group, and nitro group.

Preferred examples of the acid-decomposable group include acetal group such as 1-alkoxy-1-ethoxy, 1-alkoxy-1-methoxy and tetrahydropyranyl, t-alkyloxycarbonyl group, ethoxymethyl group, methoxyethoxymethyl group, and t-alkylcarbonylmethyl group.

Examples of the divalent connecting group represented by $L_1$ include carbonyl group, alkylene group, and carbonyloxyalkylene group. Examples of the alkylene group and the alkylene group in carbonyloxyalkylene group include $C_1$–$C_6$ straight-chain, branched or cyclic alkylene groups. Specific examples of the alkylene group include methylene group, ethylene group, propylene group, butylene group, pentylene group, hexylene group, and cyclohexylene group. Preferred examples of $L_1$ include single bond, carbonyl group, and ethylene group.

Specific examples of the repeating unit represented by the formula (Ia) will be given below, but the invention is not limited thereto.

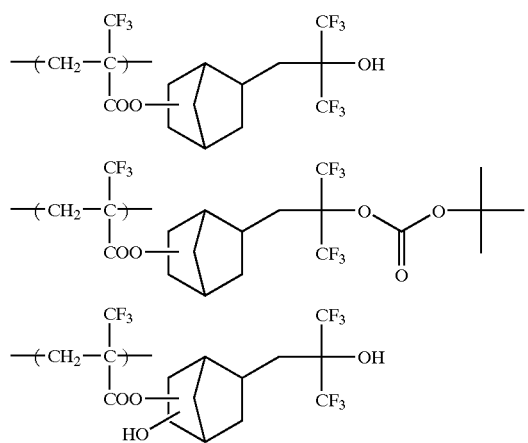

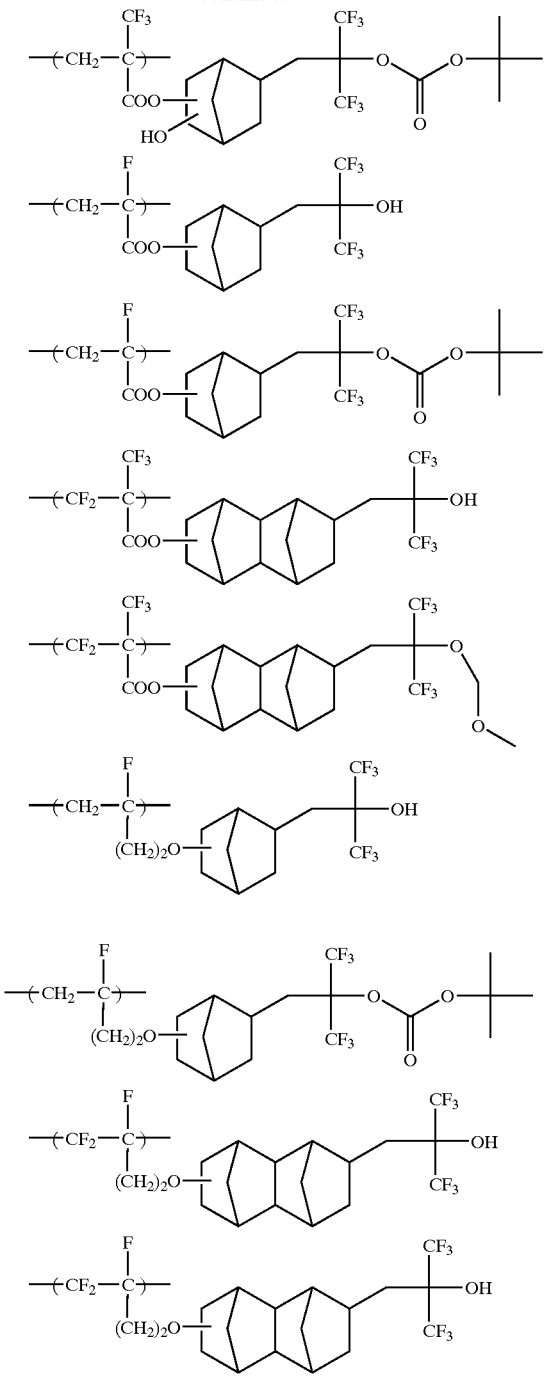

In the formula (II), $R_{11}$ to $R_{16}$ each independently represents a hydrogen atom, a fluorine atom or a fluoroalkyl group, with the proviso that at least one of $R_{11}$ to $R_{16}$ is not a hydrogen atom. $X_1$ represents a hydrogen atom or a group which is capable of decomposing by the action of an acid. The suffix m represents 0 or 1.

Examples of the fluoroalkyl groups represented by $R_{11}$ to $R_{16}$ include the same fluoroalkyl groups as those represented by Ra to Rc in the formula (Ia).

Examples of the group represented by $X_1$ which is capable of decomposing by the action of an acid include the same as those of X in the formula (Ia).

Preferred examples of the repeating unit represented by the formula (II) will be given below, but the invention is not limited thereto.

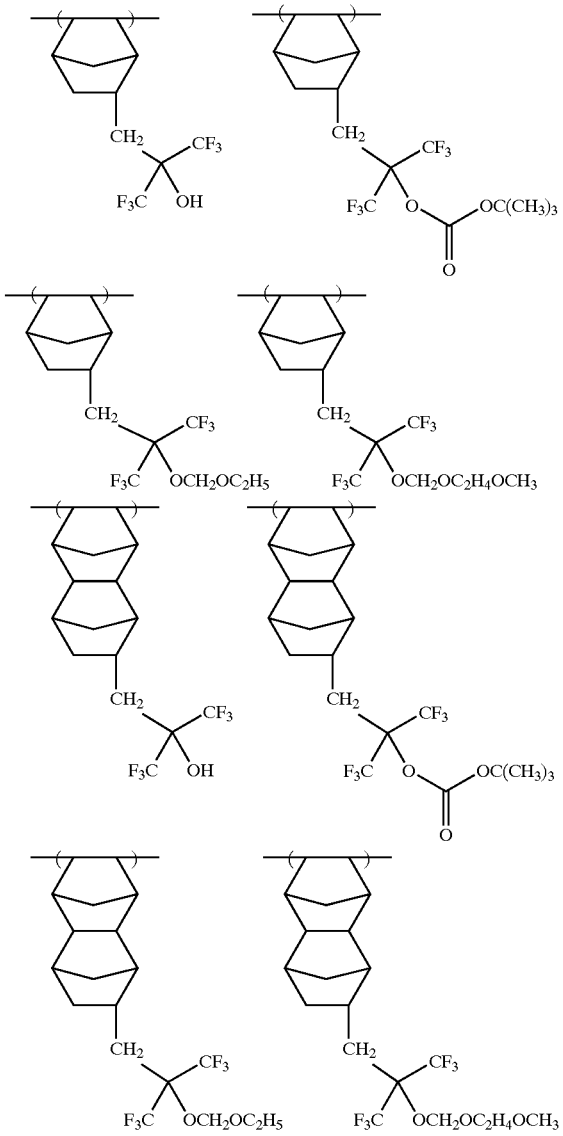

In the formula (III), $R_{3a}$ represents a hydrogen atom or a group which is capable of decomposing by the action of an acid. The suffix m represents 0 or 1.

Examples of the group represented by $R_{3a}$ which is capable of decomposing by the action of an acid include —$C(R_{36})(R_{37})(R_{38})$, and —$C(R_{36})(R_{37})(OR_{39})$.

$R_{36}$ to $R_{39}$ each independently represents an alkyl, a cycloalkyl, an alkenyl, an aralkyl or an aryl group, which may have a substituent. $R_{36}$ and $R_{39}$ may be bonded to each other to form a ring.

The alkyl groups represented by $R_{36}$ to $R_{39}$, $R_{01}$ and $R_{02}$ each are preferably a $C_1$–$C_8$ alkyl group. Examples of the alkyl group include methyl group, ethyl group, propyl group, n-butyl group, sec-butyl group, hexyl group, 2-ethylhexyl group, and octyl group.

The cycloalkyl groups represented by $R_{36}$ to $R_{39}$ each may be monocyclic or polycyclic. Preferred examples of the monocyclic cycloalkyl group include $C_3$–$C_8$ cycloalkyl groups. Examples of the cycloalkyl group include cyclopropyl group, cyclopentyl group, cyclohexyl group, cyclobutyl group, and cyclooctyl group. Preferred examples of the polycyclic cycloalkyl group include $C_6$–$C_{20}$ cycloalkyl groups. Examples of the cycloalkyl group include adamanthyl group, norbornyl group, isoboronyl group, camphanyl group, dicyclopentyl group, α-pinene group, tricyclodecanyl group, tetracyclododecyl group, and androstanyl group. Some of the carbon atoms in the cycloalkyl group may be substituted by heteroatoms such as oxygen atom.

Preferred examples of the aryl groups represented by $R_{36}$ to $R_{39}$ include $C_6$–$C_{10}$ aryl groups. Examples of the aryl group include phenyl group, tolyl group, dimethylphenyl group, 2,4,6-trimethylphenyl group, naphthyl group, anthryl group, and 9,10-dimethoxyanthryl group.

Preferred examples of the aralkyl groups represented by $R_{36}$ to $R_{39}$ include $C_7$–$C_{12}$ aralkyl groups. Examples of the aralkyl group include benzyl group, phenethyl group, and naphthylmethyl group.

Preferred examples of the alkenyl groups represented by $R_{36}$ to $R_{39}$ include $C_2$–$C_8$ alkenyl groups. Examples of the alkenyl group include vinyl group, allyl group, butenyl group, and cyclohexenyl group.

Examples of the substituents which may be possessed by $R_{36}$ to $R_{39}$ include alkyl group, cycloalkyl group, aryl group, amino group, amide group, ureide group, urethane group, hydroxyl group, carboxyl group, halogen atom, alkoxy group, thioether group, acyl group, acyloxy group, alkoxycarbonyl group, cyano group, and nitro group.

Specific preferred examples of the group which is capable of decomposing by the action of an acid include tertiary alkyl group such as t-butyl, t-amyl, 1-alkyl-1-cyclohexyl, 2-alkyl-2-adamanthyl, 2-adamanthyl-2-propyl and 2-(4-methylcyclohexyl)-2-propyl, acetal group such as 1-alkoxy-1-ethoxy, 1-alkoxy-1-methoxy and tetrahydropyranyl, and t-alkylcarbonylmethyl. The group which decomposes when acted on by an acid is preferably a tertiary alkyl group, particularly a tertiary alkyl group having an alicyclic group.

Specific preferred examples of the repeating unit represented by the formula (III) will be given below, but the invention is not limited thereto.

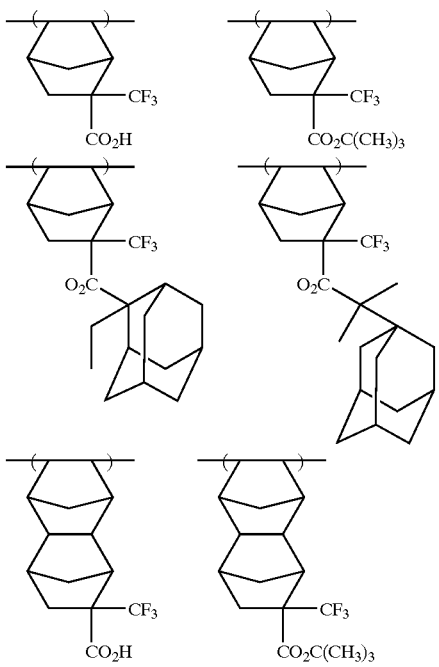

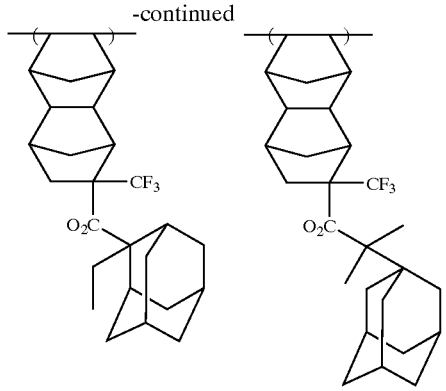

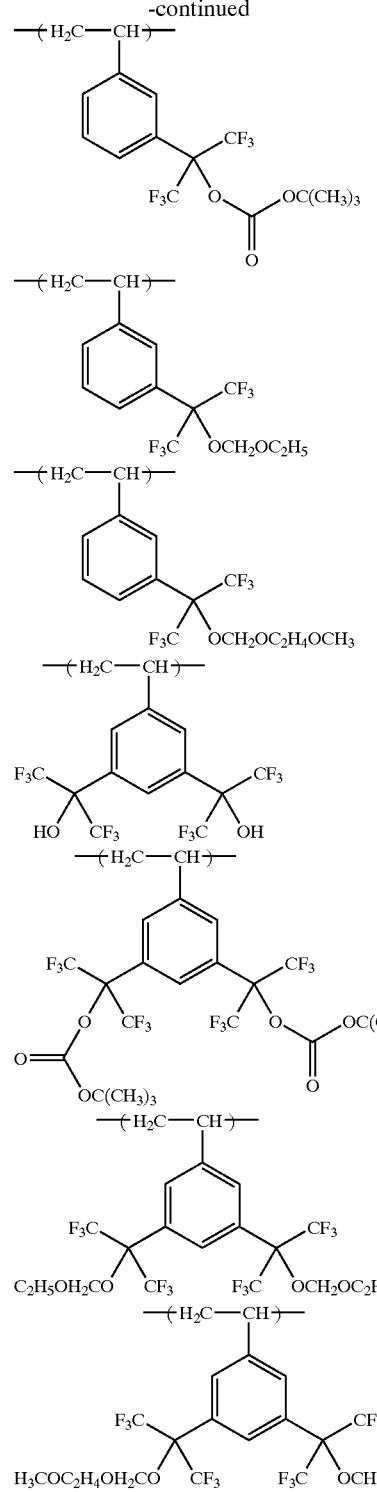

In the formula (IV), $R_{1a}$ represents a hydrogen atom, a fluorine atom, a chlorine atom, a bromine atom, a cyano group or a trifluoromethyl group. $R_{41}$ to $R_{46}$ each independently represents a hydrogen atom, a fluorine atom or a fluoroalkyl group, with the proviso that at least one of $R_{41}$ to $R_{46}$ is not a hydrogen atom. $X_2$ represents a hydrogen atom or a group which is capable of decomposing by the action of an acid. The suffix na' represents an integer of from 1 to 5. When na' is 2 or more, the two or more $R_{41}$'s to $R_{46}$'s and $X_2$'s may be the same or different.

Examples of the fluoroalkyl groups represented by $R_{41}$ to $R_{46}$ include the same fluoroalkyl groups as those represented by $R_1$ to $R_6$ in the formula (I).

Examples of the group represented by $X_2$ which is capable of decomposing by the action of an acid include the same as those of X in the formula (Ia).

Preferred examples of the repeating unit represented by the formula (IV) will be given below, but the invention is not limited thereto.

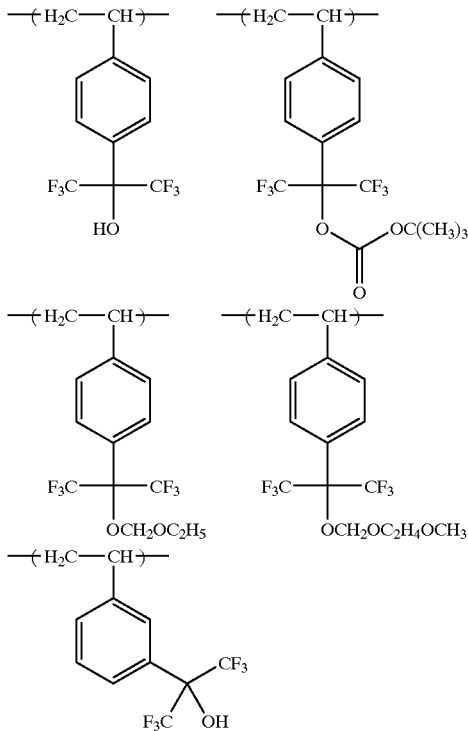

The resin (A2) may be polymerized with other polymerizable monomers besides the aforementioned repeating units.

Examples of the copolymerizable monomer to be used in combination with the resin (A2) include acrylic acid esters, acrylamides, methacrylic acid esters, methacrylamides, allyl compounds, vinyl ethers, vinyl esters, styrenes, crotonic acid esters, maleic acid dialkylesters, fumaric acid dialkylesters, maleic anhydride, maleimides, acrylonitrile, methacrylonitrile, maleilonitrile, and $C(R_{1a})(R_{2a})=C(R_{3a})$ ($R_{4a}$) (in which $R_{1a}$ to $R_{4a}$ may be the same or different and each represent a hydrogen atom, a halogen atom or an alkyl group substituted by halogen atom (preferably having from 1 to 10 carbon atoms). Particularly preferred among these copolymerizable monomers are acrylonitrile, methacrylonitrile, maleic anhydride, maleimide, N-hydroxymaleimide, N-(t-butoxycarbonyloxy)-maleimide, and $C(R_{1a})(R_{2a})=C(R_{3a})(R_{4a})$. Further, any copolymerizable addition-polymerizable unsaturated compounds may be used.

Specific examples of the resin (A2) will be given below, the invention is not limited thereto.

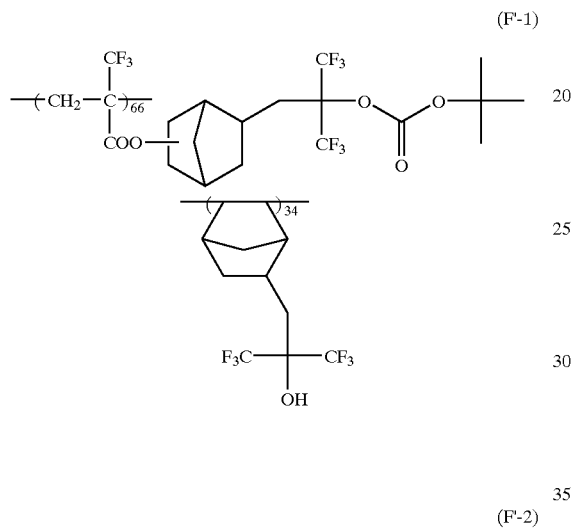
(F'-1)

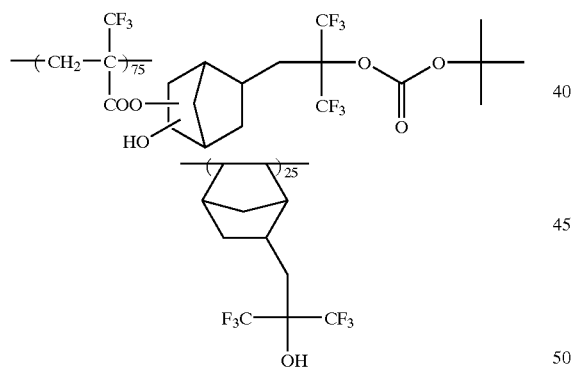
(F'-2)

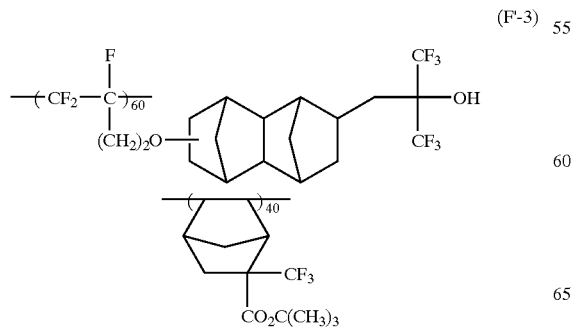
(F'-3)

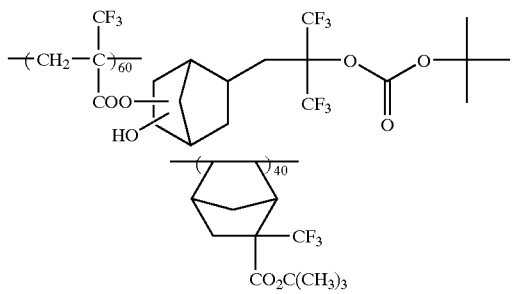
(F'-4)

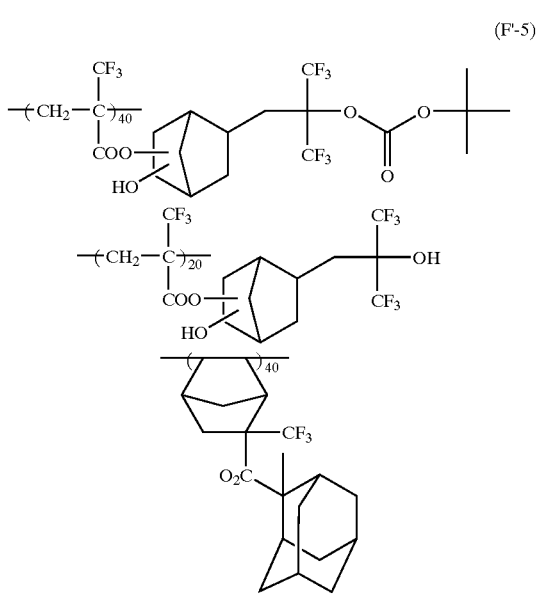
(F'-5)

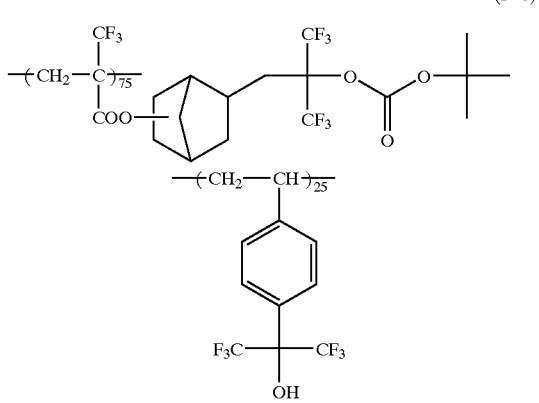
(F'-6)

The content of the repeating unit represented by the formula (Ia) in the resin (A2) is preferably from 10 to 90 mol %, more preferably from 20 to 80 mol %.

The content of the repeating units represented by the formulae (II) to (IV) in the resin (A2) is preferably from 20 to 60 mol %, more preferably from 25 to 50 mol %.

The content of the repeating unit having a group which decomposes when acted on by an acid in the resin (A2) is preferably from 15 to 50 mol %, more preferably from 20 to 40 mol %.

The resin (A2) increases in its solubility in an alkaline developer when the acid-decomposable group is acted on by an acid to decompose and produce a hydrophilic group such as hydroxyl group and carboxyl group.

The molecular weight of the resin (A2) is preferably from 2,000 to 50,000, more preferably from 3,000 to 30,000 as calculated in terms of weight-average molecular weight. When the molecular weight of the resin (A2) is too low, the resulting resist exhibits a deteriorated heat resistance. On the contrary, when the molecular weight of the resin (A2) is too high, the resulting resist exhibits a deteriorated solubility in the developer and hence a deteriorated sensitivity and resolving power.

The molecular weight dispersion degree (Mw/Mn) of the resin (A2) is preferably from 1.0 to 3.0, more preferably from 1.1 to 2.0, particularly, from 1.1 to 1.5. Examples of the method for reducing the molecular weight dispersion degree include a method which comprises dissolving a polymer obtained by an ordinary radical polymerization method in a good solvent, and then adding a poor solvent to the solution to remove components having a low molecular weight, and a living polymerization method such as living radical polymerization method. All these methods may be used to advantage.

As the living radical polymerization method there may be used any of Georges' method involving the use of nitroxide and Sawamoto and Machavski's method involving the use of metal complex.

From the standpoint of elimination of roughness of pattern, as the aforementioned ordinary radical polymerization method there is preferably used the dropping polymerization method (method which comprises further adding a monomer continuously or intermittently during the radical polymerization of the monomer in the presence of a radical polymerization initiator).

In the dropping polymerization method, the kind and composition of the monomer to be initially charged in the reaction vessel may be the same as or different from that of the monomer to be added during the progress of radical polymerization.

Further, a method which comprises additionally adding the polymerization initiator together with the monomer to be subsequently added can be employed to reduce the amount of the monomer left unreacted to advantage.

The amount of the resin (A2) to be added is normally from 50% to 99.5% by weight, preferably from 80% to 99% by weight, particularly from 90% to 98% by weight based on the total solid content in the composition.

[3] Resin (A3)

The positive-working resist composition of the invention comprises a resin (hereinafter occasionally referred to as "resin (A3)") containing at least one repeating unit having at least one group represented by the formula (Z).

In the formula (Z), Xb represents a divalent connecting group having a hetero atom, —O—, —S—, —SO$_2$— or —NR$_{ab}$— (in which R$_{ab}$ represents a hydrogen atom, an alkyl group, an aryl group or an aralkyl group). L represents a single bond or a divalent connecting group selected from the group consisting of an alkylene group, a cycloalkylene group, an arylene group, group obtained by connecting these groups and group obtained by connecting these groups to oxy group and/or carbonyl group.

$R^1$ to $R^6$ each independently represents a hydrogen atom, a halogen atom or an organic group, with the proviso that at least one of $R^1$ to $R^6$ represents a fluorine atom or an organic group containing at least one fluorine atom. R represents a hydrogen atom or an organic group.

Examples of the divalent connecting group having a hetero atom represented by Xb include —C(=O)O—, —OC(=O)—, —C(=O)N(R$_{ab}$)—, —N(R$_{ab}$)C(=O)— or —O— in which R$_{ab}$ represents a hydrogen atom, alkyl group, aryl group or aralkyl group.

Preferred examples of the alkyl group represented by R$_{ab}$ in Xb include C$_1$–C$_{10}$ straight-chain, branched or cyclic alkyl groups.

Preferred examples of the aryl group represented by R$_{ab}$ in Xb include C$_6$–C$_{10}$ aryl groups.

Preferred examples of the aralkyl group represented by R$_{ab}$ in Xb include C$_7$–C$_{12}$ aralkyl groups.

X is preferably —C(=O)O—, —OC(=O)—, —C(=O)N(R$_{ab}$)—, —N(R$_{ab}$)C(=O)— or —O—.

The divalent connecting group represented by L may be a divalent connecting group selected from the group consisting of alkylene group, cycloalkylene group, arylene group, group obtained by connecting these groups and group obtained by connecting these groups to oxy group and/or carbonyl group.

The alkylene group is preferably a C$_1$–C$_8$ straight-chain or branched alkylene group. Examples of such an alkylene group include methylene group, ethylene group, propylene group, butylene group, hexylene group, and octylene group.

The cycloalkylene group is preferably a C$_5$–C$_{15}$ cycloalkylene group. Examples of such a cycloalkylene group include cyclopentylene group, cyclohexylene group, norbornane residue, and tetrahydrodicyclopentadiene residue.

The arylene group is preferably a C$_6$–C$_{15}$ arylene group. Examples of such an arylene group include phenylene group, tolylene group, and naphthylene group.

Examples of the organic groups represented by $R^1$ to $R^6$ and R include straight-chain, branched or cyclic alkyl group (preferably having from 1 to 20 carbon atoms) which may have a substituent, aryl group (preferably having from 6 to 15 carbon atoms) which may have a substituent, acyl group (preferably having from 1 to 12 carbon atoms) which may have a substituent, and alkoxycarbonyl group (preferably having from 2 to 5 carbon atoms) which may have a substituent.

Examples of the halogen atoms represented by $R^1$ to $R^6$ include a fluorine atom, a chlorine atom, a bromine atom, and an iodine atom.

Examples of the substituents which may be possessed by the straight-chain, branched or cyclic alkyl, aryl, acyl and alkoxycarbonyl groups represented by $R^1$ to $R^6$ and R include nitro group, cyano group, carboxyl group, hydroxyl group, amino group, alkoxy group, alkoxycarbonyl group, fluorinated alkyl group, and halogen atom (fluorine, chlorine, bromine, iodine).

R is preferably a hydrogen atom or a straight-chain or branched alkyl, cyclic alkyl, acyl, alkoxycarbonyl, alkoxycarbonylmethyl, alkoxymethyl or 1-alkoxyethyl group, which may have a substituent.

The repeating unit having a group represented by the formula (Z) is preferably one represented by the formula (Ib) or (IIb).

In the formula (Ib), B represents an atomic group which is connected to two carbon atoms in the main chain to form a ring. Rb represents a hydrogen atom, halogen atom or organic group. The suffix n represents an integer of from 0 to 3. L$_1$ represents a single bond or a divalent connecting group. Z represents a group represented by the formula (Z).

In the formula (IIb), $R_{X1}$ and $R_{Y1}$ each independently represents a hydrogen atom, a halogen atom, a cyano group or an alkyl group which may have a substituent. $L_2$ represents a single bond or a divalent connecting group. Z represents a group represented by the formula (Z).

The repeating unit represented by the formula (Ib) is preferably one represented by the formula (VI).

In the formula (VI), Rb represents a hydrogen atom, halogen atom or organic group. $L_4$ represents a single bond or a divalent connecting group. Z represents a group represented by the formula (Z). The suffix m represents 0 or 1.

The repeating unit represented by the formula (II) is preferably one represented by the formula (XI).

In the formula (XI), $R_{X1}$ and $R_{Y1}$ each independently represents a hydrogen atom, a halogen atom, a cyano group or an alkyl group which may have a substituent. $L_5$ represents a single bond or a divalent connecting group. Z represents a group represented by the formula (Z).

The various substituents will be further described hereinafter.

Examples of the organic group include cyano group, amide group, straight-chain, branched or cyclic alkyl group (preferably having from 1 to 20 carbon atoms) which may have a substituent, aryl group (preferably having from 6 to 15 carbon atoms) which may have a substituent, acyl group (preferably having from 1 to 12 carbon atoms) which may have a substituent, alkoxycarbonyl group (preferably having from 2 to 5 carbon atoms) which may have a substituent, and aralkyl group (preferably having from 7 to 12 carbon atoms) which may have a substituent.

Examples of the alkyl group include straight-chain, branched or cyclic alkyl groups each preferably having from 1 to 20 carbon atoms. Specific examples of such an alkyl group include methyl group, ethyl group, propyl group, n-butyl group, sec-butyl group, hexyl group, 2-ethylhexyl group, octyl group, cyclopropyl group, cyclopentyl group, cyclohexyl group, cycloheptyl group, cyclooctyl group, adamanthyl group, norbornyl group, isoboronyl group, camphanyl group, dicyclopentyl group, α-pinene group, tricyclodecanyl group, tetracyclododecyl group, and androstanyl group. The cyclic alkyl groups may include those having some of the ring-forming carbon atoms substituted by a hetero atom such as oxygen atom, sulfur atom and nitrogen atom.

Preferred examples of the aryl group include $C_6$–$C_{15}$ aryl groups. Examples of the aryl groups include phenyl group, tolyl group, dimethylphenyl group, 2,4,6-trimethylphenyl group, naphthyl group, anthryl group, and 9,10-dimethoxyanthryl group.

The alkoxy group is preferably a $C_1$–$C_5$ alkoxy group. Examples of the alkoxy group include methoxy group, ethoxy group, propoxy group, and butoxy group.

The alkoxycarbonyl group is preferably a $C_2$–$C_{10}$ alkoxycarbonyl group. -Examples of the alkoxycarbonyl group include tertiary alkoxycarbonyl groups such as t-butoxycarbonyl group, t-amyloxycarbonyl group and 1-methyl-1-cyclohexyloxycarbonyl group.

Examples of the acyl group include $C_1$–$C_{12}$ acyl groups. Specific preferred examples of the acyl group include formyl group, acetyl group, propanoyl group, butanoyl group, pivaloyl group, octanoyl group, and benzoyl group.

The aralkyl group is preferably a $C_7$–$C_{12}$ aralkyl group. Examples of the aralkyl group include benzyl group, phenethyl group, naphthylmethyl group, and naphthyl group.

Examples of the halogen atom include a fluorine atom, a chlorine atom, a bromine atom, and an iodine atom.

The ring formed by the connection of the atomic group B in the formula (Ib) to two carbon atoms in main chain is preferably an alicyclic group.

The alicyclic group may be monocyclic or polycyclic. The monocyclic group preferably has from 3 to 8 carbon atoms. Examples of such a monocyclic group include cyclopropyl group, cyclopentyl group, cyclohexyl group, cycloheptyl group, and cyclooctyl group. The polycyclic group preferably has from 6 to 20 carbon atoms. Examples of such a polycyclic group include adamanthyl group, norbornyl group, isoboronyl group, camphanyl group, dicyclopentyl group, α-pinene group, tricyclodecanyl group, tetracyclododecyl group, and androstanyl group. The cycloalkyl groups may include those having some of the ring-forming carbon atoms substituted by heteroatoms such as oxygen atom, sulfur atom and nitrogen atom.

The divalent connecting group represents a divalent alkylene, cycloalkylene, alkenylene or arylene group, which may have a substituent, —O—, —S—, —SO$_2$—, —N(R$_{22c}$)—, —O—CO—R$_{22a}$—, —CO—O—R$_{22b}$— or —CO—N(R$_{22c}$)—R$_{22d}$—. R$_{22a}$, R$_{22b}$, R$_{22c}$ and R$_{22d}$ may be the same or different and each represents a divalent alkylene, cycloalkylene, alkenylene or arylene group, which may have a substituent. R$_{22c}$ represents a hydrogen atom or an alkyl, a cycloalkyl, an aralkyl or an aryl group, which may have a substituent.

The alkylene group may be a straight-chain or branched alkylene group. Examples of such an alkylene group include $C_1$–$C_8$ alkylene groups such as methylene, ethylene, propylene, butylene, hexylene and octylene.

Examples of the cycloalkylene group include $C_5$–$C_{15}$ cycloalkylene groups such as cyclopentylene group, cyclohexylene group, norbornane residue and tetrahydrodicyclopentadiene residue.

Preferred examples of the alkenylene group include $C_2$–$C_6$ alkenylene groups such as ethenylene group, propenylene group and butenylene group, which may have a substituent.

Preferred examples of the arylene group include $C_6$–$C_{15}$ arylene groups such as phenylene group, tolylene group and naphthylene group, which may have a substituent.

The aforementioned alkyl, acyl, aryl, aralkyl, alkoxy, alkoxycarbonyl, alkylene, cycloalkylene, alkenylene and arylene groups, which may have a substituent.

Examples of the substituents on these groups include those having an active hydrogen such as amino group, amide group, ureide group, urethane group, hydroxyl group and carboxyl group, halogen atoms (e.g., fluorine atom, chlorine atom, bromine atom, iodine atom), alkoxy groups (e.g., methoxy group, ethoxy group, propoxy group, butoxy group), thioether groups, acyl groups (e.g., acetyl group, propanoyl group, butoxy group), acyloxy groups (e.g., acetoxy group, propanoyl group, benzoyl group), alkoxycarbonyl groups (e.g., methoxycarbonyl group, ethoxycarbonyl group, propoxycarbonyl group), alkyl groups (e.g., methyl group, ethyl group, propyl group, butyl group), cycloalkyl groups (e.g., cyclohexyl group), aryl groups (e.g. phenyl group), cyano groups, and nitro groups.

Specific examples of the repeating units (Ib), (IIb), (VI) and (XI) will be given below, but the invention is not limited thereto.

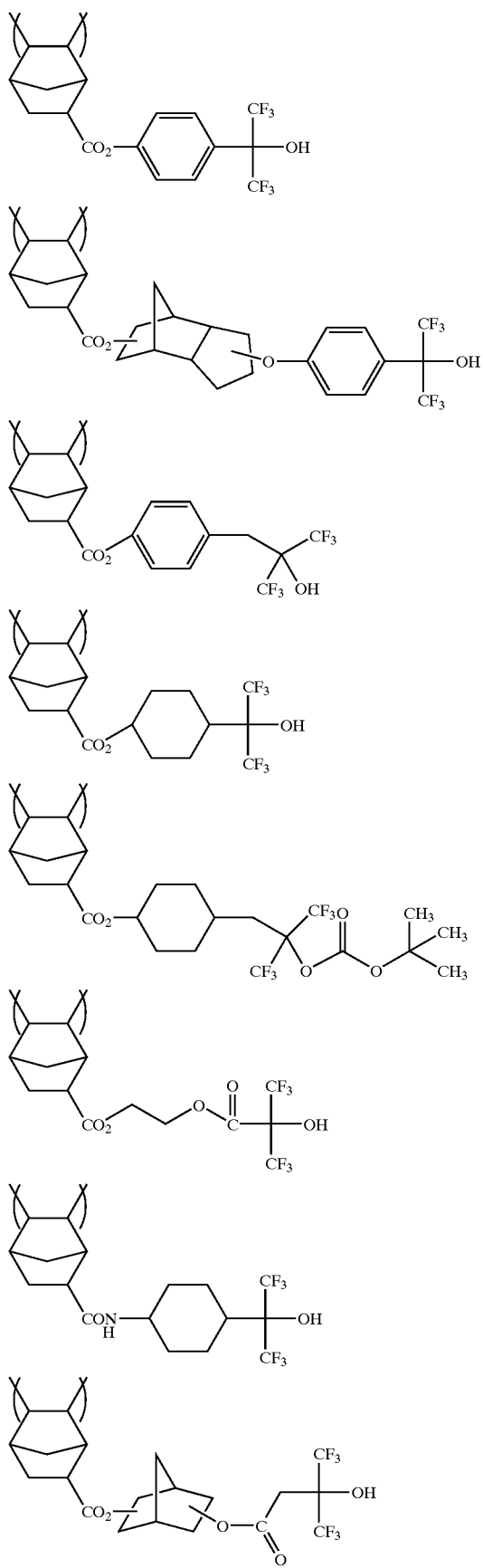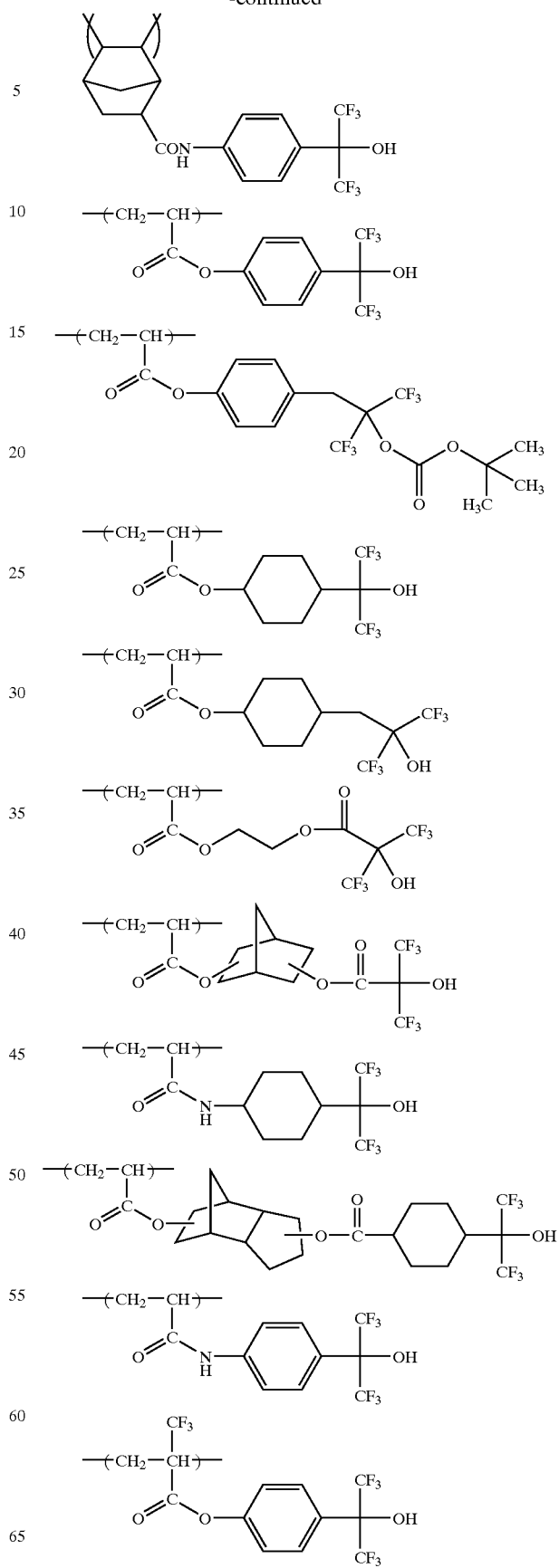

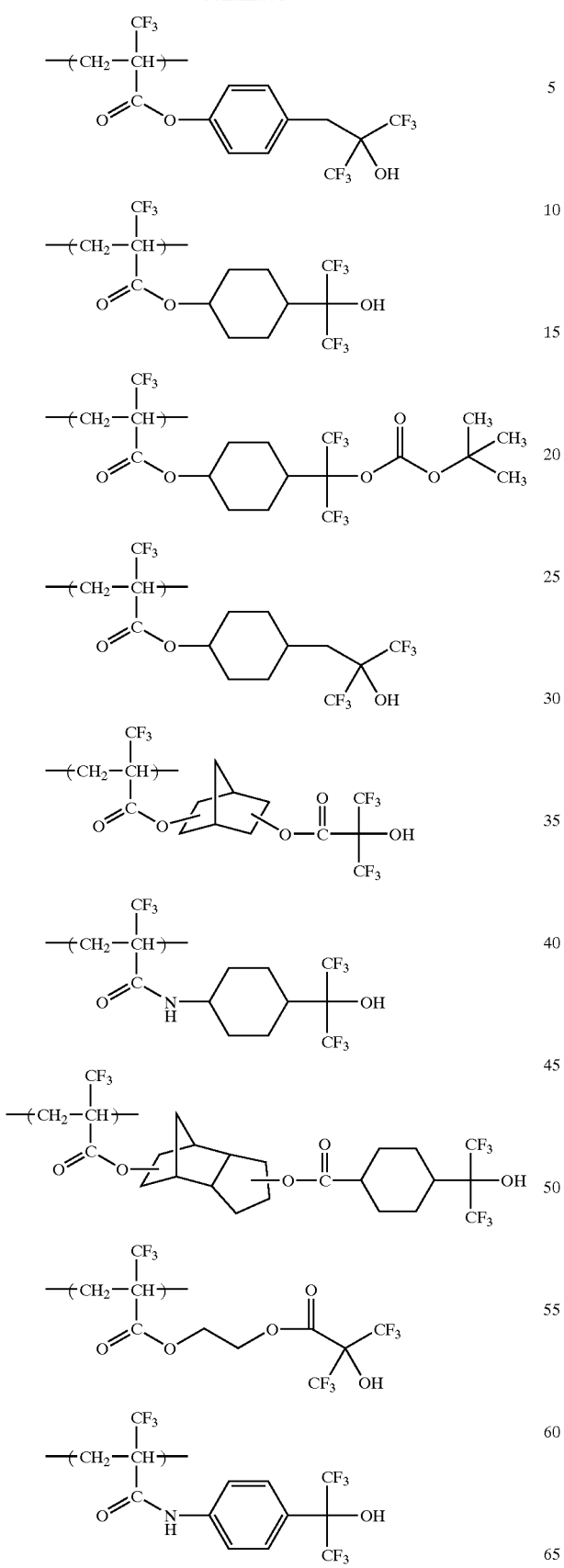
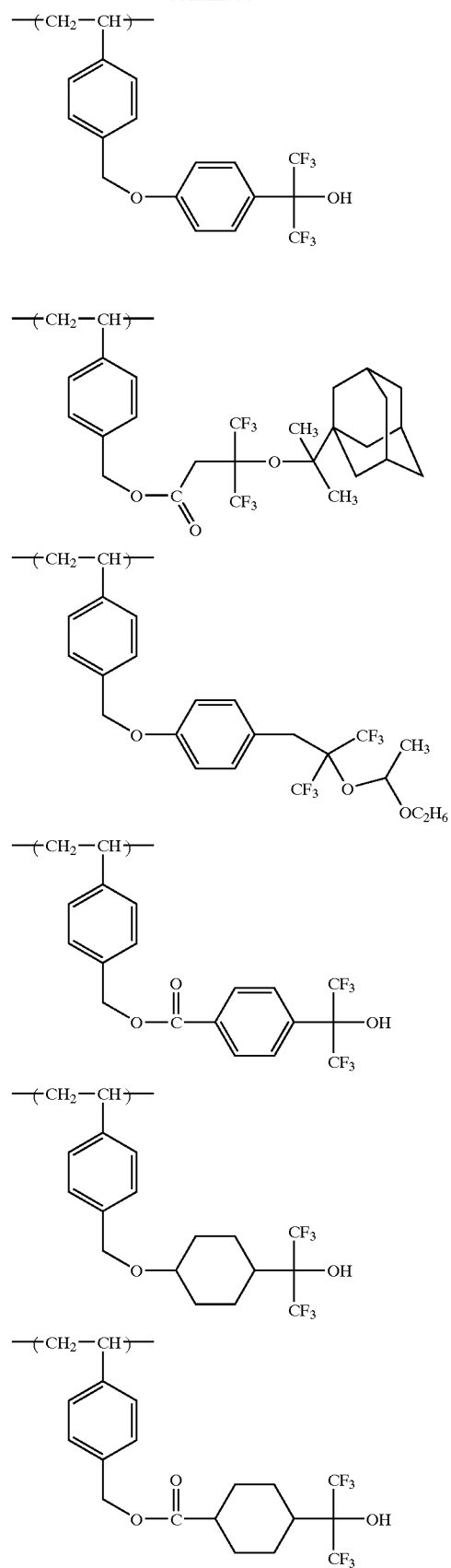

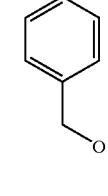

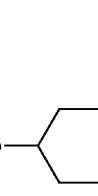

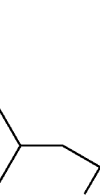

The resin (A3) may further have a repeating unit represented by the formula (IIIa), (IIIb) or (IVb).

In the formula (IIIa), B represents an atomic group which is connected to two carbon atoms in the main chain to form a ring. Rb represents a hydrogen atom, halogen atom or organic group. The suffix n' represents an integer of from 0 to 3. The suffix $L_1'$ represents a single bond or a divalent connecting group. The suffix $D_1'$ represents an acid-decomposable group.

In the formula (IIIb), $R^7$ and $R^8$ each independently represent a hydrogen atom, a halogen atom, a cyano group or an alkyl group which may have substituents. $L_2a$ represents a single bond or a divalent connecting group. $D_1$ represents an acid-decomposable group.

In the formula (IVb), $R_9$ represents a hydrogen atom, a halogen atom, a cyano group or an alkyl group which may have a substituent. $R_{10}$ and $R_{11}$ each independently represents a hydrogen atom, a halogen atom, a cyano group, a hydroxyl group or an organic group. $D_2$ represents an acid-decomposable group.

Examples of the organic groups represented by Rb, $R_{10}$ and $R_{11}$ in the formulae (IIIa) and (IVb) include straight-chain, branched or cyclic alkyl group (preferably having from 1 to 20 carbon atoms) which may have a substituent, aryl group (preferably having from 6 to 15 carbon atoms) which may have a substituent, acyl group (preferably having from 1 to 12 carbon atoms) which may have a substituent, and alkoxycarbonyl group (preferably having from 2 to 5 carbon atoms) which may have a substituent.

The alkyl groups represented by $R^7$, $R^8$ and $R^9$ in the formulae (IIIb) and (IVb) preferably each are a $C_1$–$C_{20}$ alkyl group. Specific preferred examples of such an alkyl group include methyl group, ethyl group, propyl group, n-butyl group, sec-butyl group, hexyl group, 2-ethylhexyl group, octyl group, cyclopropyl group, cyclopentyl group, cyclohexyl group, cycloheptyl group, cyclooctyl group, adamanthyl group, norbornyl group, isoboronyl group, camphanyl group, dicyclopentyl group, α-pinene group, tricyclodecanyl group, tetracyclododecyl group, and androstanyl group.

Examples of the alkyl groups in the organic groups represented by Rb, $R_{10}$ and $R_{11}$ include those listed above.

The aryl group in the organic groups represented by Rb, $R_{10}$ and $R_{11}$ is preferably a $C_6$–$C_{15}$ aryl group. Specific examples of such an aryl group include phenyl group, tolyl group, dimethylphenyl group, 2,4,6-trimethylphenyl group, naphthyl group, anthryl group, and 9,10-dimethoxyanthryl group.

The alkoxycarbonyl group in the organic group represented by Rb, $R_{10}$ and $R_{11}$ is preferably a $C_2$–$C_{10}$ alkoxycarbonyl group. Examples of the alkoxycarbonyl group include tertiary alkoxycarbonyl groups such as t-butoxycarbonyl group, t-amyloxycarbonyl group and 1-methyl-1-cyclohexyloxycarbonyl group.

Examples of the acyl group in the organic groups represented by Rb, $R_{10}$ and $R_{11}$ include $C_1$–$C_{12}$ acyl groups. Specific preferred examples of the acyl group include formyl group, acetyl group, propanoyl group, butanoyl group, pivaloyl group, octanoyl group, and benzoyl group.

Examples of the atomic group B in the formula (IIIa) include those listed with reference to the atomic group B in the formula (Ib).

Examples of the substituents which may be possessed by the alkyl group, aryl group, alkoxycarbonyl group and acyl group represented by Rb, $R^7$, $R^8$, and $R^9$ to $R^{11}$ include those having an active hydrogen such as amino group, amide group, ureide group, urethane group, hydroxyl group and carboxyl group, halogen atoms (e.g., fluorine atom, chlorine atom, bromine atom, iodine atom), alkoxy groups (e.g., methoxy group, ethoxy group, propoxy group, butoxy group), thioether groups, acyl groups (e.g., acetyl group, propanoyl group, butoxy group), acyloxy groups (e.g., acetoxy group, propanoyl group, benzoyl group), alkoxycarbonyl groups (e.g., methoxycarbonyl group, ethoxycarbonyl group, propoxycarbonyl group), alkyl groups (e.g., methyl group, ethyl group, propyl group, butyl group), cycloalkyl groups (e.g., cyclohexyl group), aryl groups (e.g., phenyl group), cyano groups, and nitro groups.

Examples of the halogen atoms represented by Rb, $R^7$, $R^8$, and $R^9$ to $R^{11}$ in the formulae (IIIa) and (IIIb) include a fluorine atom, a chlorine atom, a bromine atom, and an iodine atom.

Preferred examples of the divalent connecting group represented by $L_1'$ and $L_2a$ in the formulae (IIIa) and (IIIb) include divalent alkylene, alkenylene and cycloalkylene groups, —O—CO—Ra—, —CO—O—Rb—, and —CO—N(Rc)-Rd-. Ra, Rb and Rd may be the same or different and each represent a single bond, ether group, ester group, amide group, urethane group or divalent alkylene, amide, alkenylene, cycloalkylene or arylene group which may have ureide group. Rc represents a hydrogen atom or an alkyl, cycloalkyl, aralkyl or aryl group, which may have a substituent.

The divalent connecting group preferably has from 1 to 20, more preferably from 1 to 10 carbon atoms.

Examples of the acid-decomposable groups represented by $D_1'$, $D_1$ and $D_2$ in the formulae (IIIa), (IIIb) and (IVb) include acid-decomposable groups described later.

Specific examples of the repeating unit represented by the formula (IIIb), (IIIb) or (IVb) will be given below, but the invention is not limited thereto.

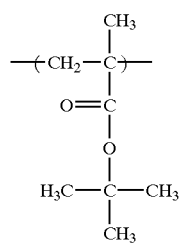 (B-1)
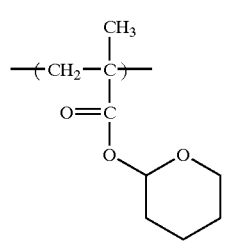 (B-2)
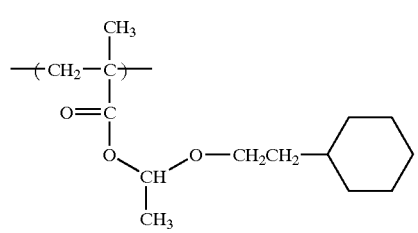 (B-3)
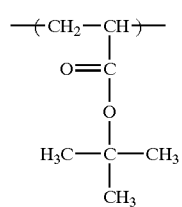 (B-4)
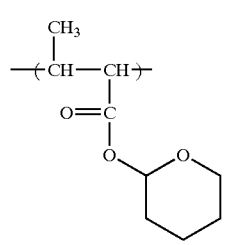 (B-5)
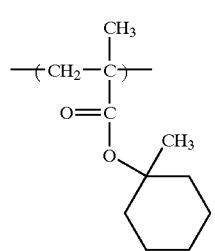 (B-6)
-continued
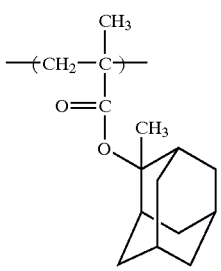 (B-7)
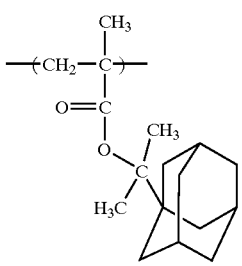 (B-8)
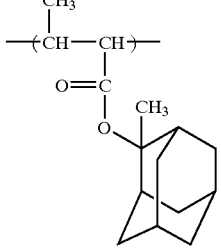 (B-9)
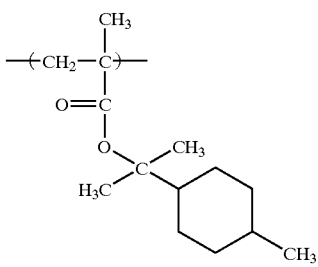 (B-10)
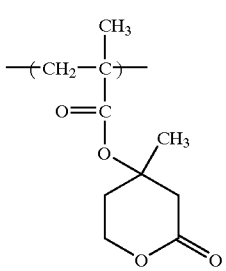 (B-11)
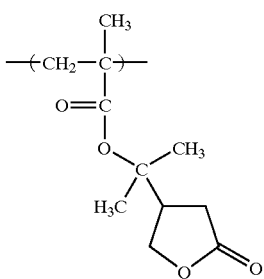 (B-13)

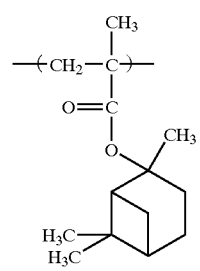
(B-14)
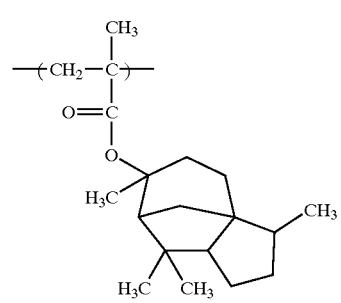
(B-15)
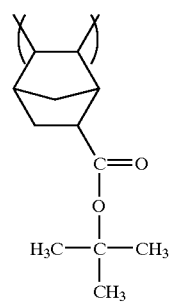
(B-16)
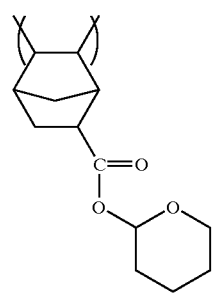
(B-17)
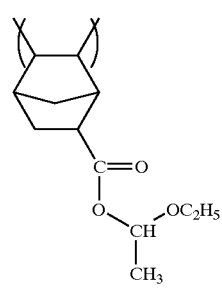
(B-18)
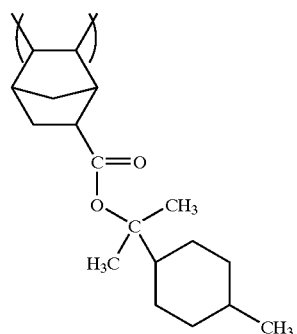
(B-19)
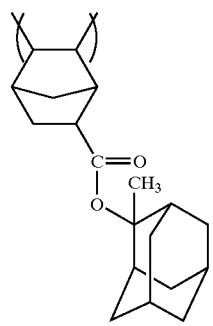
(B-20)
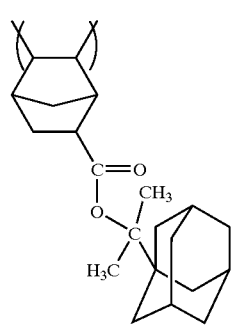
(B-21)
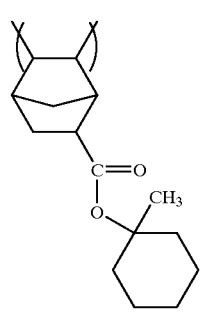
(B-22)
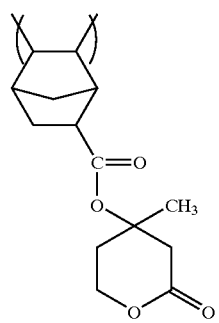
(B-23)

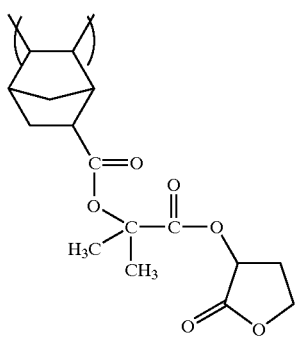
(B-24)
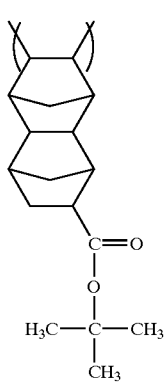
(B-25)
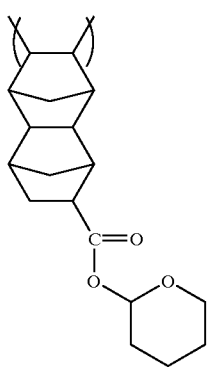
(B-26)
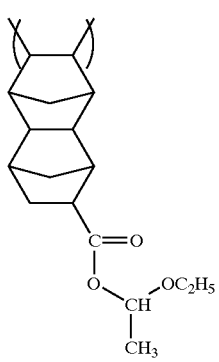
(B-27)
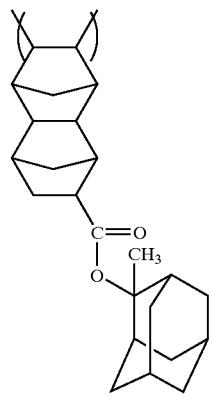
(B-28)
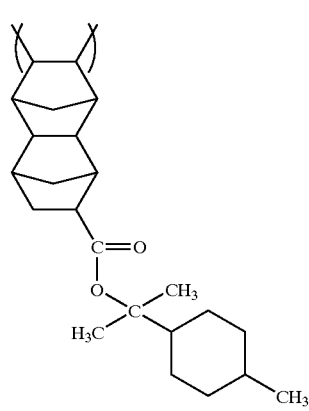
(B-29)
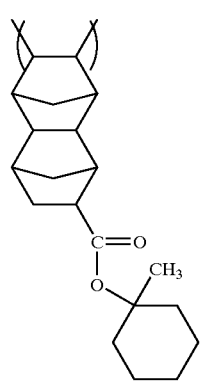
(B-30)
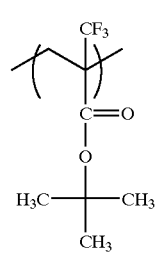
(B-1')

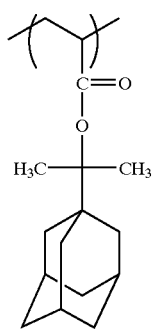
(B-8')
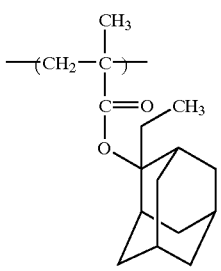
(F-54B)
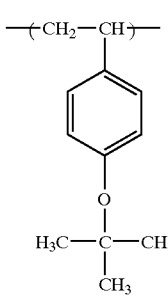
(B-8")
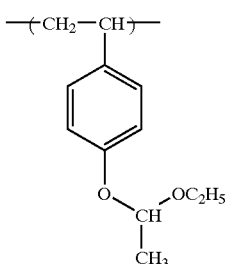
(B-31)
(B-12')
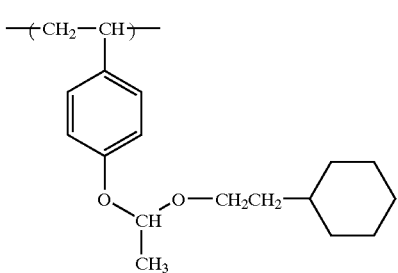
(B-32)
(B-12")
(B-33)
(B-7')
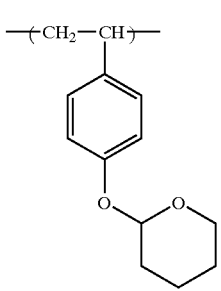
(B-34)

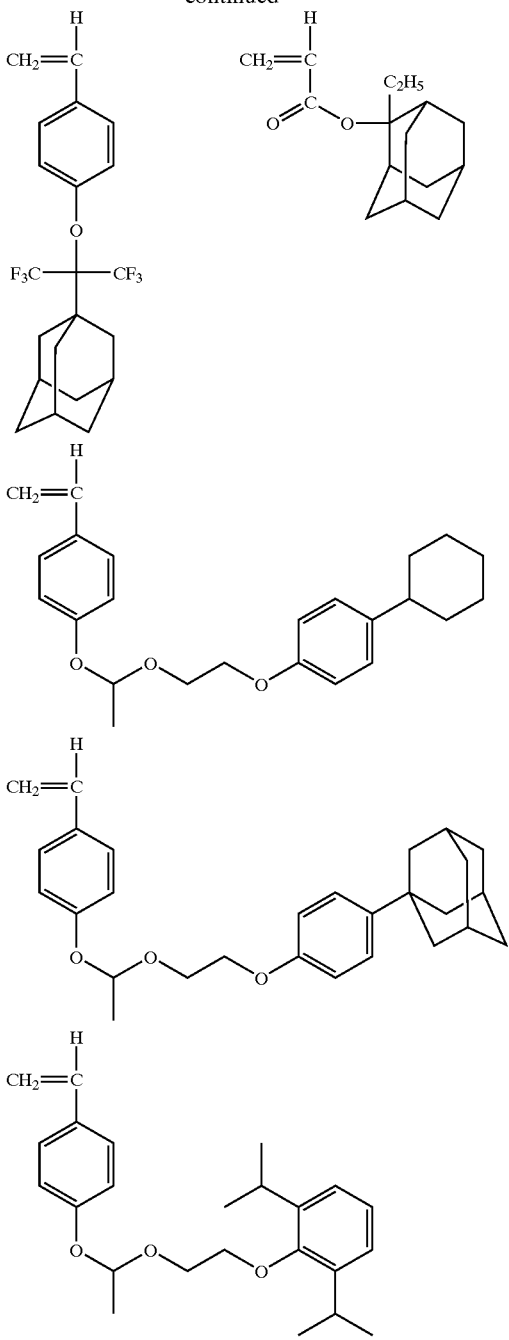

The resin (A3) has a group which is capable of decomposing to become alkali-soluble by the action of an acid (acid-decomposable group). In this arrangement, when acted on by an acid, the resin (A3) decomposes to increase in its solubility in an alkaline developer. The acid-decomposable group may be possessed by the repeating unit having a group represented by the formula (Z), maybe $D_1'$, $D_1$ or $D_2$ in the repeating units represented by the formulae (IIIa), (IIIb) and (IVb) or may be possessed by other repeating units.

Examples of the acid-decomposable group include —O—C($R_{19}$)($R_{20}$)($R_{21}$), —O—C($R_{19}$)($R_{20}$)(O$R_{22}$), —O—COO—C($R_{19}$)($R_{20}$)($R_{21}$), —O—C($R_{01}$)($R_{02}$)COO—C($R_{19}$)($R_{20}$)($R_{21}$), —COO—C($R_{19}$)($R_{20}$)($R_{21}$), and —COO—C($R_{19}$)($R_{20}$)(O$R_{22}$). $R_{01}$ and $R_{02}$ each independently represent a hydrogen atom or an alkyl, cycloalkyl, alkenyl, aralkyl or aryl group which may have substituents. $R_{19}$ to $R_{22}$ may be the same or different and each represent an alkyl, cycloalkyl, alkenyl, aralkyl or aryl group, which may have a substituent. Two of $R_{19}$, $R_{20}$ and $R_{21}$ or two of $R_{19}$, $R_{20}$ and $R_{22}$ may be bonded to each other to form a ring.

The aforementioned alkyl group is preferably a $C_1$–$C_8$ alkyl group. Examples of such an alkyl group include methyl group, ethyl group, propyl group, n-butyl group, sec-butyl group, hexyl group, 2-ethylhexyl group, and octyl group.

The cycloalkyl group may be monocyclic or polycyclic. Preferred examples of the monocyclic cycloalkyl group include $C_3$–$C_8$ cycloalkyl groups. Examples of the cycloalkyl group include cyclopropyl group, cyclopentyl group, cyclohexyl group, cyclobutyl group, and cyclooctyl group, Preferred examples of the polycyclic cycloalkyl group include $C_6$–$C_{20}$ cycloalkyl groups. Examples of the cycloalkyl group include adamanthyl group, norbornyl group, isoboronyl group, camphanyl group, dicyclopentyl group, α-pinene group, tricyclodecanyl group, tetracyclododecyl group, and androstanyl group.

Preferred examples of the alkenyl groups include $C_2$–$C_8$ alkenyl groups. Examples of the alkenyl group include vinyl group, allyl group, butenyl group, and cyclohexenyl group.

Preferred examples of the aryl groups include $C_6$–$C_{10}$ aryl groups. Examples of the aryl group include phenyl group, tolyl group, dimethylphenyl group, 2,4,6-trimethylphenyl group, naphthyl group, anthryl group, and 9,10-dimethoxyanthryl group.

Preferred examples of the aralkyl groups include $C_7$–$C_{12}$ aralkyl groups. Examples of the aralkyl group include benzyl group, phenethyl group, and naphthylmethyl group.

An example of the ring formed by the connection of two of $R_{19}$ to $R_{22}$ is a 3-membered to 8-membered ring. Specific examples of such a ring include cyclopropane ring, cyclopentane ring, cyclohexane ring, furane ring, pyrane ring, dioxonol ring, and 1,3-dioxolane ring.

Examples of the substituents on these groups include those having an active hydrogen such as amino group, amide group, ureide group, urethane group, hydroxyl group and carboxyl group, halogen atoms (e.g., fluorine atom, chlorine atom, bromine atom, iodine atom), alkoxy groups (e.g., methoxy group, ethoxy group, propoxy group, butoxy group), thioether groups, acyl groups (e.g., acetyl group, propanoyl group, butoxy group), acyloxy groups (e.g., acetoxy group, propanoyl group, benzoyl group), alkoxycarbonyl groups (e.g., methoxycarbonyl group, ethoxycarbonyl group, propoxycarbonyl group), cyano groups, and nitro groups.

Specific preferred examples of the acid-decomposable group include tertiary alkyl ether or ester groups such as t-butyl group, 5-amyl group, 1-alkyl-1-cyclohexyl group, 2-alkyl-2-adamanthyl group, 2-adamanthyl-2-propyl group and 2-(4-methylcyclohexyl)-2-propyl group, acetal or acetal ester groups such as 1-alkoxy-1-ethoxy group and tetrahydropyranyl group, t-alkylcarbonate groups, and t-alkylcarbonylmethoxy groups. Particularly preferred among these acid-decomposable groups are acetal groups such as 1-alkoxy-1-ethoxy group and tetrahydropyranyl group.

These acetal groups are advantageous in that they exhibit a great acid-decomposability that increases the range of selection of the acid-producing compounds to be used in combination therewith, making it possible to enhance the sensitivity of the composition and inhibit the change of properties of the composition with time between exposure and heating. Particularly preferred is an acetal group containing as 1-alkoxy component of acetal group an alkoxy group derived from the aforementioned perfluoroalkyl group. The resulting composition exhibits a higher transmission with respect to an exposing light having a short wavelength (e.g., $F_2$ excima laser beam having a wavelength of 157 nm).

The resin (A3) wherein R in the formula (Z) is a hydrogen atom is soluble in an alkaline developer.

The resin (A3) may be copolymerized with other polymerizable monomers besides the aforementioned repeating units for the purpose of improving the properties of the positive-working resist composition of the invention.

Examples of the copolymerizable monomers employable herein include compounds having one addition-polymerizable unsaturated bond selected from the group consisting of acrylic acid esters, acrylamides, methacrylic acid esters, methacrylamides, allyl compounds, vinyl ethers, vinyl esters, styrenes and crotonic acid esters other than described above.

Specific examples of these copolymerizable monomers include acrylic acid esters such as alkyl (preferably having from 1 to 10 carbon atoms) acrylate (e.g., methyl acrylate, ethyl acrylate, propyl acrylate, amyl acrylate, cyclohexyl acrylate, ethylhexyl acrylate, octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, tetrahydrofurfuryl acrylate) and aryl acrylate (e.g., phenyl acrylate); methacrylic acid esters such as alkyl (preferably having from 1 to 10 carbon atoms) methacrylate (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate) and aryl methacrylate (e.g., phenyl methacrylate, cresyl methacrylate, naphthyl methacrylate); and styrenes such as styrene, alkyl styrene (e.g., methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene, acetoxymethyl styrene), alkoxy styrene (e.g., methoxy styrene, 4-methoxy-3-methyl styrene, dimethoxy styrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), carboxystyrene and vinyl naphthalene.

Besides these compounds, any copolymerizable addition-polymerizable unsaturated compounds may be normally used.

The above exemplified repeating units may be used singly or in admixture.

In the formula (A3), the molar ratio of the various repeating units may be properly predetermined to adjust the dry etching resistance, adaptability to normal developer, adhesivity to substrate and profile of resist, and ordinary required properties of resist such as resolving power, heat resistance and sensitivity.

The content of the repeating unit having a group represented by the formula (Z) in the resin (A3) is preferably from 1 to 100 mol %, more preferably from 3 to 90 mol %, even more preferably from 5 to 80 mol %.

The content of the repeating unit represented by the formula (IIIa) or (IIIb) in the resin (A3) is preferably from 1 to 90 mol %, more preferably from 3 to 80 mol %, even more preferably 5 to 70 mol % based on the total amount of repeating units.

The content of the repeating unit represented by the formula (IVb) in the resin (A3) is preferably from 1 to 90 mol %, more preferably from 3 to 80 mol %, even more preferably 5 to 70 mol % based on the total amount of repeating units.

The content of the repeating unit having an acid-decomposable group is preferably from 3 to 90 mol %, more preferably from 5 to 80 mol %, even more preferably from 10 to 70 mol % based on the total amount of repeating units.

The resin (A3) can be synthesized according to any ordinary method (e.g., radical polymerization method). In accordance with an ordinary synthesis method, for example, monomer seeds are charged in the reaction vessel at a time or during the reaction. These monomers are optionally dissolved uniformly in a solvent capable of dissolving these monomers therein such as ether (e.g., tetrahydrofurane, 1,4-dioxane, diisopropylether), ketone (e.g., methyl ethyl ketone, methyl isobutyl ketone), ester (e.g., ethyl acetate) and propylene glycol monomethyl ether acetate described later. The monomer solution thus obtained is optionally heated in an atmosphere of inert gas such as nitrogen and argon, and then subjected to polymerization in the presence of a commercially available radical polymerization initiator (e.g., azo-based initiator, peroxide). If necessary, the initiator is additionally or batchwise added. The reaction product is then put in a solvent. The desired polymer is then recovered in the form of powder or solid matter. The reaction concentration is not smaller than 20% by weight, preferably not smaller than 30% by weight, even more preferably not smaller than 40% by weight. The reaction temperature is from 10° C. to 150° C., preferably from 30° C. to 120° C., even more preferably from 50° C. to 100° C. Some monomers maybe subjected to anionic polymerization to further facilitate the synthesis of the polymer. For the details of polymerization method, reference can be made to "Jikken Kagaku Koza (Institute of Experimental Chemistry) 28", Koubunshi Gosei, and "Shinjikken Kagaku Koza (New Institute of Experimental Chemistry) 19", Koubunshi Gosei.

The weight-average molecular weight of the resin (A3) is preferably from 1,000 to 200,000, more preferably from 3,000 to 20,000. The distribution of molecular weight of the resin (A3) is from 1 to 10, preferably from 1 to 3, even more preferably from 1 to 2. The smaller the distribution of molecular weight is, the better are the resolution and resist shape, the smoother is the side wall of the resist pattern and hence the better is the roughness resistance. The amount of the resin (A3) to be used in the invention is from 50% to 99.5% by weight, preferably from 60% to 98% by weight, even more preferably from 65% to 95% by weight based on the total solid content of the composition.

[4] (A) A Resin Containing a Repeating Unit Represented by the Following Formula (AI) or (AII), Which Increases the Solubility in an Alkali Developing Solution by the Action of an Acid The positive-working resist composition of the invention comprises a resin containing a repeating unit represented by the following formula (AI) or (AII), which increases the solubility in an alkali developing solution by the action of an acid (hereinafter referred to as "resin (A)").

In the formulae (AI) and (AII), $X^1$ and $X^2$ each represents a hydrogen atom or a group which is capable of decomposing by the action of an acid. $Q_1$ represents a hydrogen atom, a halogen atom, a trifluoromethyl group or a cyano group. $R_1$ to $R_6$ each independently represents a hydrogen atom, a fluorine atom or a fluoroalkyl group, with the proviso that at least one of $R_1$ to $R_6$ is not a hydrogen atom. The suffix n represents 0 or 1.

Examples of the groups $X^1$ and $X^2$ which is capable of decomposing by the action of an acid (hereinafter referred to as "acid-decomposable group") include —C($R_{36}$)($R_{37}$)($R_{38}$), —C($R_{36}$)($R_{37}$)(O$R_{39}$), —COO—C($R_{36}$)($R_{37}$)($R_{38}$), —C($R_{01}$)($R_{02}$)(O$R_{39}$), and —C($R_{01}$)($R_{02}$)COO—C($R_{36}$)($R_{37}$)($R_{38}$).

$R_{36}$ to $R_{39}$ each independently represents an alkyl, cycloalkyl, alkenyl, aralkyl or aryl group, which may have a substituent. $R_{36}$ and $R_{39}$ may be bonded to each other to form a ring.

$R_{01}$ and $R_{02}$ each independently represents a hydrogen atom or an alkyl, cycloalkyl, alkenyl, aralkyl or aryl group, which may have a substituent.

The alkyl groups represented by $R_{36}$ to $R_{39}$, $R_{01}$ and $R_{02}$ each are preferably a $C_1$–$C_8$ alkyl group. Examples of the alkyl group include methyl group, ethyl group, propyl group, n-butyl group, sec-butyl group, hexyl group, 2-ethylhexyl group, and octyl group.

The cycloalkyl groups represented by $R_{36}$ to $R_{39}$, $R_{01}$ and $R_{02}$ each may be monocyclic or polycyclic. Preferred examples of the monocyclic cycloalkyl group include $C_3$–$C_8$ cycloalkyl groups. Examples of the cycloalkyl group include cyclopropyl group, cyclopentyl group, cyclohexyl group, cyclobutyl group, and cyclooctyl group. Preferred examples of the polycyclic cycloalkyl group include $C_6$–$C_{20}$ cycloalkyl groups. Examples of the cycloalkyl group include adamanthyl group, norbornyl group, isoboronyl group, camphanyl group, dicyclopentyl group, α-pinene group, tricyclodecanyl group, tetracyclododecyl group, and androstanyl group. Some of the carbon atoms in the cycloalkyl group may be substituted by a hetero atom such as oxygen atom.

Preferred examples of the aryl groups represented by $R_{36}$ to $R_{39}$, $R_{01}$ and $R_{02}$ include $C_6$–$C_{10}$ aryl groups. Examples of the aryl group include phenyl group, tolyl group, dimethylphenyl group, 2,4,6-trimethylphenyl group, naphthyl group, anthryl group, and 9,10-dimethoxyanthryl group.

Preferred examples of the aralkyl groups represented by $R_{36}$ to $R_{39}$, $R_{01}$ and $R_{02}$ include $C_7$–$C_{12}$ aralkyl groups. Examples of the aralkyl group include benzyl group, phenethyl group, and naphthylmethyl group.

Preferred examples of the alkenyl groups represented by $R_{36}$ to $R_{39}$, $R_{01}$ and $R_{02}$ include $C_2$–$C_8$ alkenyl groups. Examples of the alkenyl group include vinyl group, allyl group, butenyl group, and cyclohexenyl group.

Examples of the substituents which may be possessed by $R_{36}$ to $R_{39}$, $R_{01}$ and $R_{02}$ include alkyl group, cycloalkyl group, aryl group, amino group, amide group, ureide group, urethane group, hydroxyl group, carboxyl group, halogen atom, alkoxy group, thioether group, acyl group, acyloxy group, alkoxycarbonyl group, cyano group, and nitro group.

Preferred examples of the acid-decomposable group include acetal group such as 1-alkoxy-1-ethoxy, 1-alkoxy-1-methoxy and tetrahydropyranyl, t-alkyloxycarbonyl group, ethoxymethyl group, methoxyethoxymethyl group, and t-alkylcarbonylmethyl group.

Examples of the halogen atom represented by $Q_1$ include a fluorine atom, a chlorine atom, a bromine atom, and an iodine atom.

$Q_1$ is preferably a trifluoromethyl group.

The fluoroalkyl group represented by $R_1$ to $R_6$ is an alkyl group at least one hydrogen atom of which is fluorinated and preferably has from 1 to 6 carbon atoms, more preferably from 1 to 3 carbon atoms. Specific examples of the fluoroalkyl group include trifluoromethyl group, difluoromethyl group, fluoromethyl group, pentafluoroethyl group, 3,3,3-trifluoropropyl group, and 3-fluoropropyl group. Particularly preferred among these fluoroalkyl groups is trifluoromethyl group.

The fluoroalkyl group represented by $R_1$ to $R_6$ may have a substituent. Examples of the substituents include a chlorine atom, a bromine atom, and an iodine atom.

$R_1$ to $R_6$ each are preferably a fluorine atom.

Specific examples of the repeating unit represented by the formula (AI) or (AII) will be given below, but the invention is not limited thereto.

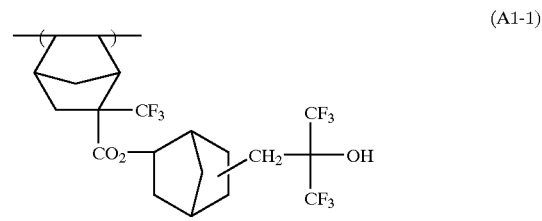

(A1-1)

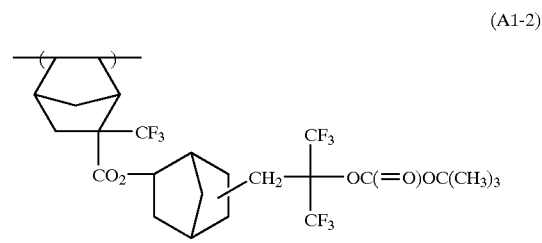

(A1-2)

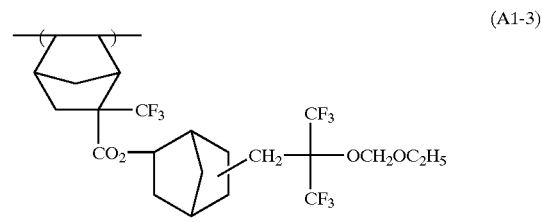

(A1-3)

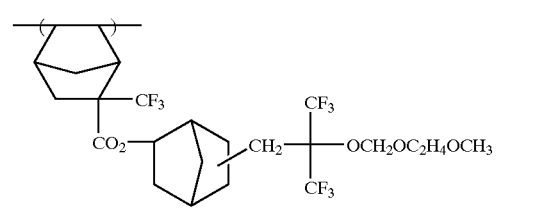

(A1-4)

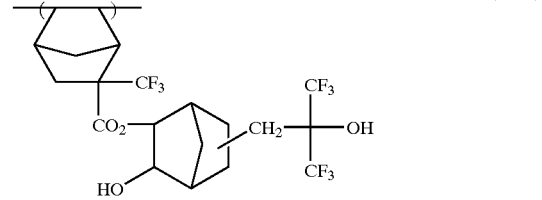

(A1-5)

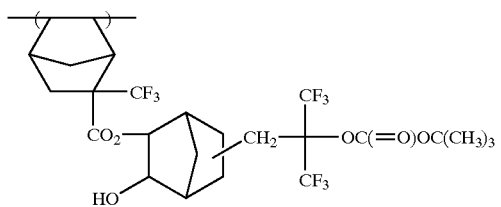
(A1-6)

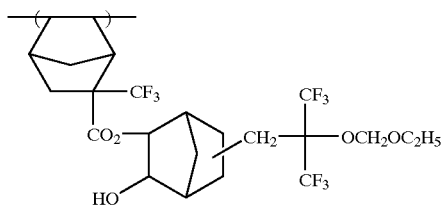
(A1-7)

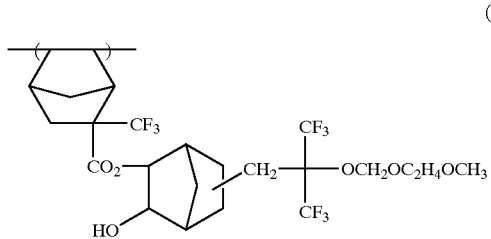
(A1-8)

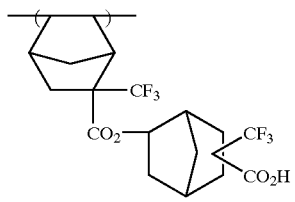
(A2-1)

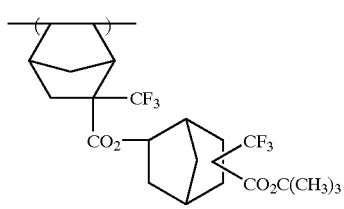
(A2-2)

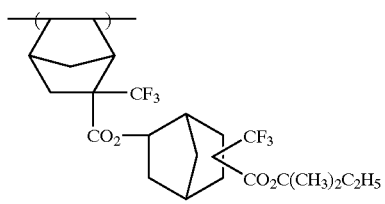
(A2-3)

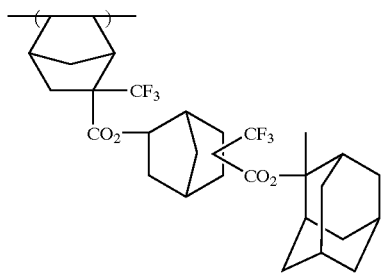
(A2-4)

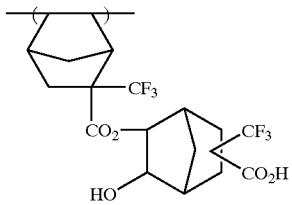
(A2-5)

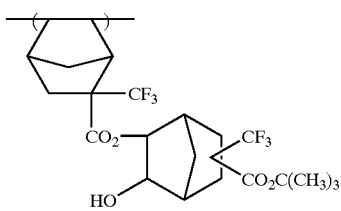
(A2-6)

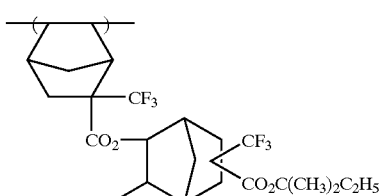
(A2-7)

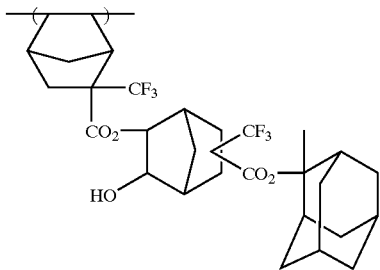
(A2-8)

The resin (A4) preferably has at least one selected from the group consisting of repeating units represented by the formulae (Ic) to (VIIIc).

In the formula (Ic), $X^2$ represents a hydrogen atom or a group which is capable of decomposing by the action of an acid. Ra, Rb and Rc each independently represents a hydrogen atom, a fluorine atom or a fluoroalkyl group. AR represents an alicyclic hydrocarbon structure. Q represents a hydrogen atom or a hydroxyl group. $R_{21}$ to $R_{26}$ each independently represents a hydrogen atom, a fluorine atom or a fluoroalkyl group, with the proviso that at least one of $R_{21}$ to $R_{26}$ is not a hydrogen atom. The suffix nb represents 0 or 1.

$X^2$ has the same meaning as $X^2$ in the formula (AII).

Examples of the fluoroalkyl groups represented by Ra, Rb and Rc include the same fluoroalkyl groups as those represented by $R_1$ to $R_6$ the formula (AI).

$R_{21}$ to $R_{26}$ have the same meanings as $R_1$ to $R_6$ in the formula (AI).

Rc is preferably a fluorine atom or a trifluoromethyl group.

The alicyclic hydrocarbon structure represented by AR may be monocyclic or polycyclic. Specific examples of the alicyclic hydrocarbon structure include monocyclo, bicyclo, tricyclo and tetracyclo alicyclic hydrocarbon structures. These alicyclic hydrocarbon structures each preferably have from 6 to 30 carbon atoms, particularly from 7 to 25 carbon atoms.

Preferred examples of the alicyclic hydrocarbon structure represented by AR include adamanthane, noradamanthane, decalin, tricyclodecane, tetracyclodecane, norbornane, cyclohexane, cycloheptane, cyclooctane, cyclodecane, and cyclododecane. Even more desirable among these alicyclic hydrocarbon structures are adamanthane, norbornane, and cyclohexane.

The alicyclic hydrocarbon structure represented by AR may further contain an alkyl group, alkoxy group, etc. as substituents.

Specific examples of the repeating unit represented by the formula (Ic) will be given below, but the invention is not limited thereto.

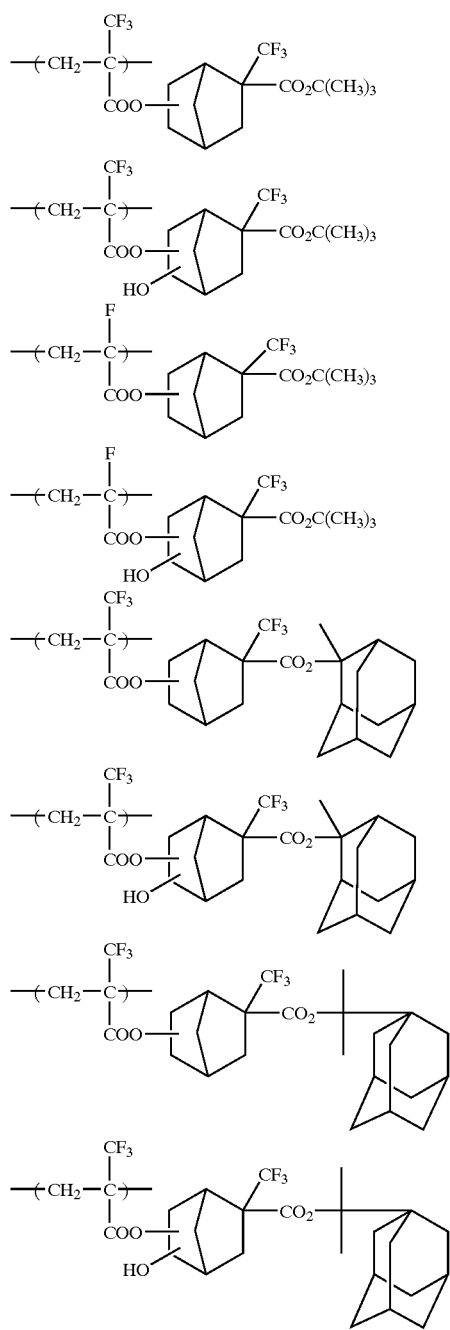

-continued

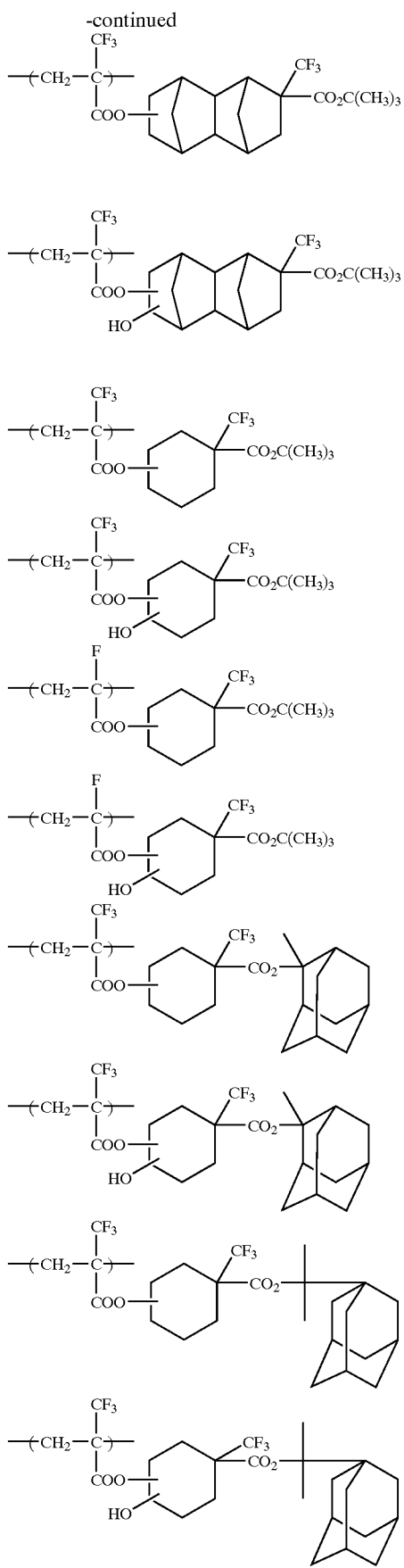

-continued

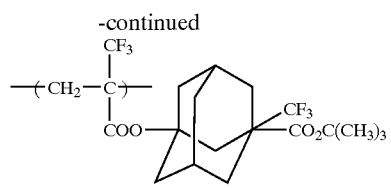

In the formula (IIc), Ra, Rb and Rc each independently represents a hydrogen atom, a fluorine atom or a fluoroalkyl group. $R_1$ to $R_6$ each independently represents a hydrogen atom, a fluorine atom or a fluoroalkyl group, with the proviso that at least one of $R_1$ to $R_6$ is not a hydrogen atom. $R_{21}$ to $R_{26}$ each independently represents a hydrogen atom, a fluorine atom or a fluoroalkyl group, with the proviso that at least one of $R_{21}$ to $R_{26}$ is not a hydrogen atom. $X_1$ represents a hydrogen atom or a group which is capable of decomposing by the action of an acid. Q represents a hydrogen atom or a hydroxyl group. AR represents an alicyclic hydrocarbon structure. The suffix n represents 0 or 1. The suffix nb represents 0 or 1.

Ra, Rb and Rc have the same meanings as Ra, Rb and Rc in the formula (I).

AR has the same meaning as AR in the formula (Ic).

$X^1$ has the same meaning as $X^1$ in the formula (AI).

$R_1$ to $R_6$ have the same meanings as $R_1$ to $R_6$ in the formula (AI).

$R_{21}$ to $R_{26}$ have the same meanings as $R_1$ to $R_6$ in the formula (AI).

Specific examples of the repeating unit represented by the formula (IIc) will be given below, but the invention is not limited thereto.

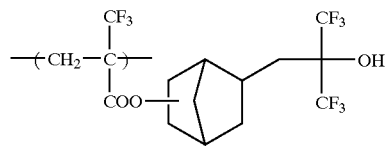

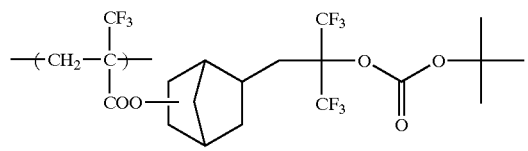

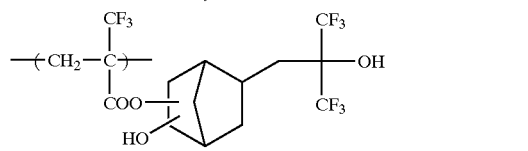

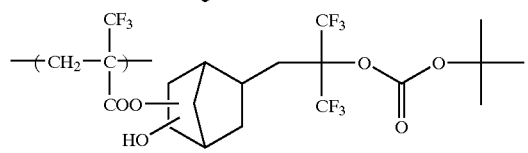

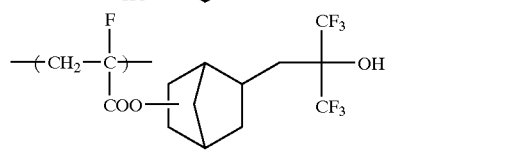

-continued

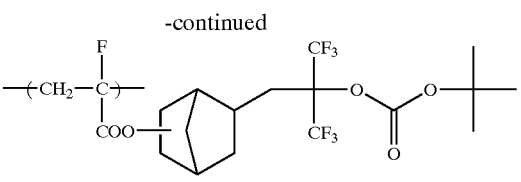

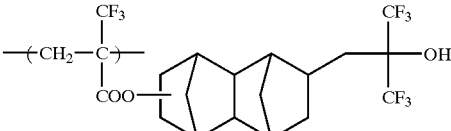

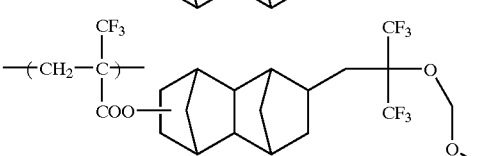

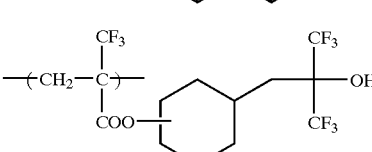

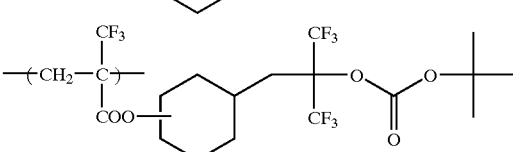

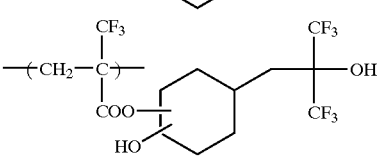

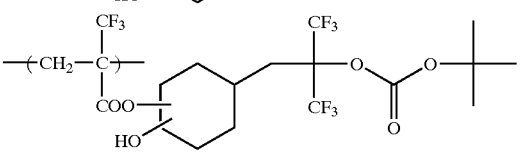

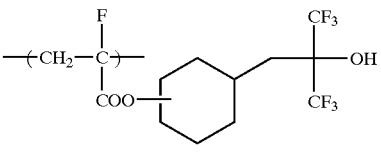

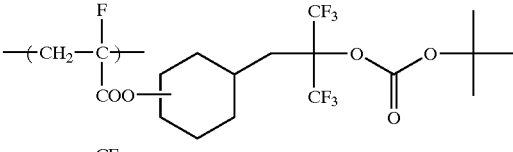

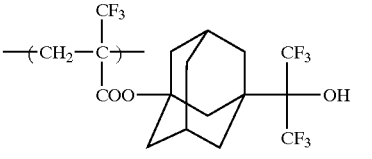

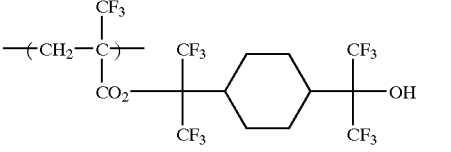

In the formula (IIIc), $R_{11}$ to $R_{16}$ each independently represents a hydrogen atom, a fluorine atom or a fluoroalkyl group, with the proviso that at least one of $R_{11}$ to $R_{16}$ is not a hydrogen atom. $X_3$ represents a hydrogen atom or a group which is capable of decomposing by the action of an acid. The suffix m represents 0 or 1.

$R_{11}$ to $R_{16}$ have the same meanings as $R_1$ to $R_6$ in the formula (AI).

The group $X_3$ which is capable of decomposing by the action of an acid has the same meaning as the group $X_1$ which is capable of decomposing by the action of an acid in the formula (AI).

Specific examples of the repeating unit represented by the formula (IIIc) will be given below, but the invention is not limited thereto.

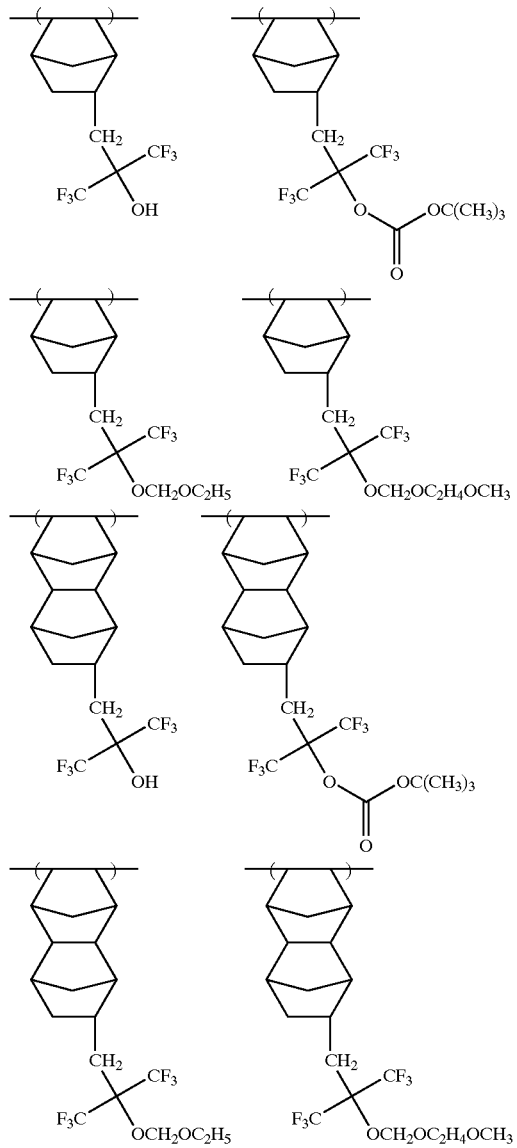

In the formula (IVc), $X_4$ represents a hydrogen atom or a group which is capable of decomposing by the action of an acid. The suffix m represents 0 or 1.

The group $X_4$ which is capable of decomposing by the action of an acid has the same meaning as the group $X_2$ which is capable of decomposing by the action of an acid in the formula (AII).

Specific examples of the repeating unit represented by the formula (IVc) will be given below, but the invention is not limited thereto.

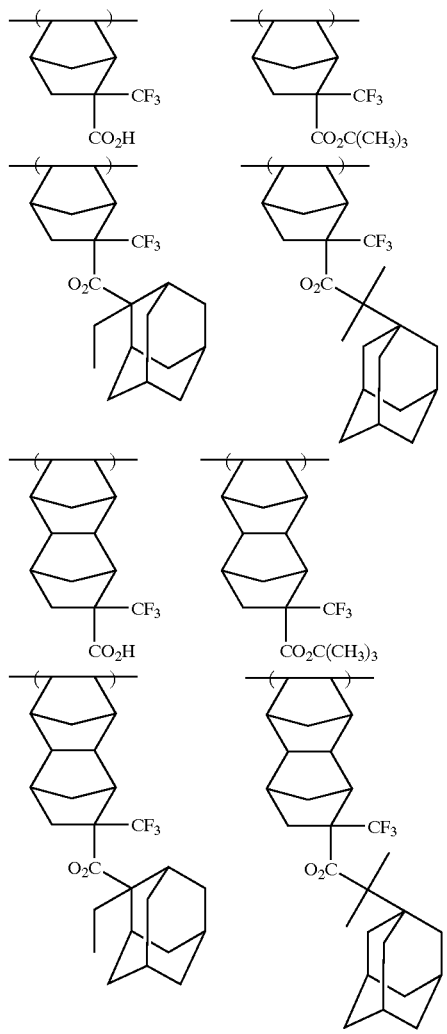

In the formula (Vc), Rd represents a hydrogen atom or a group which is capable of decomposing by the action of an acid.

The group Rd which is capable of decomposing by the action of an acid has the same meaning as the group $X_2$ which is capable of decomposing by the action of an acid in the formula (AII).

Specific examples of the repeating unit represented by the formula (Vc) will be given below, but the invention is not limited thereto.

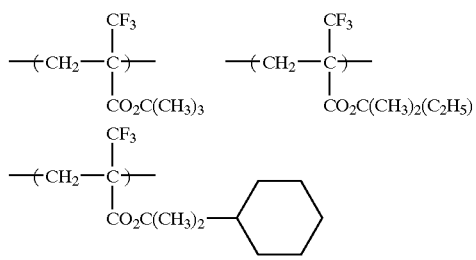

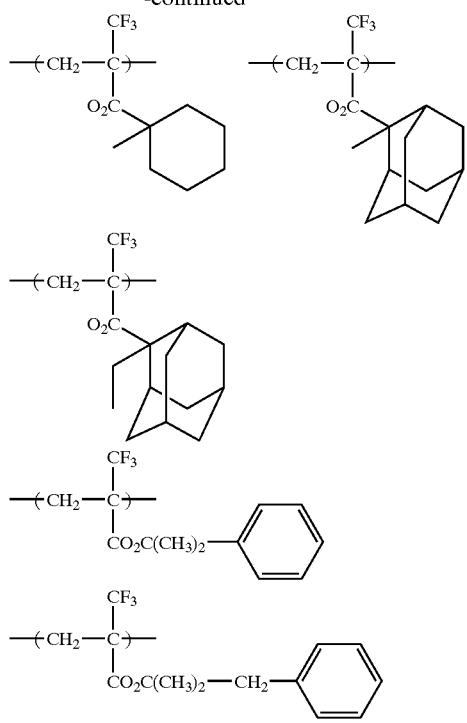

In the formula (VIc), $R_{1a}$ represents a hydrogen atom, a fluorine atom, a chlorine atom, a bromine atom, a cyano group or a trifluoromethyl group. $R_{41}$ to $R_{46}$ each independently represents a hydrogen atom, a fluorine atom or a fluoroalkyl group, with the proviso that at least one of $R_{41}$ to $R_{46}$ is not a hydrogen atom. $X_5$ represents a hydrogen atom or a group which is capable of decomposing by the action of an acid. The suffix na represents an integer of from 1 to 5. When na is 2 or more, the two or more $R_{41}$'s to $R_{46}$'s and $X_5$'s may be the same or different.

$R_{41}$ to $R_{46}$ have the same meanings as $R_{41}$ to $R_{46}$ in the formula (AI).

The group $X_5$ which is capable of decomposing by the action of an acid has the same meaning as the group $X_1$ which is capable of decomposing by the action of an acid in the formula (AI).

Specific examples of the repeating unit represented by the formula (VIc) will be given below, but the invention is not limited thereto.

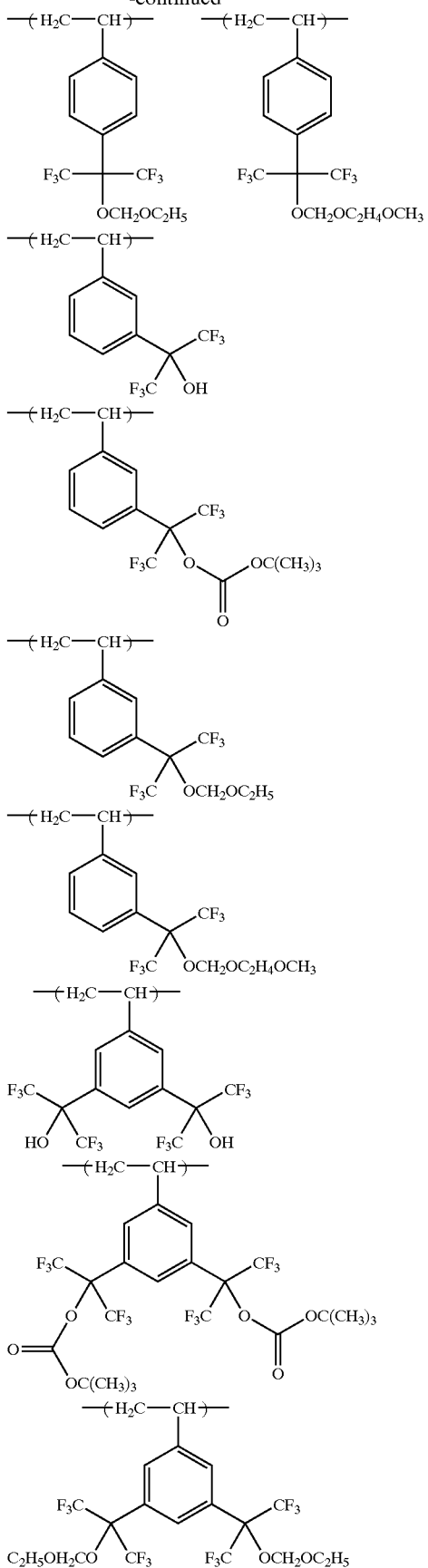

-continued

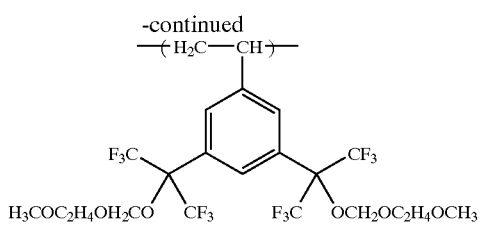

In the formula (VIIc), Ra and Rb each independently represents a hydrogen atom, a fluorine atom or a fluoroalkyl group. Rf represents a fluorine atom or a trifluoromethyl group. AR represents an alicyclic hydrocarbon structure. The suffix nc represents an integer of from 1 to 5.

Ra and Rb have the same meanings as Ra and Rb in the formula (Ic).

AR has the same meaning as AR in the formula (Ic).

Specific examples of the repeating unit represented by the formula (VIIc) will be given below, but the invention is not limited thereto.

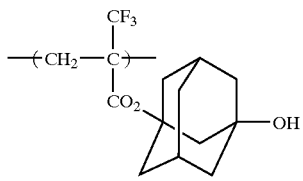

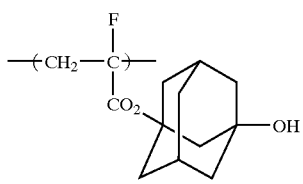

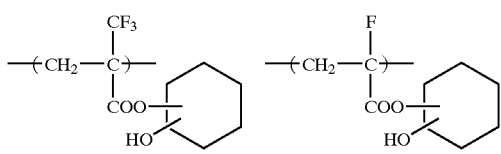

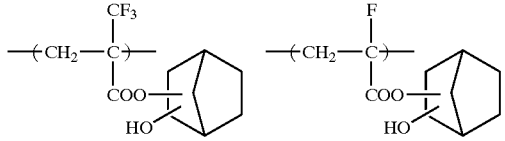

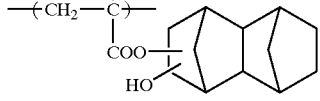

In the formula (VIIIc), Ra', Rb', Rc' and Rd' each independently represents a hydrogen atom, a fluorine atom or a fluoroalkyl group, with the proviso that at least one of Ra', Rb', Rc' and Rd' is not a hydrogen atom.

Examples of the fluoroalkyl groups represented by Ra', Rb', Rc' and Rd' include those represented by $R_1$ to $R_6$ in the formula (AI).

Ra', Rb', Rc' and Rd' each are preferably a fluorine atom or a fluoroalkyl group, more preferably a fluorine atom or a trifluoromethyl group.

Specific examples of the repeating unit represented by the formula (VIIIc) will be given below, but the invention is not limited thereto.

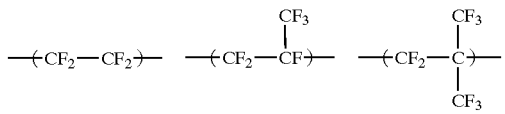

The resin (A4) may be polymerized with other polymerizable monomers besides the aforementioned repeating units.

Examples of the copolymerizable monomer to be used in combination with the resin (A4) include acrylic acid esters, acrylamides, methacrylic acid esters, methacrylamides, allyl compounds, vinyl ethers, vinyl esters, styrenes, crotonic acid esters, itaconic acid dialkyls, maleic acid dialkylesters, fumaric acid dialkylesters, maleic anhydride, maleimides, acrylonitrile, methacrylonitrile, and maleilonitrile. Further, any copolymerizable addition-polymerizable unsaturated compounds may be used.

Specific examples of the resin (A4) will be given below, the invention is not limited thereto.

(R1)

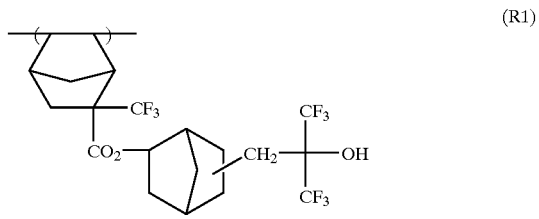

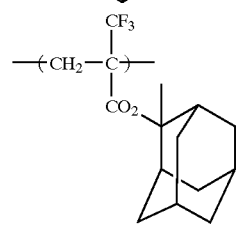

(R2)

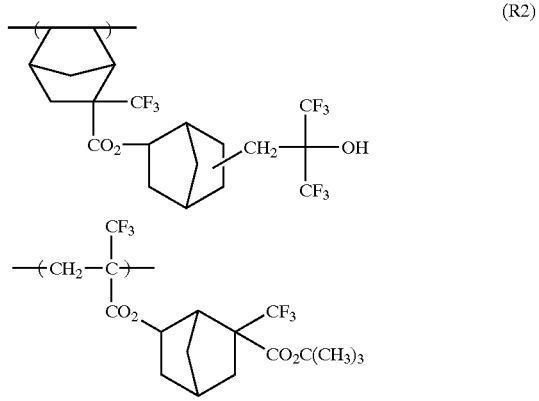

(R3)
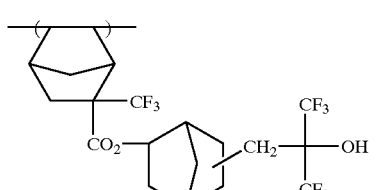
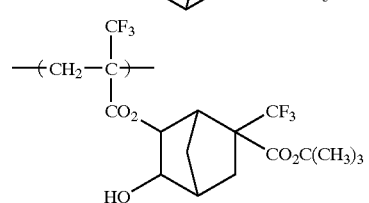
(R4)
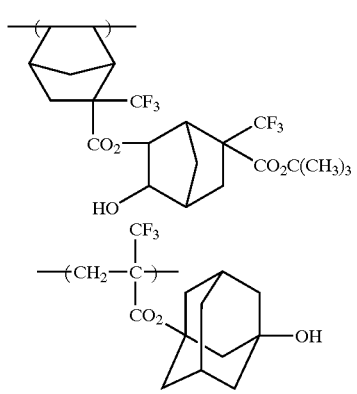
(R5)
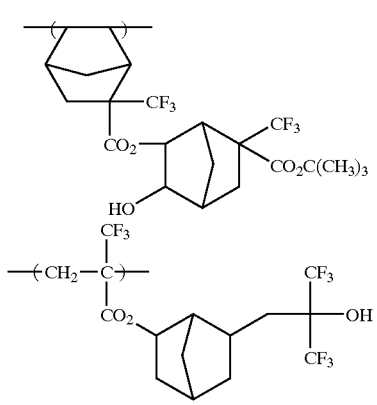
(R6)
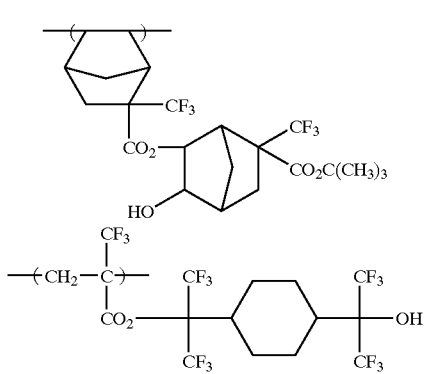
(R7)
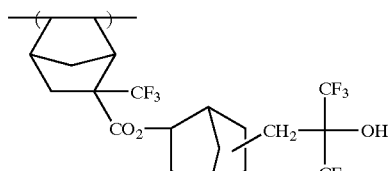
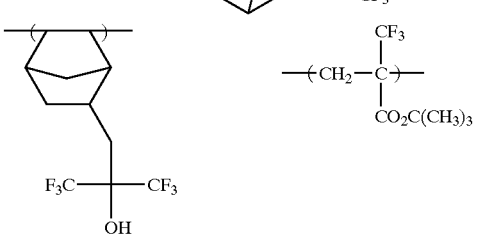
(R8)
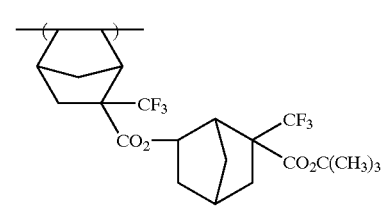
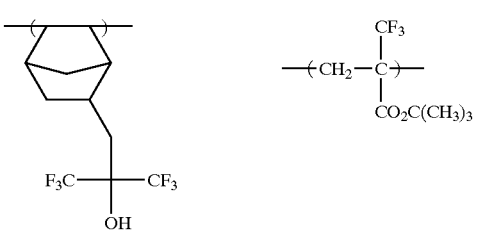
(R9)
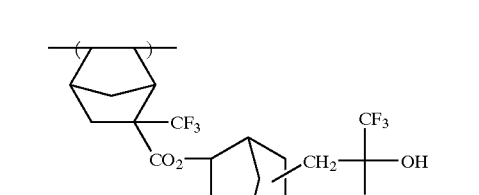
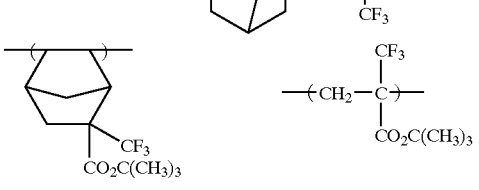
(R10)
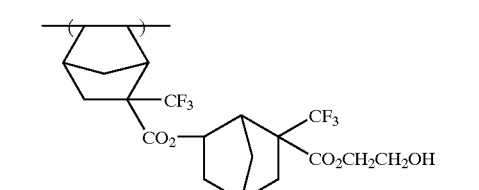
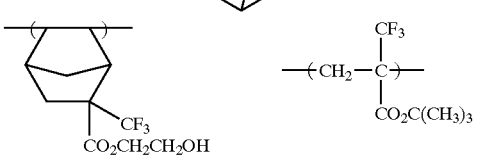

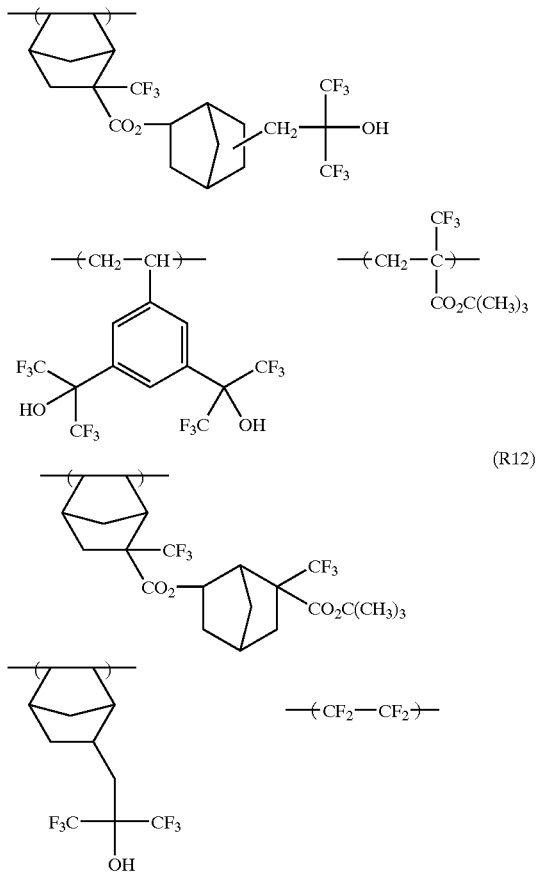

In the resin (A4), the total content of the repeating unit represented by the formula (AI) or (AII) is preferably from 10 to 60 mol %, more preferably from 20 to 50 mol % based on the total content of repeating units.

In the resin (A4), the total content of the repeating unit represented by any of the formulae (Ic) to (VIIIc) is preferably from 10 to 90 mol %, more preferably from 20 to 70 mol % based on the total content of repeating units.

The resin (A4) increases in its solubility in an alkaline developer when the acid-decomposable group is acted on by an acid to decompose and produce a hydrophilic group such as hydroxyl group and carboxyl group.

The content of the repeating unit having a group which decomposes when acted on by an acid in the resin (A4) is preferably from 15 to 50 mol %, more preferably from 20 to 40 mol %.

The molecular weight of the resin (A4) is preferably from 2,000 to 50,000, more preferably from 3,000 to 30,000 as calculated in terms of weight-average molecular weight. When the molecular weight of the resin (A4) is too low, the resulting resist exhibits a deteriorated heat resistance. On the contrary, when the molecular weight of the resin (A4) is too high, the resulting resist exhibits a deteriorated solubility in the developer and hence a deteriorated sensitivity and resolving power.

The molecular weight dispersion degree (Mw/Mn) of the resin (A) is preferably from 1.0 to 3.0, more preferably from 1.1 to 2.0, particularly, from 1.1 to 1.5. Examples of the method for reducing the molecular weight dispersion degree include a method which comprises dissolving a polymer obtained by an ordinary radical polymerization method in a good solvent, and then adding a poor solvent to the solution to remove components having a low molecular weight, and a living polymerization method such as living radical polymerization method. All these methods may be used to advantage.

As the living radical polymerization method there may be used any of Georges' method involving the use of nitroxide and Sawamoto and Machavski's method involving the use of metal complex.

From the standpoint of elimination of roughness of pattern, as the aforementioned ordinary radical polymerization method there is preferably used the dropping polymerization method (method which comprises further adding a monomer continuously or intermittently during the radical polymerization of the monomer in the presence of a radical polymerization initiator).

In the dropping polymerization method, the kind and composition of the monomer to be initially charged in the reaction vessel may be the same as or different from that of the monomer to be added during the progress of radical polymerization.

Further, a method which comprises additionally adding the polymerization initiator together with the monomer to be subsequently added can be employed to reduce the amount of the monomer left unreacted to advantage.

The amount of the resin (A4) to be added is normally from 50% to 99.5% by weight, preferably from 80% to 99% by weight, particularly from 90% to 98% by weight based on the total solid content in the composition.

[5] (B) A Compound Capable of Generating an Acid Upon Irradiation with One of Actinic Rays and Radiation:

The positive-working resist composition of the invention comprises a compound capable of generating an acid upon irradiation with one of actinic rays and radiation, particularly $F_2$ excima laser beam.

The compound capable of generating an acid upon irradiation with one of actinic rays and radiation may be selected from compounds that are normally used as compounds (acid generators) which is capable of generating an acid upon irradiation with one of actinic rays and radiation.

In other words, the compound of the invention may be selected from the group consisting of photocationic polymerization initiator, photoradical polymerization initiator, optical decolorizer such as dye, optical discoloring agent, compounds which produce an acid when irradiated with known light for use in microresist (ultraviolet rays having a wavelength of from 200 to 400 nm, far ultraviolet rays, particularly g-ray, h-ray, i-ray, KrF excima laser beam), ArF excima laser beam, $F_2$ excima laser beam, electron ray, X-ray, molecular beam or ionic beam, and mixture thereof.

Examples of such a compound include diazonium salts as disclosed in S. I. Schlesinger, "Photogr. Sci. Eng.,", 18, 387 (1974) and T. S. Bal et al, "Polymer", 21, 423 (1980), ammonium salts as disclosed in U.S. Pat. Nos. 4,069,055, 4,069,056 and Re 27,992, and JP-A-3-140140, phosphonium salts as disclosed in D. C. Necker et al, "Macromolecules", 17, 2468 (1984), C. S. Wen et al, "Teh, Proc. Conf. Rad. Curing", ASIA, page 478, Tokyo, October (1988), and U.S. Pat. Nos. 4,069,055 and 4,069,056, iodonium salts as disclosed in J. V. Crivello et al, "Macromorecules", 10 (6), 1307 (1977), Chem. & Eng. News, November 28, page 31 (1988), sulfonium salts as disclosed in J. V. Crivello et al, "Polymer J.", 17, 73 (1985), J. V. Crivello et al, "J. Org. Chem.", 43, 3055 (1978), W. R. Watt et al, "J. Polymer Sci.", Polymer Chem. Ed., 22, 1789 (1984), J. V. Crivello et al, "Polymer Bull.", 14, 279 (1985), J. V. Crivello et al, "Macromorecules", 14 (5), 1141 (1981), J. V. Crivello et al, "J. Polymer Sci.", Polymer Chem. Ed., 17, 2877 (1979), European Patents 370,693, 161,811, 410, 201, 339,049, 233,567, 297,443 and 297,442, U.S. Pat. Nos. 4,933,377, 3,902,114, 4,760,013, 4,734,444 and 2,833,827, and German Patents 2,904,626, 3,604,580 and 3,604,581, selenonium salts as disclosed in J. V. Crivello et al, "Macromorecules", 10 (6), 1307 (1977), and J. V. Crivello et al, "J. Polymer Sci.", Polymer Chem. Ed., 17, 1047 (1979), onium salts such as arsonium as disclosed in C. S. Wen et al, "Teh, Proc. Conf. Rad. Curing ASIA", page 478, Tokyo, October (1988), organic halogen compounds as disclosed in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metal/organic halogen compounds as disclosed in K. Meier et al, "J. Rad. Curing", 13 (4), 26 (1986), T. P. Gill et al, "Inorg. Chem.", 19, 3007 (1980), D. Astruc, "Acc. Chem. Res.", 19 (12), 377 (1896), and JP-A-2-161445, photo-acid generators having O-nitrobenzyl type protective group as disclosed in S. Hayase et al, "J. Polymer Sci.", 25, 753 (1987), E. Reichmanis et al, "J. Polymer Sci.", Polymer Chem. Ed., 23, 1 (1985), Q. Q. Zhetal, "J. Photochem.", 36, 85, 39, 317 (1987), B. Amit et al, "Tetrahedron Lett.", (24) 2205 (1973), D. H. R. Barton et al, "J. Chem. Soc.", 3571 (1965), P. M. Collins et al, "J. Chem. Soc.", Perkin I, 1695 (1975), M. Rudinstein et al, "Tetrahedron Lett.", (17), 1445 (1975), J. W. Walker et al, "J. Am. Chem. Soc.", 110, 7170 (1988), S. C. Busman et al, "J. Imaging Technol.", 11 (4), 191 (1985), H. M. Houlihan et al, "Macromolecules", 21, 2001 (1988), P. M. Collins et al, "J. Chem. Soc.", Chem. Commun., 532 (1972), S. Hayase et al, "Macromolecules", 18, 1799(1985), E. Reichmanis et al, "J. Electrochem. Soc.", Solid State Sci. Technol., 130 (6), F. M. Houlihan et al, "Macromolecules", 21, 2001 (1988), European Patents 0290,750, 046,083, 156,535, 271,851 and 0,388,343, U.S. Pat. Nos. 3,901,710 and 4,181,531, JP-A-60-198538, and JP-A-53-133022, compounds which undergo photodecomposition to produce a sulfonic acid such as iminosulfonate as disclosed in M. TUNOOKA et al, "Polymer Prepreprints", Japan, 35 (8), G. Berner et al, "J. Rad. Curing", 13 (4), W. J. Mijs et al, "Coating Technol.", 55 (697), 45 (1983), Akzo, H. Adachi et al, "Polymer Preprints", Japan, 37 (3), European Patents 0199,672, 84,515, 044,115, 618,564 and 0101, 122, U.S. Pat. Nos. 4,371,605 and 4,431,774, JP-A-2-245756, JP-A-2-245756 and JP-A-3-140109, and disulfone compounds as disclosed in JP-A-61-166544.

In the invention, as the compound capable of generating an acid upon irradiation with one of actinic rays and radiation there is preferably used a compound (B1) which is capable of generating an organic sulfonic acid by irradiation of actinic ray or radiation.

Examples of the compound (B1) which is capable of generating an organic sulfonic acid by irradiation of actinic ray or radiation include compound (B1a) which is capable of generating a fluorine-containing sulfonic acid by irradiation of actinic ray or radiation, and compound (B1b) which is capable of generating a fluorine-free sulfonic acid by irradiation of actinic ray or radiation.

In the invention, a compound (B2) which is capable of generating a carboxylioc acid by irradiation of actinic ray or radiatio is preferably used in combination with the compound (B1) which is capable of generating an organic sulfonic acid by irradiation of actinic ray or radiation.

Examples of the compound (B2) which is capable of generating a carboxylioc acid by irradiation of actinic ray or radiation include compound (B2a) which is capable of generating a fluorine-containing carboxylic acid by irradiation of actinic ray or radiation, and compound (B2b) which is capable of generating a fluorine-free carboxylic acid by irradiation of actinic ray or radiation.

(B1a) Compound which is capable of generating a fluorine-containing sulfonic acid by irradiation of actinic ray or radiation.

Examples of the compound which produces a fluorine-containing sulfonic acid when irradiated with an actinic ray or radiation include iodonium salts represented by the following formula (PAG3), and sulfonium salts represented by the following formula (PAG4).

In these formulae, $Ar^1$ and $Ar^2$ each independently represents a substituted or unsubstituted aryl group. $R^{203}$, $R^{204}$ and $R^{205}$ each independently represents a substituted or unsubstituted alkyl or aryl group.

$Z^-$ represents a sulfonate anion having at least one fluorine atom.

Two of $R^{203}$, $R^{204}$ and $R^{205}$ and $Ar^1$ and $Ar^2$ may be bonded to each other with the respective single bond or substituent.

The aryl groups represented by $Ar^1$, $Ar^2$, $R^{203}$, $R^{204}$ and $R^{205}$ each are preferably a $C_6$–$C_{15}$ aryl group. The alkyl groups represented by $Ar^1$, $Ar^2$, $R^{203}$, $R^{204}$ and $R^{205}$ each are preferably a $C_1$–$C_8$ alkyl group.

Preferred examples of the substituents on the aryl group include $C_1$–$C_8$ alkoxy group, $C_1$–$C_8$ alkyl group, $C_2$–$C_9$ alkoxycarbonyl group, $C_2$–$C_9$ alkylcarbonylamino group, nitro group, carboxyl group, hydroxy group, halogen atom, and phenylthio group. Preferred examples of the substituents on the alkyl group include $C_1$–$C_8$ alkoxy group, $C_5$–$C_{14}$ aryl group, $C_6$–$C_{15}$ arylcarbonyl group, carboxyl group, and halogen atom.

Preferred examples of the sulfonate anion represented by $Z^-$ include $C_1$–$C_{20}$ aliphatic hydrocarbon group having at least one fluorine atom, and $C_5$–$C_{20}$ aromatic hydrocarbon group having at least one fluorine atom. These groups may have substituents. Examples of the substituents include $C_1$–$C_{10}$ alkoxy group which may be substituted by fluorine, $C_2$–$C_{11}$ alkoxycarbonyl, phenylamino and phenylcarbonyl groups which may be substituted by fluorine, halogen atom, and hydroxyl group. Further examples of the aromatic hydrocarbon group include $C_1$–$C_{15}$ alkyl group.

The aliphatic sulfonate anion, particularly anion having a fluorine atom on α carbon atom in sulfonic acid, has a high acid strength and thus tends to undergo ready salt exchange with an anion free of fluorine atom. A perfluoroaliphatic sulfonic acid has a higher acid strength.

Specific examples of the sulfonate anion will be given below, but the invention is not limited thereto.

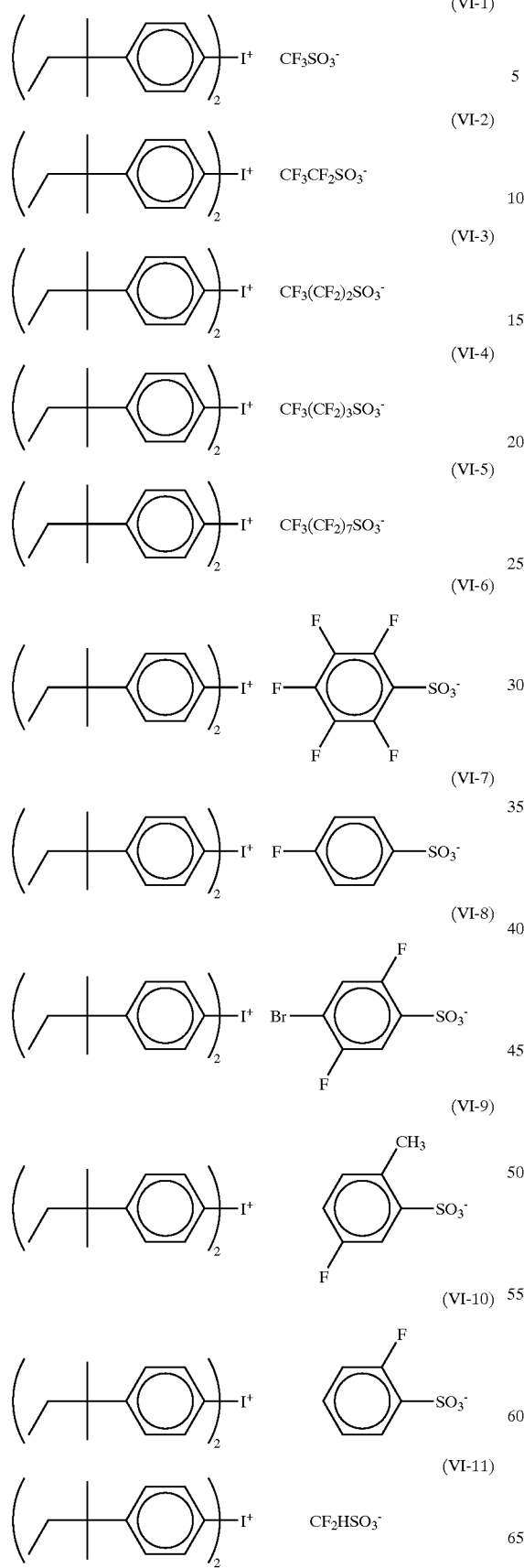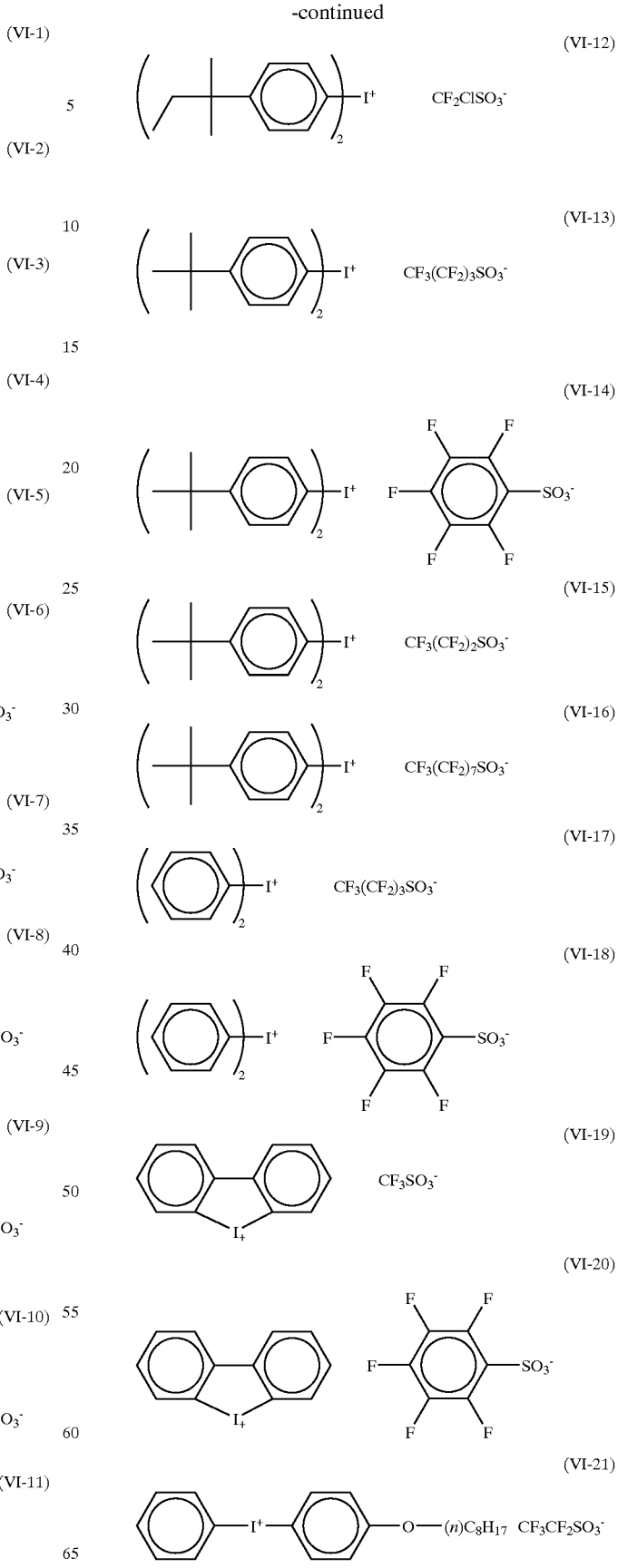

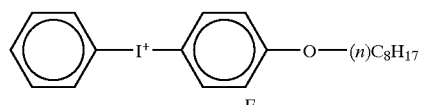 (VI-22)
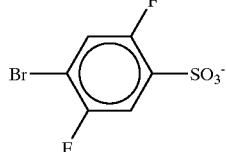
 (VI-23)
 (VI-24)
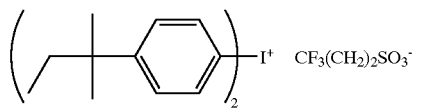 (VI-25)
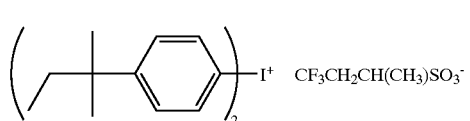 (VI-26)
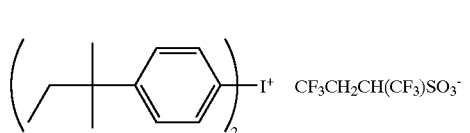 (VI-27)
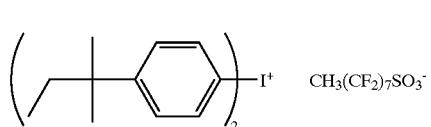 (VI-28)
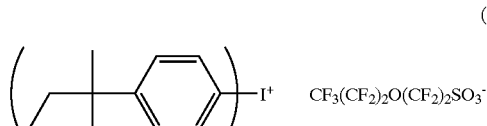 (VI-29)
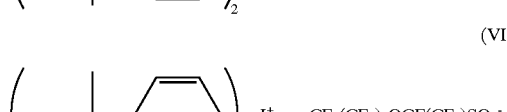 (VI-30)
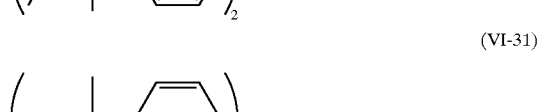 (VI-31)
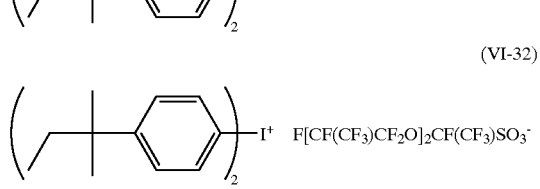 (VI-32)
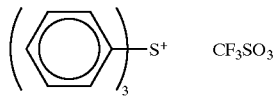 (VII-1)
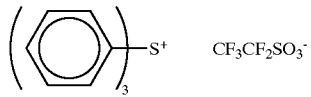 (VII-2)
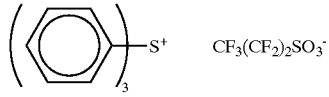 (VII-3)
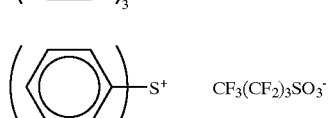 (VII-4)
 (VII-5)
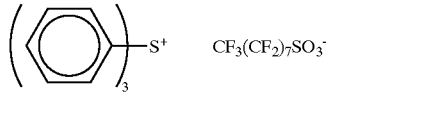 (VII-6)
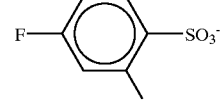 (VII-7)
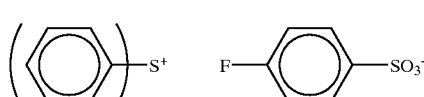 (VII-8)
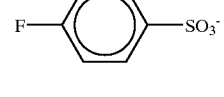 
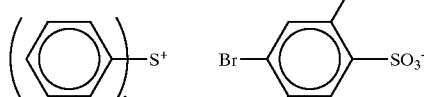 (VII-9)
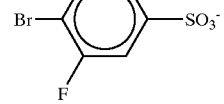 
 (VII-10)
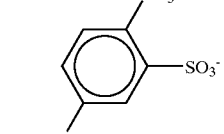 
 (VII-11)
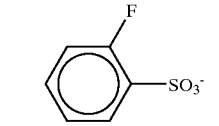 
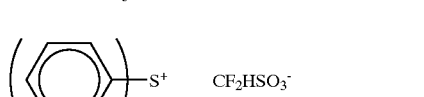 (VII-12)
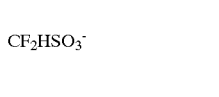

-continued
(VII-13) 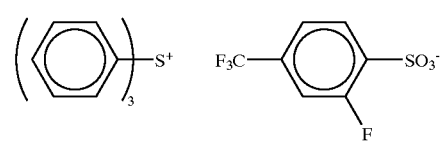
(VII-14) 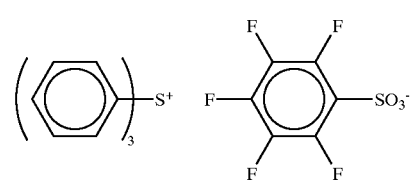
(VII-15) 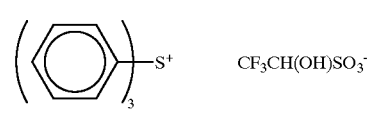
(VII-16) 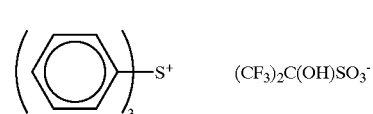
(VII-17) 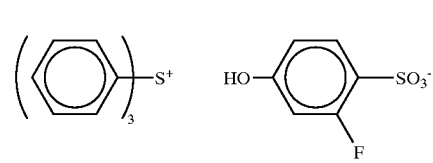
(VII-18) 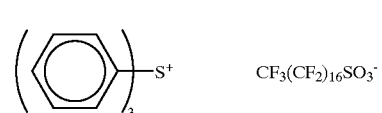
(VII-19) 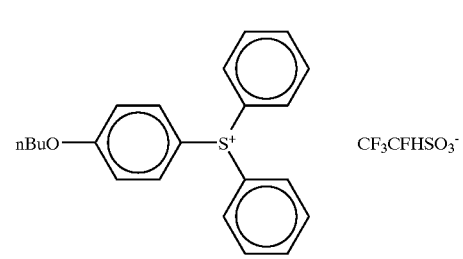
(VII-20) 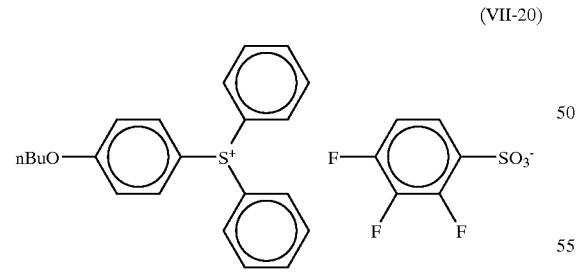
(VII-21) 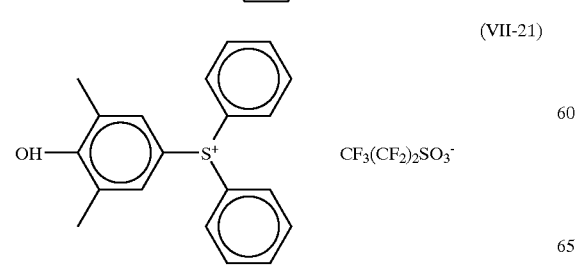
-continued
(VII-22) 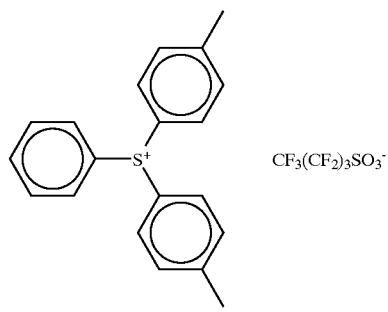
(VII-23) 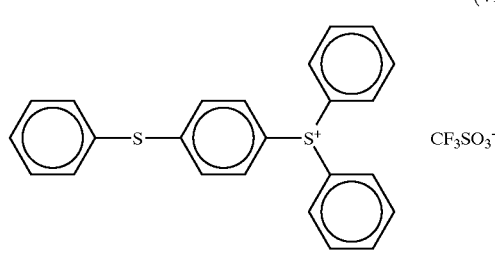
(VII-24) 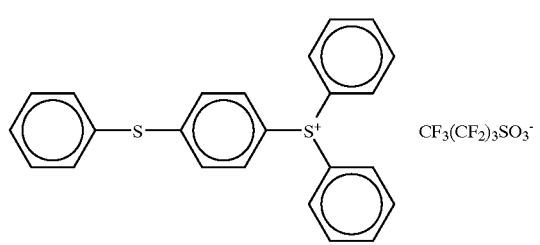
(VII-25) 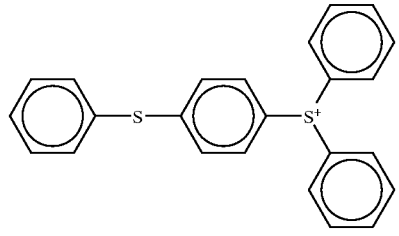
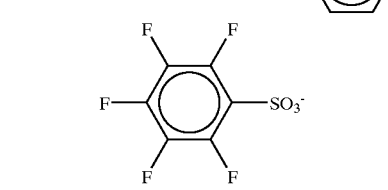
(VII-26) 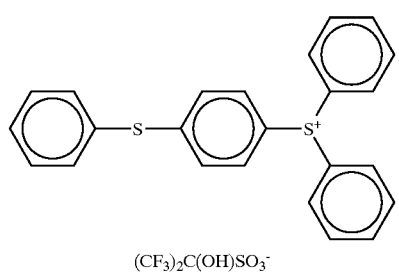

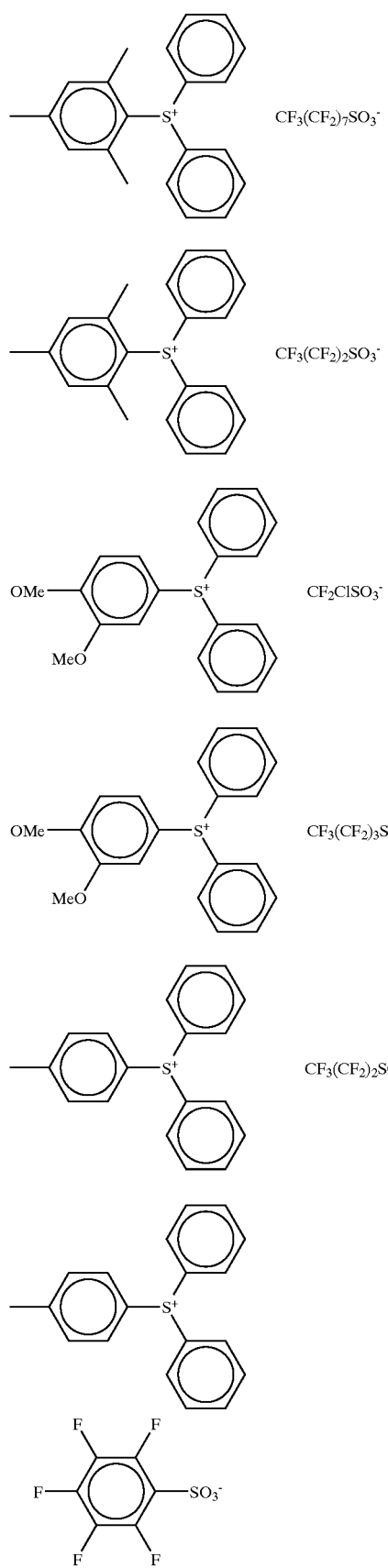
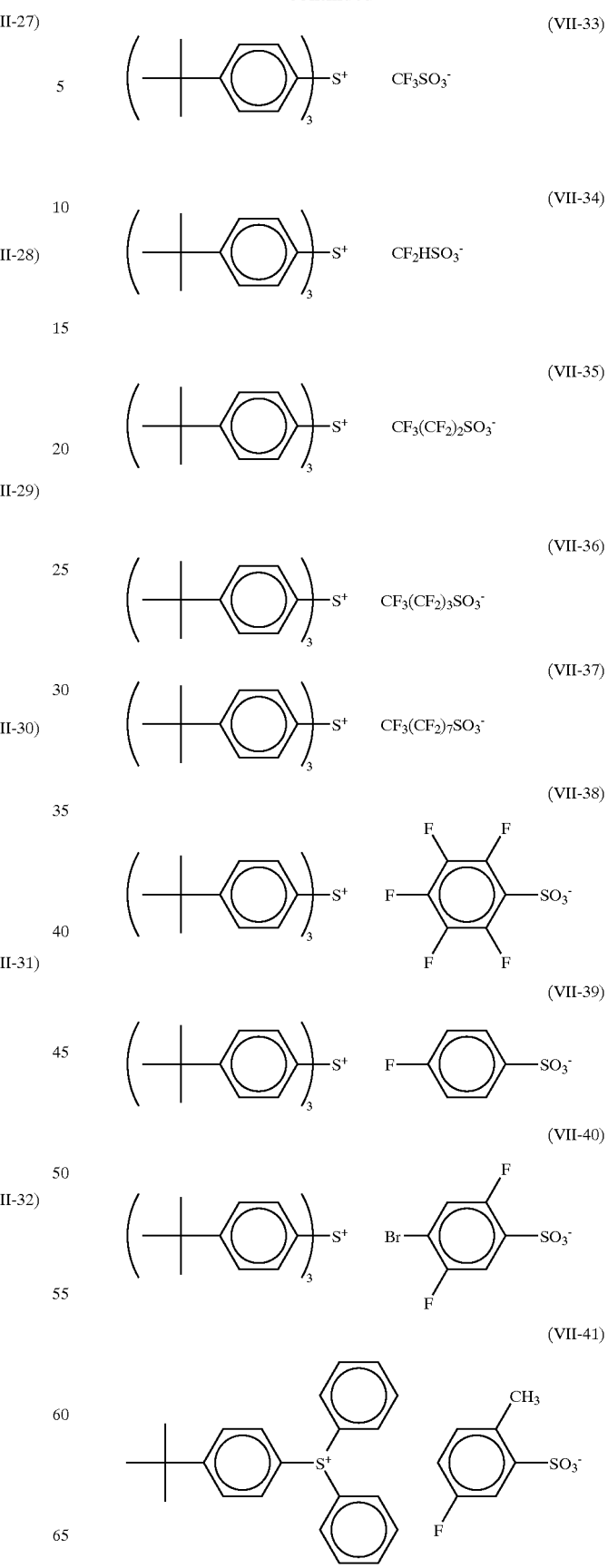

(VII-42)
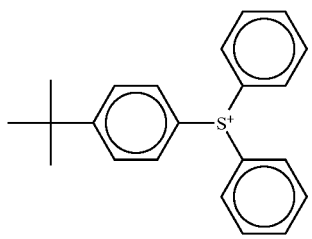 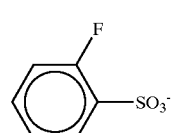
(VII-43)
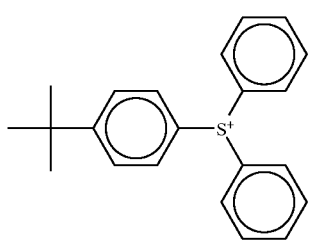 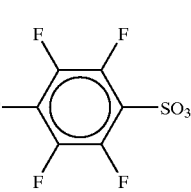
(VII-44)
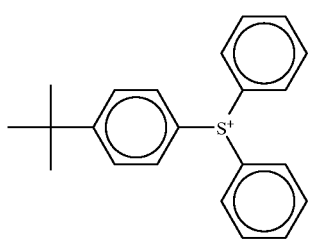 CF₂ClSO₃⁻
(VII-45)
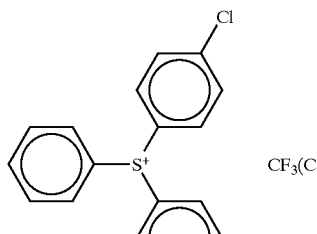 CF₃(CF₂)₃SO₃⁻
(VII-46)
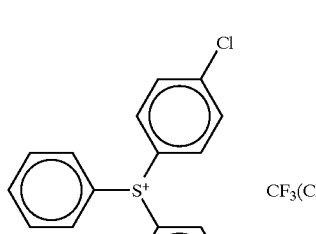 CF₃(CF₂)₇SO₃⁻
(VII-47)
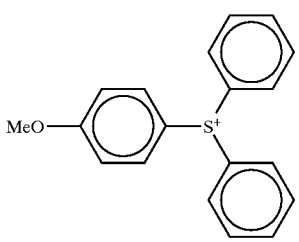 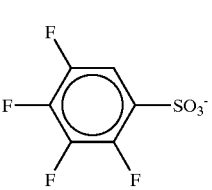
(VII-48)
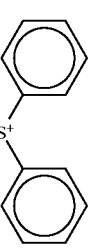 CF₃(CF₂)₂SO₃⁻
(VII-49)
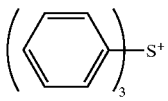 CF₃(CH₂)₂SO₃⁻
(VII-50)
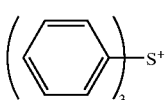 CF₃CH₂CH(CH₃)SO₃⁻
(VII-51)
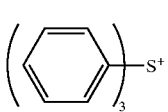 CF₃CH₂CH(CF₃)SO₃⁻
(VII-52)
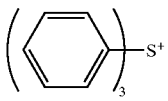 CH₃(CF₂)₇SO₃⁻
(VII-53)
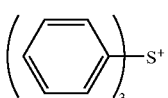 CF₃(CF₂)₂O(CF₂)₂SO₃⁻
(VII-54)
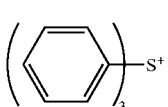 CF₃(CF₂)₂OCF(CF₃)SO₃⁻
(VII-55)
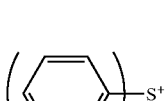 F[CF(CH₃)CF₂O]₂CF(CF₃)SO₃⁻
(VII-56)
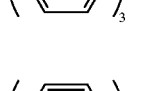 F[CF(CF₃)CF₂O]₂CF(CF₃)SO₃⁻

(B1b) Compound Which is Capable of Generating a Fluorine-Free Sulfonic Acid by Irradiation of Actinic Ray or Radiation Examples of the compound which produces a fluorine-free sulfonic acid when irradiated with an actinic ray or radiation include iodonium salts and sulfonium salts represented by the formulae (PAG3) and (PAG4) wherein $Z^-$ is a sulfonate anion free of fluorine atom.

Specific examples of these compounds will be given below, but the invention is not limited thereto.

(PAG3-1)
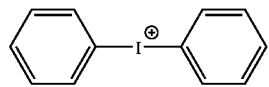

(PAG3-2)
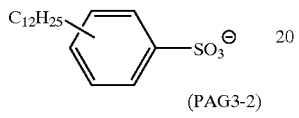

(PAG3-5)
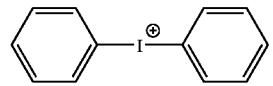

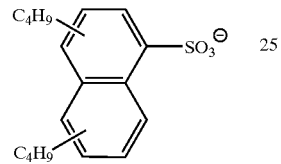

(PAG3-7)
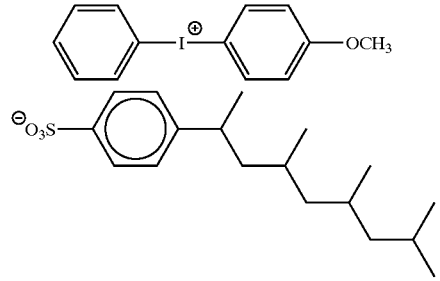

(PAG3-9)
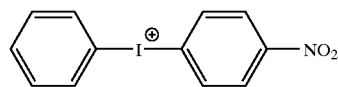

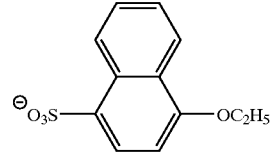

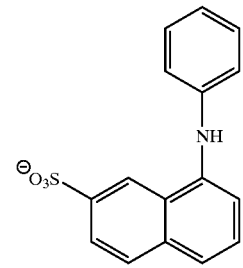

(PAG3-10)
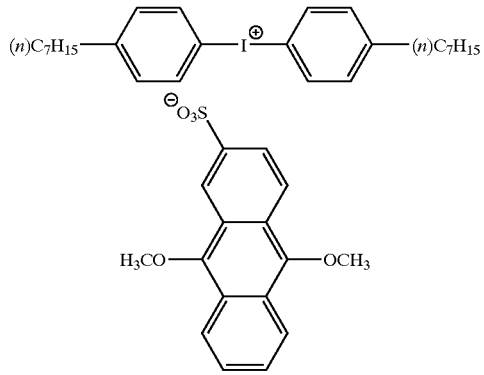

(PAG3-11)
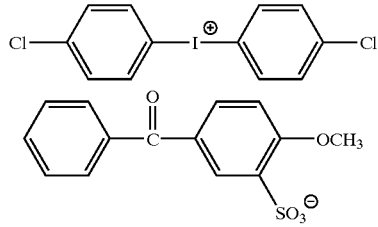

(PAG3-13)
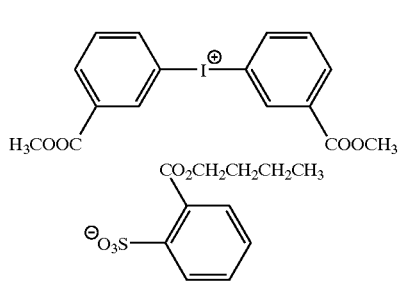

(PAG3-14)
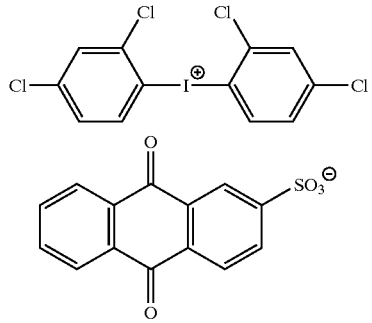

(PAG3-15)
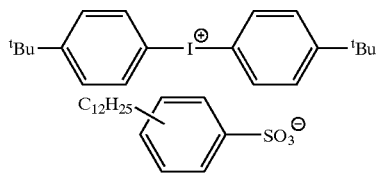

(PAG3-16)
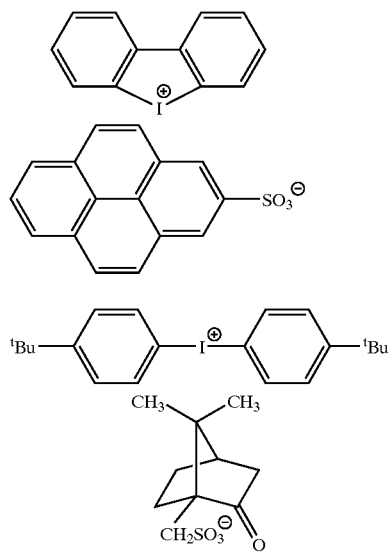
(PAG3-18)
(PAG3-19)
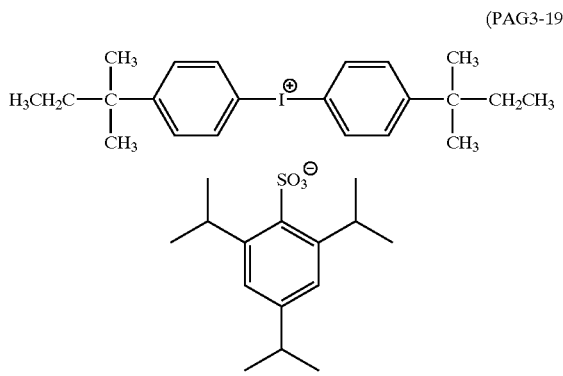
(PAG3-24)
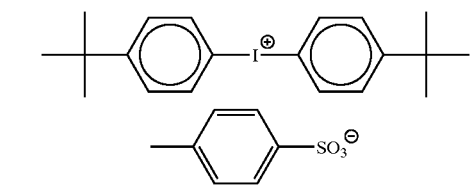
(PAG3-25)
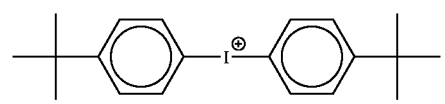
(PAG3-26)
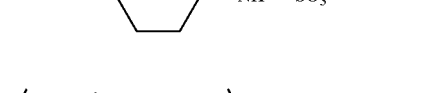 CH₃(CH₂)₅SO₃⁻
(PAG3-27)
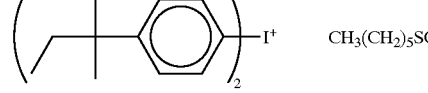 CH₃(CH₂)₇SO₃⁻
(PAG3-28)
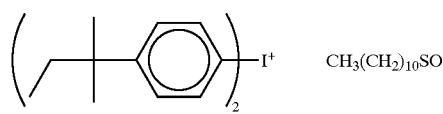 CH₃(CH₂)₁₀SO₃⁻
(PAG3-29)
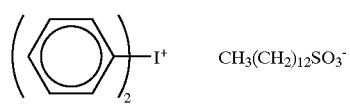 CH₃(CH₂)₁₂SO₃⁻
(PAG3-30)
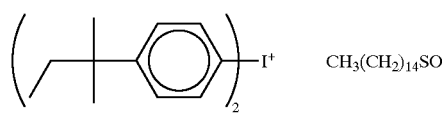 CH₃(CH₂)₁₄SO₃⁻
(PAG3-31)
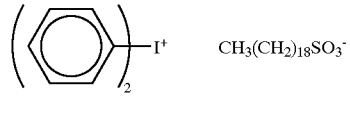 CH₃(CH₂)₁₈SO₃⁻
(PAG4-1)
(PAG4-2)
(PAG4-4)
(PAG4-12)
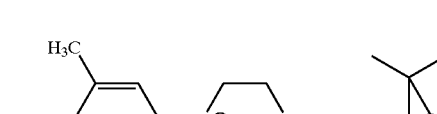
(PAG4-16)

(PAG4-20)
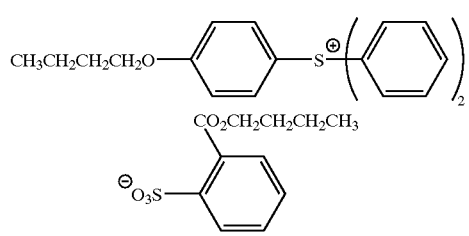
(PAG4-22)
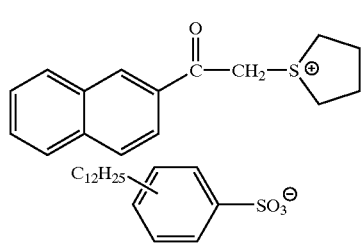
(PAG4-24)
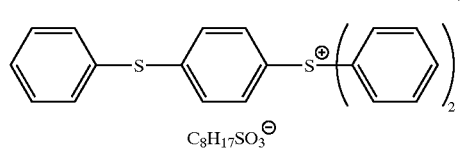
(PAG4-25)
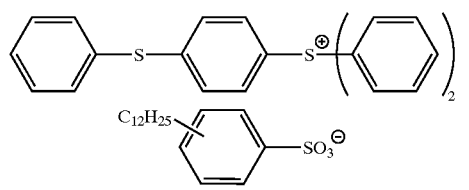
(PAG4-27)
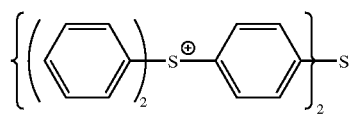
(PAG4-28)
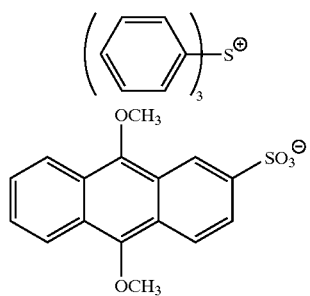
(PAG4-30)
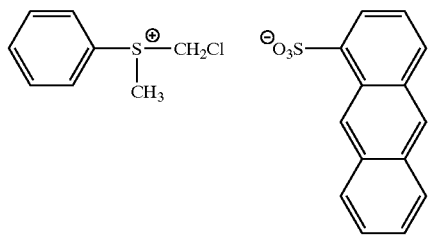
(PAG4-32)
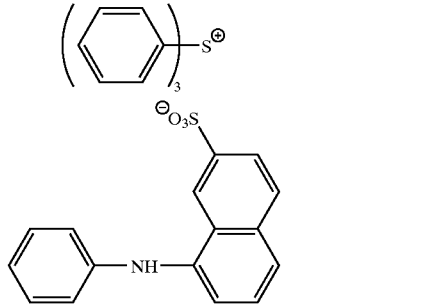
(PAG4-33)
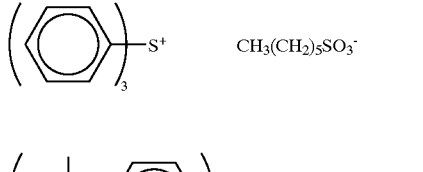
(PAG4-34)
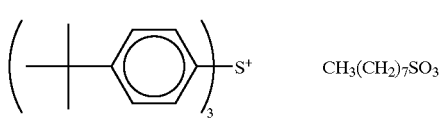
(PAG4-35)
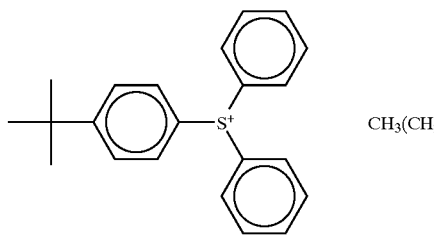
(PAG4-36)
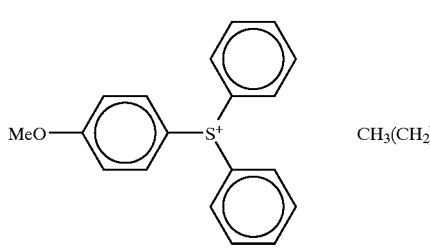
(PAG4-37)
(PAG4-38)
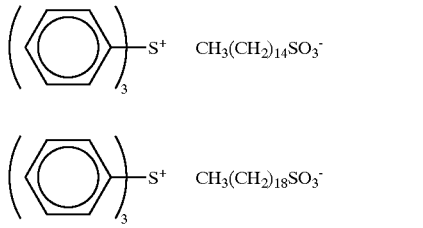

(PAG4-39)

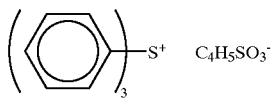

Further examples of the compound which produces a fluorine-free sulfonic acid when irradiated with an actinic ray or radiation include disulfone derivatives represented by the following formula (PAG5), and iminosulfonate derivatives represented by the following formula (PAG6).

(PAG5)

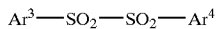

(PAG6)

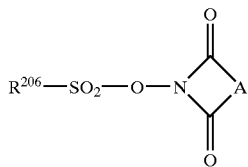

In these formulae, $Ar^3$ and $Ar^4$ each independently represent a substituted or unsubstituted aryl group. $R^{206}$ represents a substituted or unsubstituted alkyl or aryl group. A represents a substituted or unsubstituted alkylene, alkenylene or arylene group.

Specific examples of these groups will be given below, but the invention is not limited thereto.

(PAG5-1)

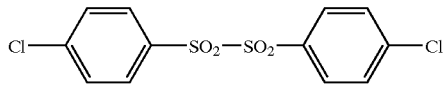

(PAG5-2)

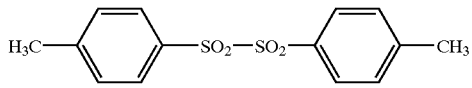

(PAG5-3)

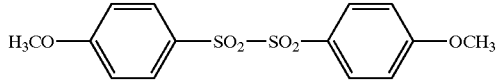

(PAG5-4)

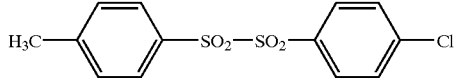

(PAG5-6)

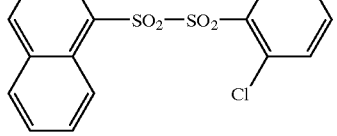

(PAG5-7)

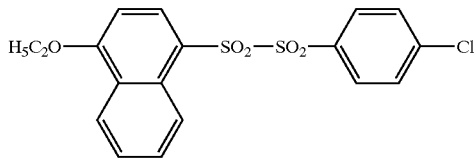

(PAG5-8)

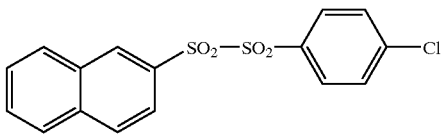

(PAG5-9)

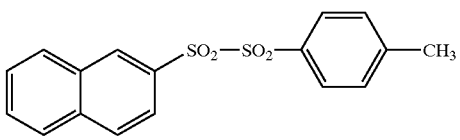

(PAG5-10)

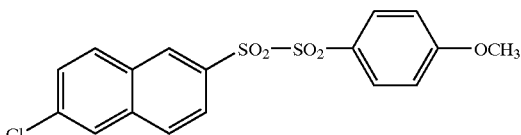

(PAG5-11)

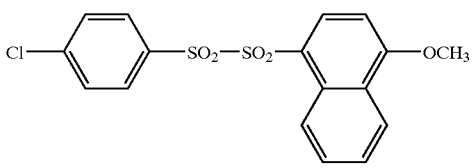

(PAG5-12)

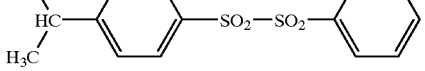

(PAG5-14)

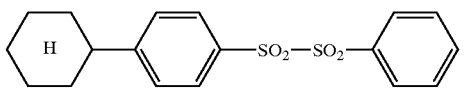

(PAG5-15)

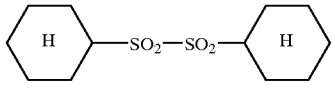

(PAG6-1)

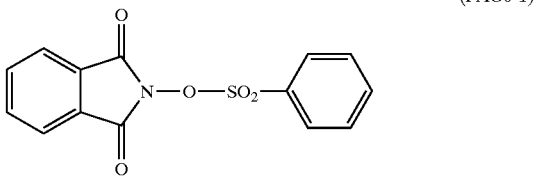

(PAG6-2)

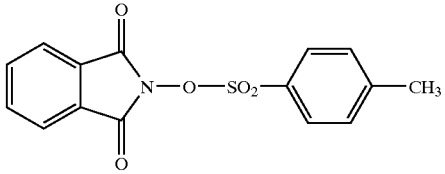

(PAG6-3)

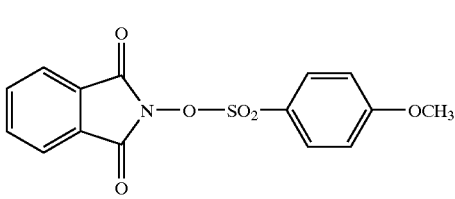

(PAG6-5) 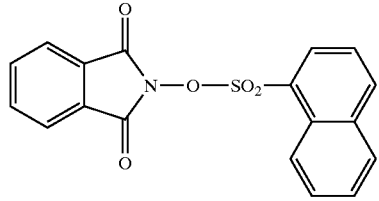

(PAG6-6) 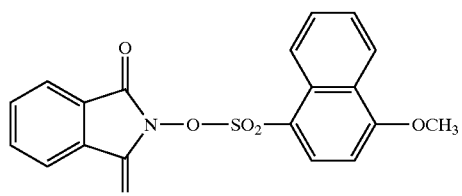

(PAG6-7) 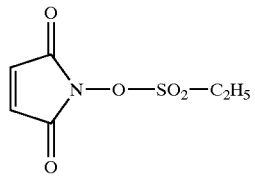

(PAG6-8) 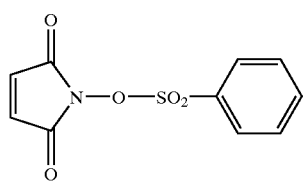

(PAG6-9) 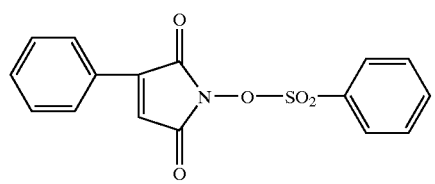

(PAG6-10) 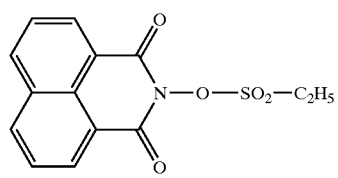

(PAG6-11) 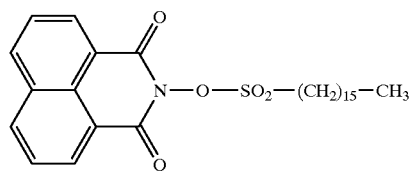

(PAG6-12) 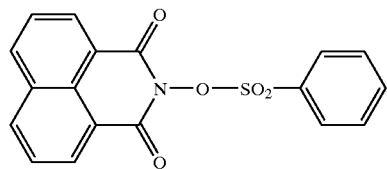

(PAG6-17) 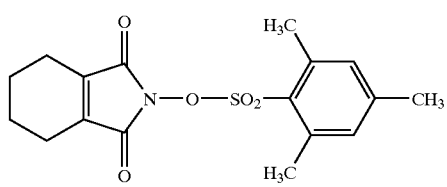

(PAG6-20) 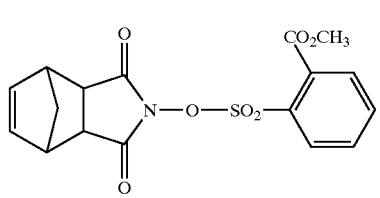

(PAG6-22) 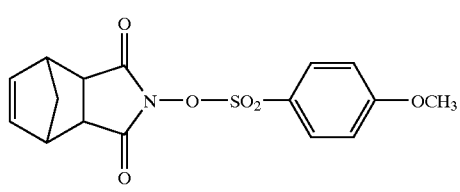

Further examples of the compound which produces a fluorine-free sulfonic acid when irradiated with an actinic ray or radiation include diazodisulfone derivatives represented by the following formula (PAG7).

(PAG7) 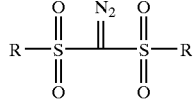

In the formula (PAG7), R represents a straight-chain, branched or cyclic alkyl group or an aryl group, which may be substituted.

Specific examples of the diazodisulfone derivatives represented by the following formula (PAG7) will be given below, but the invention is not limited thereto.

(PAG7-1) 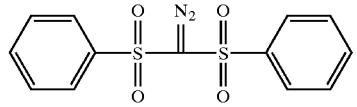

(PAG7-2) 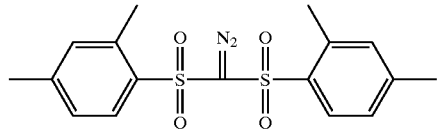

(PAG7-3) 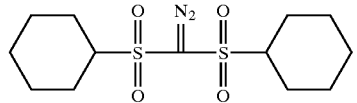

(PAG7-4) 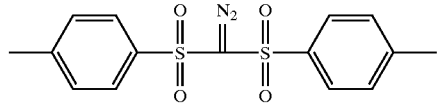

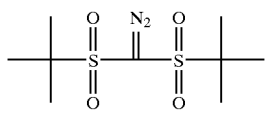
(PAG7-5)

The aforementioned compounds (B1a) and (B1b) can be synthesized by reacting a periodate with an aromatic compound, and then subjecting the resulting iodonium salt to salt exchange to a corresponding sulfonic acid.

The compounds (B1a) and (B1b) can be synthesized also by a method which comprises reacting an aryl Grignard reagent such as aryl magnesium bromide with a substituted or unsubstituted phenyl sulfoxide, and then subjecting the resulting triarylsulfonium halide to salt exchange with a corresponding sulfonic acid. Alternatively, these compounds can be synthesized by a method which comprises subjecting a substituted or unsubstituted phenyl sulfoxide and a corresponding aromatic compound to condensation and salt exchange in the presence of an acid catalyst such as methanesulfonic acid/diphosphorus pentaoxide and aluminum chloride or a method which comprises subjecting a diaryliodonium salt and diaryl sulfide to condensation and salt exchange in the presence of a catalyst such as copper acetate.

The salt exchange can be carried out also by a method which comprises converting the starting material to a halide, and then converting the halide to a sulfonate in the presence of a silver reagent such as silver oxide or a method involving the use of an ion exchange resin. As the sulfonic acid or sulfonate to be used in the salt exchange there may be used a commercially available product or may be obtained by the hydrolysis of a commercially available sulfonic acid halide.

(B2a) Compound Which is Capable of Generating a Fluorine-Containing Carboxylic Acid by Irradiation of Actinic Ray or Radiation Examples of the fluorine-containing carboxylic acid include fluorine-substituted aliphatic carboxylic acid, and fluorine-substituted aromatic carboxylic acid.

Examples of the fluorine-substituted aliphatic carboxylic acid include fluorine-substituted products of aliphatic carboxylic acids such as acetic acid, propionic acid, n-butyric acid, isobutyric acid, valerianic acid, trimethylacetic acid, caproic acid, heptoic acid, caprylic acid, pelargonic acid, capric acid, lauric acid, myristic acid, palmitic acid, stearic acid, undecanoic acid, dodecanoic acid and tridecanoic acid. These fluorine-substituted aliphatic carboxylic acids may have a hydroxyl group, alkoxy group or halogen atom as substituent. Preferred among these fluorine-substituted aliphatic carboxylic acids are those containing a connecting group such as oxygen atom, sulfur atom, carbonyl group, carboxyl group and sulfonyl group in its aliphatic chain.

A preferred example of the fluorine-substituted aliphatic carboxylic acid is one represented by the following formula:

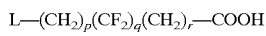

In the aforementioned formula, L represents a hydrogen atom or fluorine atom. The suffixes p and r each independently represent an integer of from 0 to 15, and the suffix q represents an integer of from 1 to 15. The hydrogen atom or fluorine atom in the alkyl chain in the aforementioned formula may be substituted by an alkyl group (preferably having from 1 to 5 carbon atoms) which may be substituted, alkoxy group (preferably having from 1 to 5 carbon atoms) which may be substituted or hydroxyl group.

The aforementioned fluorine-substituted aliphatic carboxylic acid is preferably a fluorine-substituted product of a saturated aliphatic carboxylic acid preferably having from 2 to 20 carbon atoms, more preferably from 4 to 20 carbon atoms. By predetermining the number of carbon atoms contained in the fluorine-substituted aliphatic carboxylic acid to not smaller than 4, the diffusibility of decomposability of carboxylic acid thus produced can be deteriorated, making it possible to further inhibit the change of line width with time from exposure to after-heating. In particular, a fluorine-substituted product of $C_4$–$C_{18}$ straight or branched saturated aliphatic carboxylic acid is preferred.

The fluorine-substituted aromatic carboxylic acid is preferably a fluorine-substituted product of an aromatic carboxylic acid having from 7 to 20, preferably from 7 to 15, more preferably from 7 to 11 carbon atoms. Specific examples of the fluorine-substituted aromatic carboxylic acid include fluorine-substituted products of aromatic carboxylic acids such as benzoic acid, substituted benzoic acid, naphthoic acid, substituted naphthoic acid, anthracenecarboxylic acid and substituted anthracenecarboxylic acid (Examples of the substituents include alkyl group, alkoxy group, hydroxyl group, halogen atom, aryl group, acyl group, acyloxy group, nitro group, alkylthio group, and arylthio group). Particularly preferred among these compounds are fluorine-substituted products of benzoic acid and substituted benzoic acid.

These fluorine-substituted aliphatic or aromatic carboxylic acids have one or more hydrogen atoms present in skeletons other than carboxyl group substituted by fluorine atoms. Particularly preferred are aliphatic or aromatic carboxylic acids (perfluoro saturated aliphatic carboxylic acids or perfluoroaromatic carboxylic acids) having all hydrogen atoms present in skeletons other than carboxyl group substituted by fluorine atoms. In this arrangement, the resulting positive-working resist composition has a higher sensitivity.

The aliphatic carboxylate anion, particularly anion having a fluorine atom on α carbon atom in carboxylic acid, has a high acid strength and thus tends to undergo ready salt exchange with a carboxylate anion free of fluorine atom. A perfluoroaliphatic carboxylic acid has a higher acid strength.

Examples of the compound which produces a fluorine-containing carboxylic acid when irradiated with an actinic ray or radiation include onium salt compounds (sulfonium salt, iodonium salt, etc.) having as a counter anion the aforementioned fluorine-substituted aliphatic or aromatic carboxylic acid anion, and imidecarboxylate compounds or nitrobenzylester compounds having carboxyl acid ester group.

Preferred examples of the compound which produces a fluorine-containing carboxylic acid when irradiated with an actinic ray or radiation include compounds represented by the following formulae (I) to (III). In this arrangement, the resulting positive-working resist composition has a higher sensitivity, resolving power and exposure margin. When irradiated with an actinic ray or radiation, this compound decomposes to produce a saturated aliphatic or aromatic carboxylic acid substituted by at least one fluorine atom corresponding to X⁻ in the formulae (I) to (III).

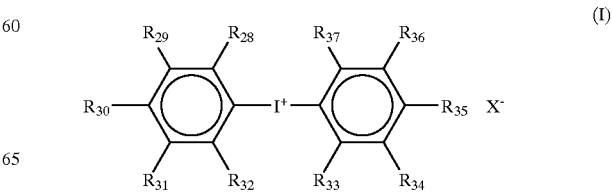

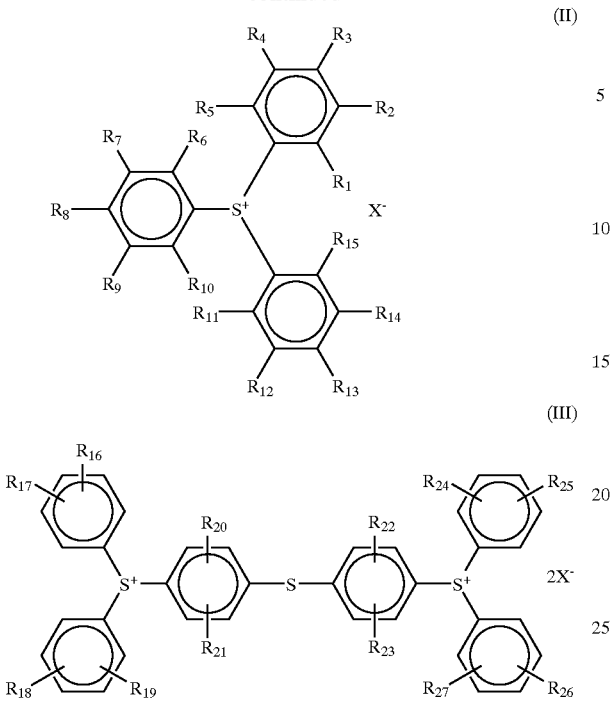

(II)

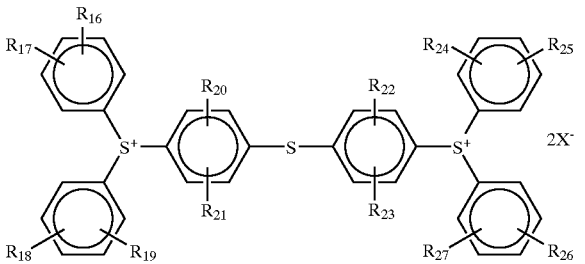

(III)

In the formula, $R_1$ to $R_{37}$ each independently represents a hydrogen atom, straight-chain, branched or cyclic alkyl group, straight-chain, branched or cyclic alkoxy group, hydroxyl group, halogen atom or —S—$R_{38}$ group (in which $R_{38}$ represents a straight-chain, branched or cyclic alkyl or aryl group), and $X^-$ represents an aliphatic or aromatic carboxylic acid anion substituted by at least one fluorine atom.

$X^-$ is preferably a perfluoroaliphatic aliphatic carboxylic acid or perfluoroaromatic carboxylic acid anion, particularly fluorine-substituted alkylcarboxylic acid anion having 4 or more carbon atoms.

Examples of the straight or branched alkyl groups represented by $R_1$ to $R_{38}$ in the formulae (I) to (III) include $C_1$–$C_4$ alkyl groups such as methyl, ethyl, propyl, n-butyl, sec-butyl and t-butyl which may have substituents. Examples of the cyclic alkyl groups represented by $R_1$ to $R_{38}$ include $C_3$–$C_8$ alkyl groups such as cyclopropyl, cyclopentyl and cyclohexyl which may have substituents.

Examples of the alkoxy groups represented by $R_1$ to $R_{37}$ include $C_1$–$C_4$ alkoxy groups such as methoxy, ethoxy, hydroxyethoxy, propoxy, n-butoxy, isobutoxy, sec-butoxy and t-butoxy.

Examples of the halogen atoms represented by $R_1$ to $R_{37}$ include fluorine atom, chlorine atom, bromine atom, and iodine atom.

Examples of the aryl group represented by $R_{38}$ include $C_6$–$C_{14}$ aryl group such as phenyl, tolyl, methoxyphenyl and naphthyl. The aryl group may have substituents.

Preferred examples of these substituents include $C_1$–$C_4$ alkoxy group, halogen atom (fluorine, chlorine, iodine), $C_6$–$C_{10}$ aryl group, $C_2$–$C_6$ alkenyl group, cyano group, hydroxyl group, carboxy group, alkoxycarbonyl group, and nitro group.

The iodonium compound or sulfonium compound represented by the formulae (I) to (III) to be used in the invention has as its counter anion $X^-$ a saturated aliphatic or aromatic carboxylic acid anion substituted by at least one fluorine atom.

Specific examples of the iodonium compound or sulfonium compound represented by the formulae (I) to (III) will be given below, but the invention is not limited thereto.

Specific examples of the compound represented by the formula (I):

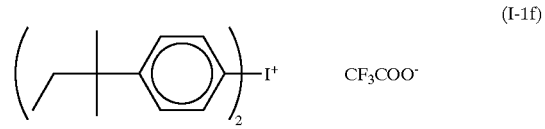
(I-1f)

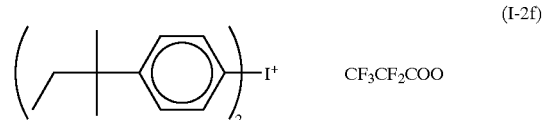
(I-2f)

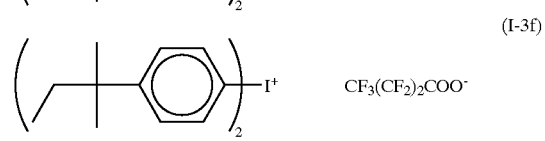
(I-3f)

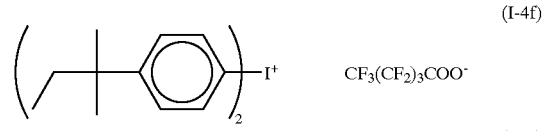
(I-4f)

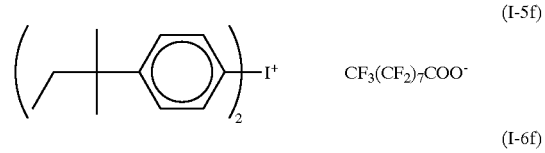
(I-5f)

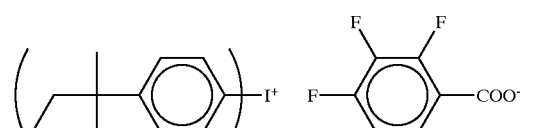
(I-6f)

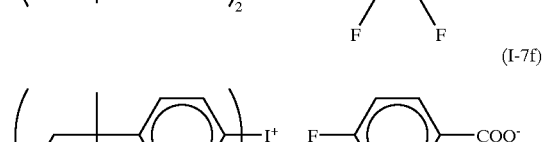
(I-7f)

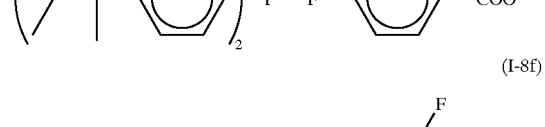
(I-8f)

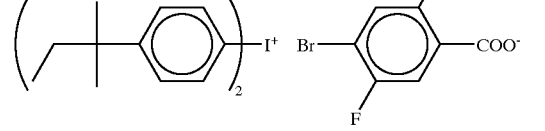
(I-9f)

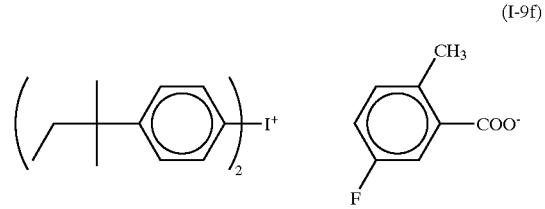
(I-10f)

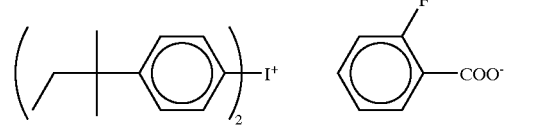

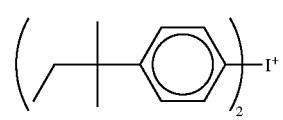 CF₂HCOO⁻ (I-11f)
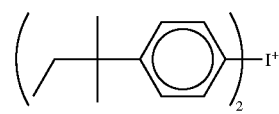 CF₂ClCOO⁻ (I-12f)
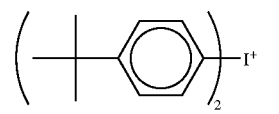 CF₃(CF₂)₃COO⁻ (I-13f)
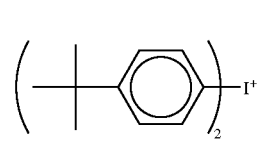 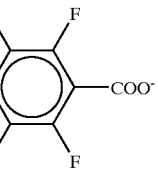 (I-14f)
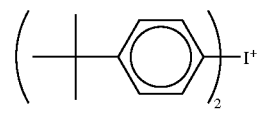 CF₃(CF₂)₂COO⁻ (I-15f)
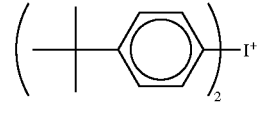 CF₃(CF₂)₇COO⁻ (I-16f)
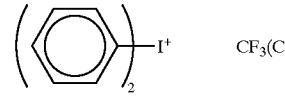 CF₃(CF₂)₃COO⁻ (I-17f)
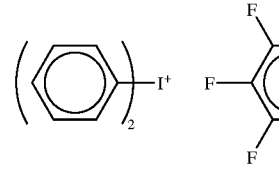 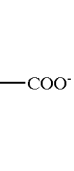 (I-18f)
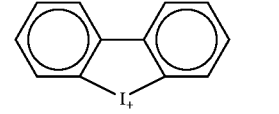 CF₃COO⁻ (I-19f)
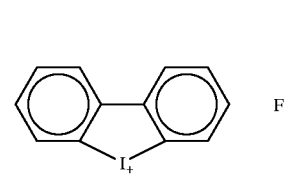 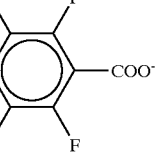 (I-20f)
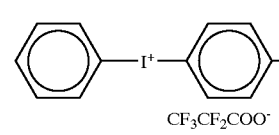 (I-21f)
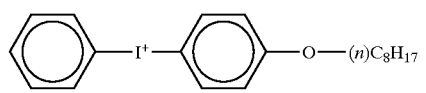 (I-22f)
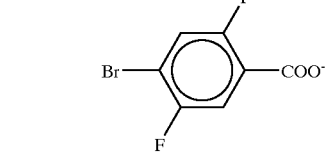 (I-23f)
CF₃(CF₂)₃COO⁻
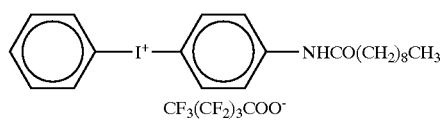 (I-24f)
CF₃(CF₂)₇COO⁻
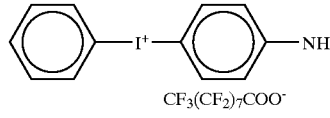 CF₃(CF₂)₁₀COO⁻ (I-25f)
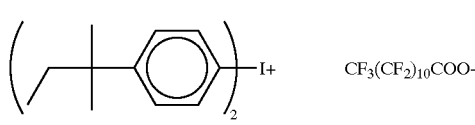 CF₃(CF₂)₁₀COO⁻ (I-26f)
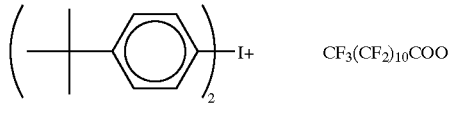 CF₃(CF₂)₁₀COO⁻ (I-27f)
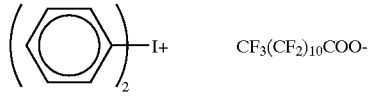 CF₃(CF₂)₁₂COO⁻ (I-28f)
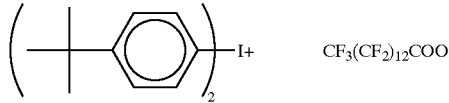 CF₃(CF₂)₁₂COO⁻ (I-29f)
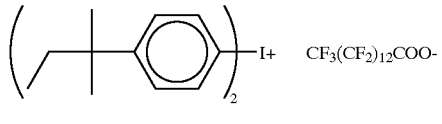 CF₃(CF₂)₁₂COO⁻ (I-30f)
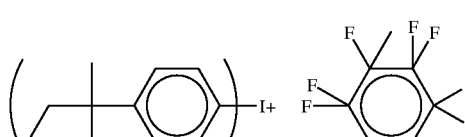 (I-31f)
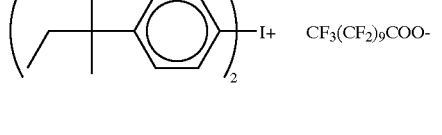 CF₃(CF₂)₉COO⁻ (I-32f)

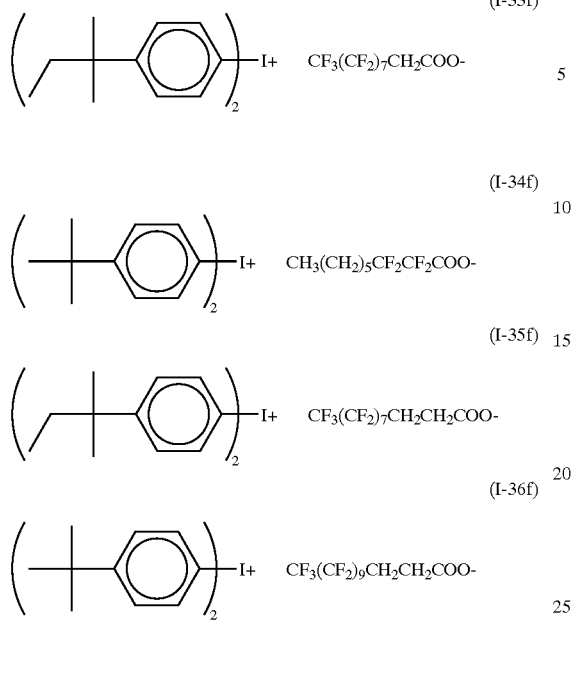
Specific examples of the compound represented by the formula (II):
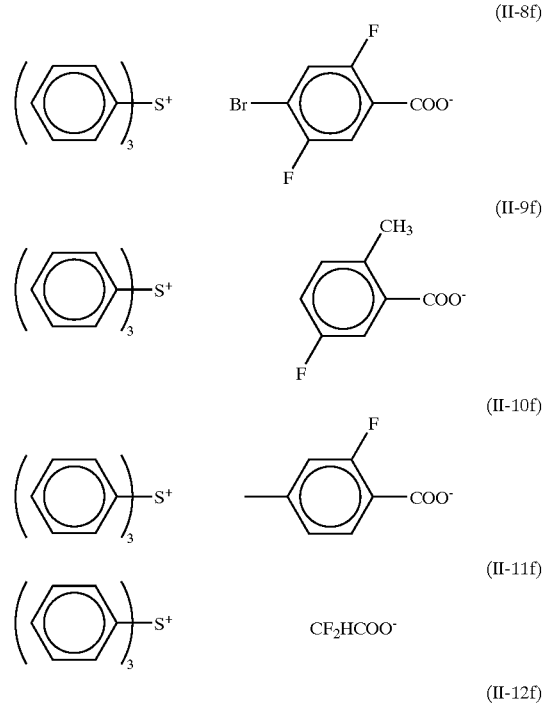
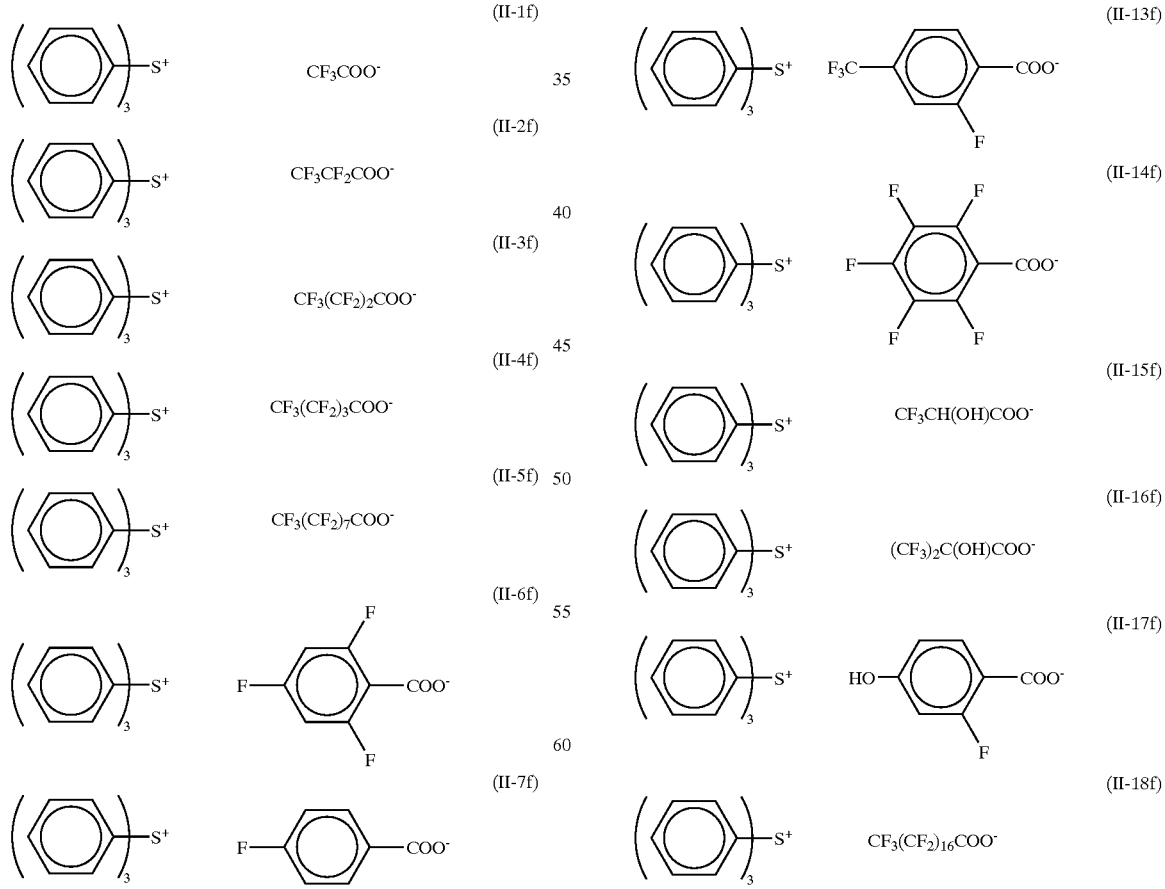

(II-19f) 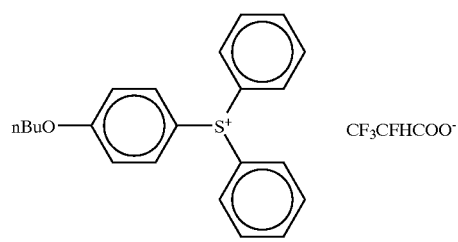
(II-20f) 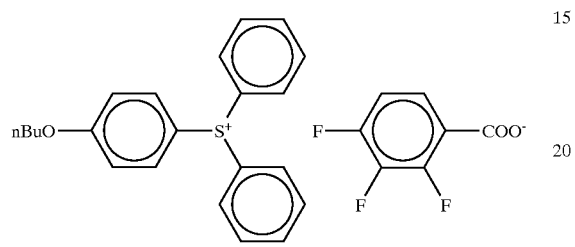
(II-21f) 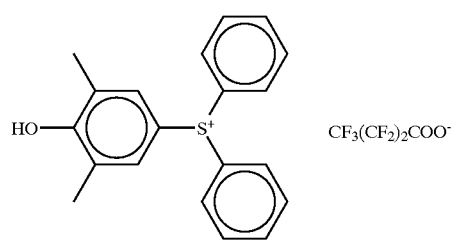
(II-22f) 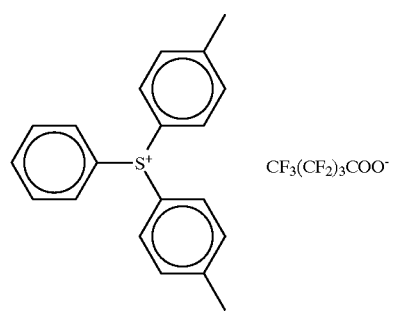
(II-23f) 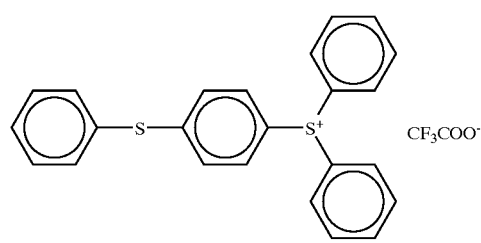
(II-24f) 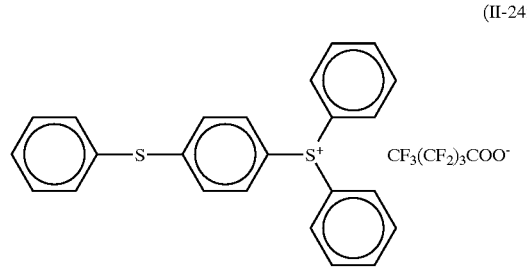
(II-25f) 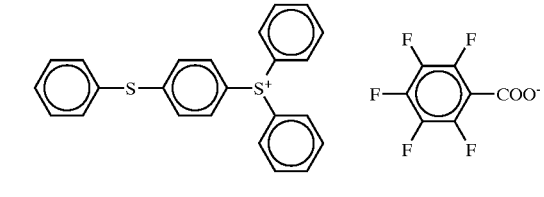
(II-26f) 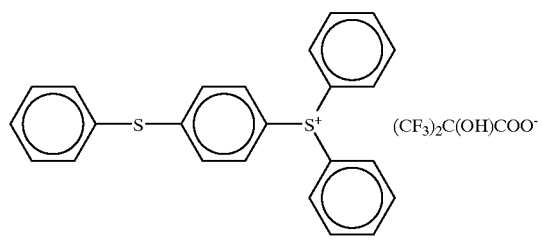
(II-27f) 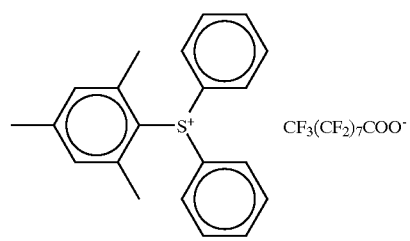
(II-28f) 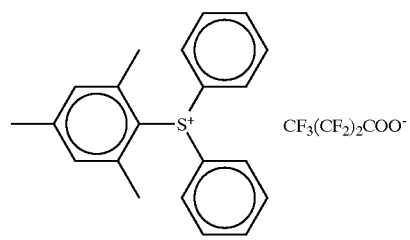
(II-29f) 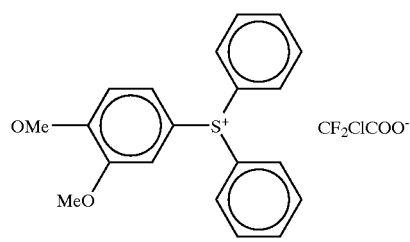
(II-30f) 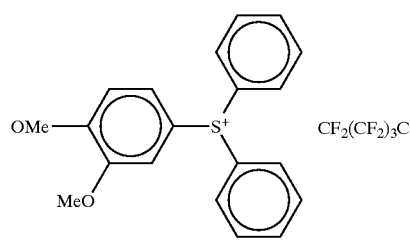

-continued
(II-31f)
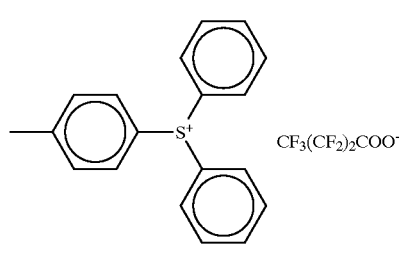
(II-32f)
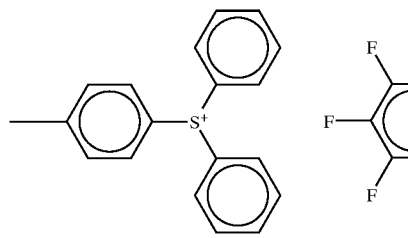
(II-33f)
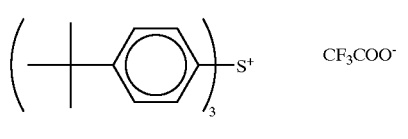 CF$_3$COO$^-$
(II-34f)
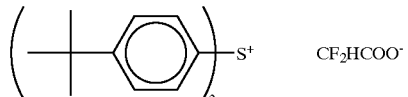 CF$_2$HCOO$^-$
(II-35f)
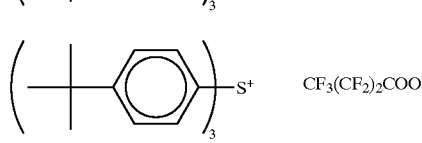 CF$_3$(CF$_2$)$_2$COO$^-$
(II-36f)
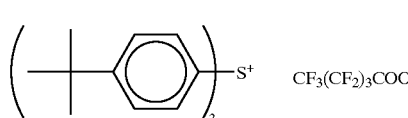 CF$_3$(CF$_2$)$_3$COO$^-$
(II-37f)
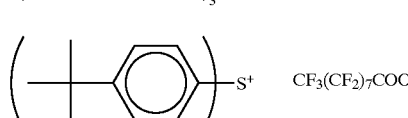 CF$_3$(CF$_2$)$_7$COO$^-$
(II-38f)
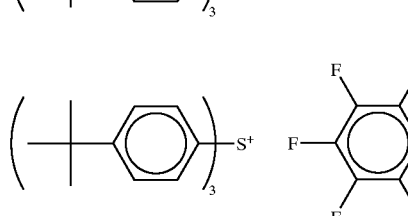
(II-39f)
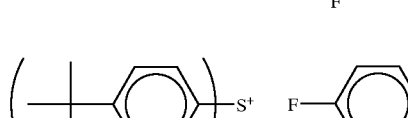
(II-40f)
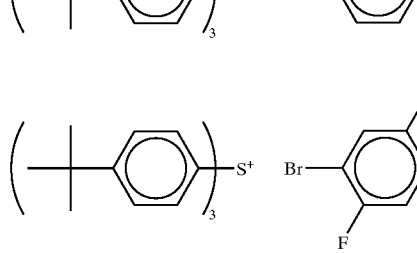
-continued
(II-41f)
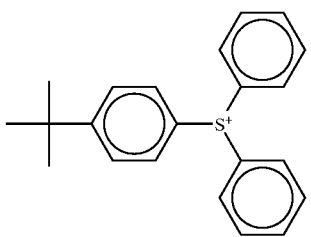 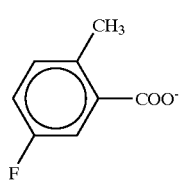
(II-42f)
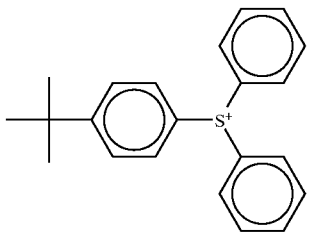 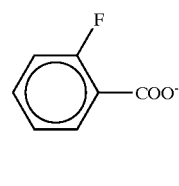
(II-43f)
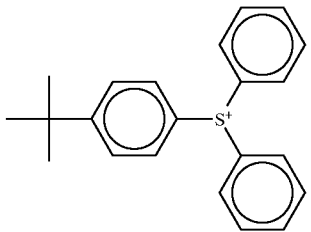 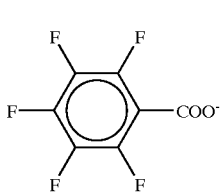
(II-44f)
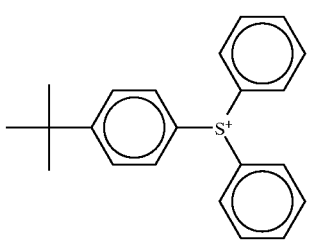 CF$_2$ClCOO$^-$
(II-45f)
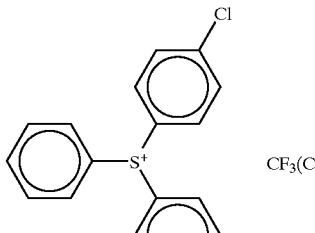 CF$_3$(CF$_2$)$_3$COO$^-$

(II-46f)
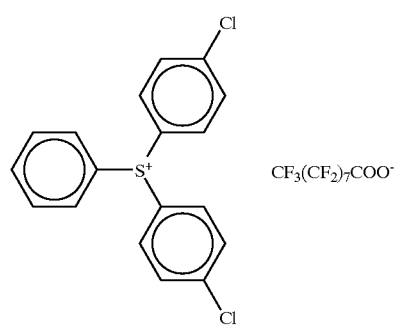
(II-47f)
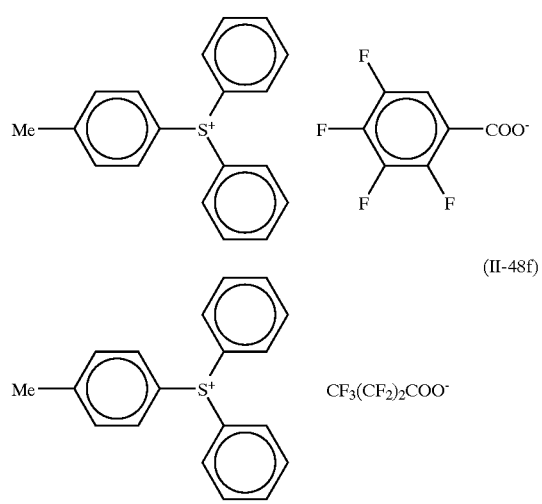
(II-48f)
(II-49f)
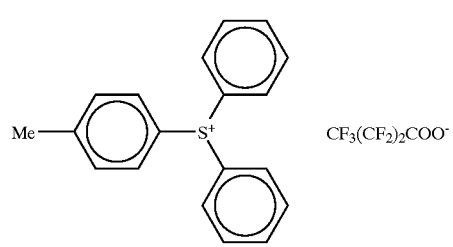
(II-50f)
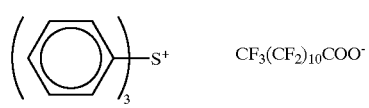
(II-51f)
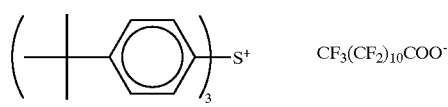
(II-52f)
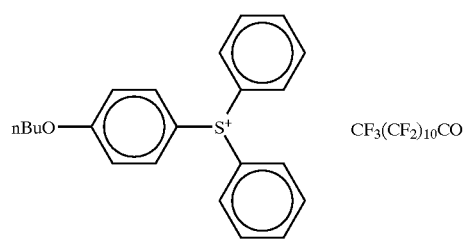
(II-53f)
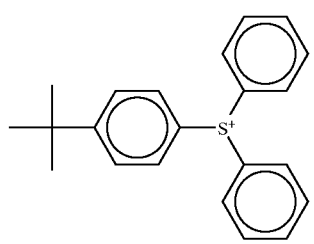
(II-54f)
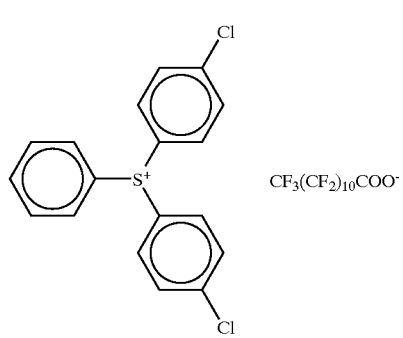
(II-55f)
(II-56f)
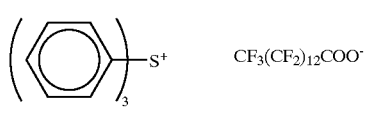
(II-57f)
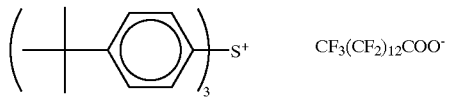
(II-58f)
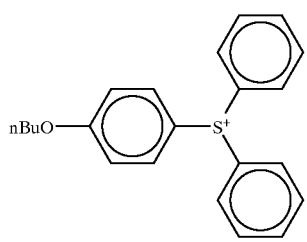
(II-59f)
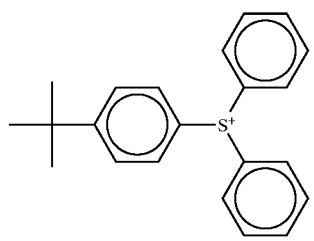
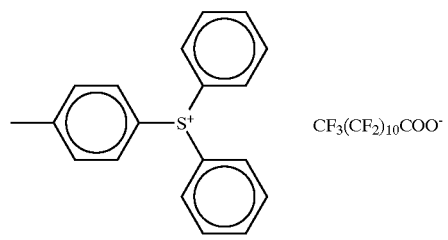
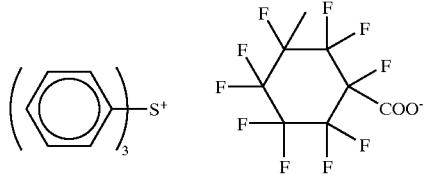
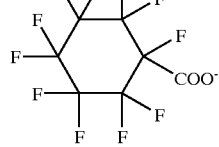

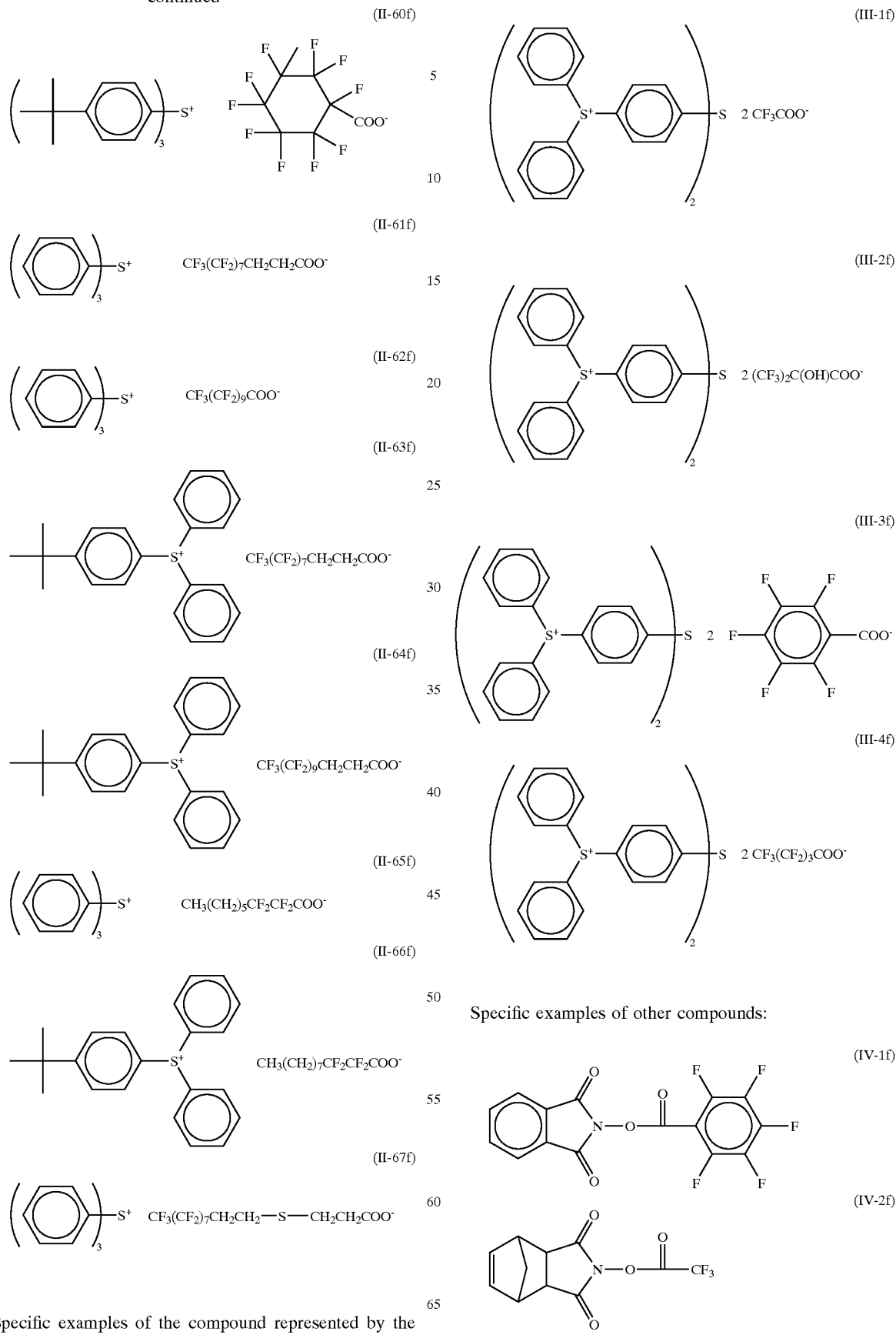

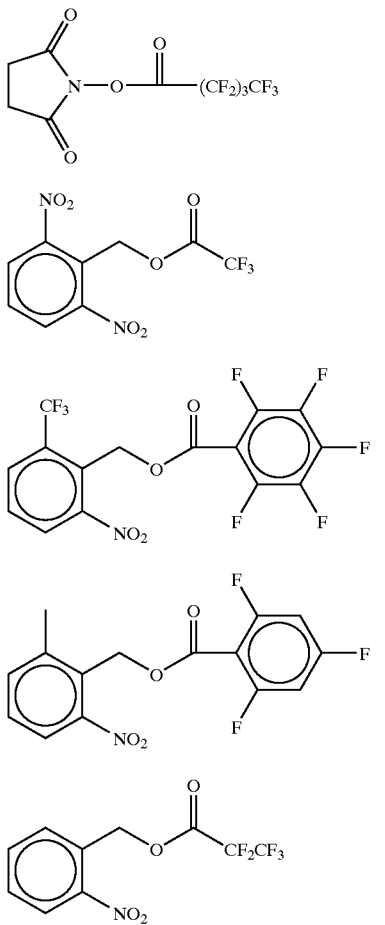

The aforementioned compound represented by the formula (I) can be synthesized by reacting a periodate with an aromatic compound, and then subjecting the resulting iodonium salt to salt exchange to a corresponding sulfonic acid.

The compounds represented by the formula (II) and (III) can be synthesized also by a method which comprises reacting an aryl Grignard reagent such as aryl magnesium bromide with a substituted or unsubstituted phenyl sulfoxide, and then subjecting the resulting triarylsulfonium halide to salt exchange with a corresponding carboxylic acid. Alternatively, these compounds can be synthesized by a method which comprises subjecting a substituted or unsubstituted phenyl sulfoxide and a corresponding aromatic compound to condensation and salt exchange in the presence of an acid catalyst such as methanesulfonic acid/diphosphorus pentaoxide and aluminum chloride or a method which comprises subjecting a diaryliodonium salt and diaryl sulfide to condensation and salt exchange in the presence of a catalyst such as copper acetate.

The salt exchange can be carried out also by a method which comprises converting the starting material to a halide, and then converting the halide to a carboxylate in the presence of a silver reagent such as silver oxide or a method involving the use of an ion exchange resin. As the carboxylic acid or carboxylate to be used in the salt exchange there may be used a commercially available product or may be obtained by the hydrolysis of a commercially available carboxylic acid halide.

As the fluorine-substituted carboxylic acid which is an anion moiety there is preferably used one derived from a fluoroaliphatic compound produced by a telomerization method (also referred to as "telomer method") or oligomerization method (also referred to as "oligomer method"). For details of these methods for the production of fluoroaliphatic compound, reference can be made to Nobuo Ishikawa, "Fusso Kagoubutsu no Gosei to Kinou (Synthesis and Function of Fluorine Compounds)", CMC, pp. 117–118, 1987, and Milos Hudlicky and Attila E. Pavlath, "Chemistry of Organic Fluorine Compounds II", Monograph 187, American Chemical Society 1995, pp. 747–752. In accordance with the telomerization method, a fluorine-containing vinyl compound such as tetrafluoroethylene is subjected to radical polymerization in the presence of an alkyl halide having a great change transfer constant such as alkyl iodide as a telogen to synthesize a telomer (as shown in Scheme-1). In accordance with the synthesis by telomer method, a plurality of compounds having different carbon chain lengths are obtained. These compounds may be used in admixture or may be purified before use.

(B2b) Compound which is Capable of Generating a Fluorine-Free Carboxylic Acid by Irradiation of Actinic Ray or Radiation Examples of the compound which produces a fluorine-free carboxylic acid when irradiated with an actinic ray or radiation include compounds represented by the following formulae (AI) to (AV).

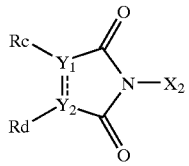

(AIV)

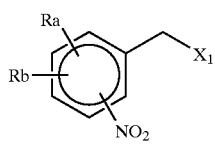

(AV)

In these formulae, $R_{301}$ to $R_{337}$ each independently represents a hydrogen atom, straight-chain, branched or cyclic alkyl group, straight-chain, branched or cyclic alkoxy group, hydroxyl group, halogen atom or —S—$R_0$ group. $R_0$ represents a straight-chain, branched or cyclic alkyl or aryl group.

Ra and Rb each independently represent a hydrogen atom, a nitro group, a halogen atom or an alkyl or alkoxy group, which may have a substituent. Rc and Rd each independently represent a halogen atom or an alkyl or aryl group, which may have a substituent. Rc and Rd may be connected to each other to form an aromatic cyclic hydrocarbon group or monocyclic or polycyclic hydrocarbon group (which may contain oxygen and nitrogen atoms). $Y_1$ and $Y_2$ each represent a carbon atom. $Y_1$–$Y_2$ bond may be a single bond or double bond. $X^-$ represents an anion derived from the carboxylic acid compound represented by the following formula. $X_1$ and $X_2$ each independently represents a group obtained by converting the carboxyl group moiety of the carboxylic acid compound represented by the following formula to an ester group.

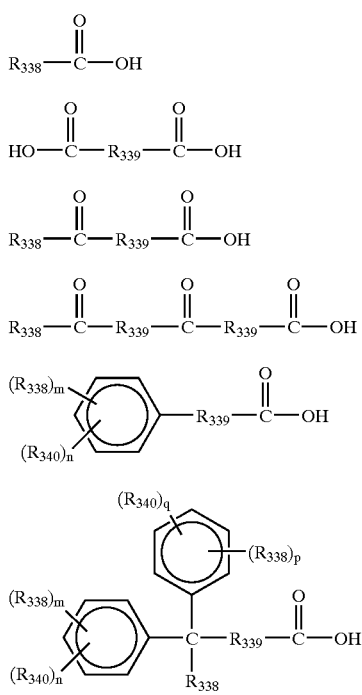

(C1)
(C2)
(C3)
(C4)
(C5)
(C6)

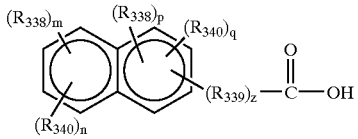

(C7)

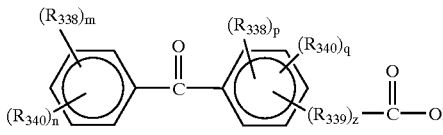

(C8)

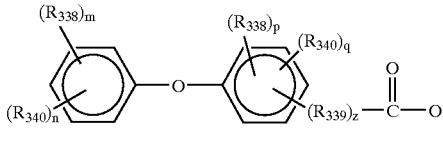

(C9)

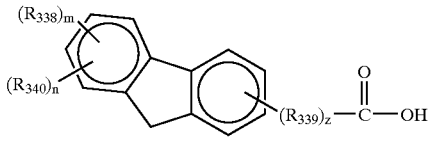

(C10)

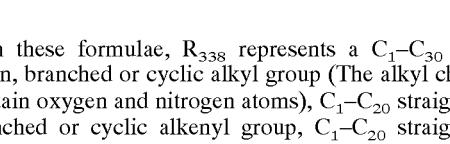

In these formulae, $R_{338}$ represents a $C_1$–$C_{30}$ straight-chain, branched or cyclic alkyl group (The alkyl chain may contain oxygen and nitrogen atoms), $C_1$–$C_{20}$ straight-chain, branched or cyclic alkenyl group, $C_1$–$C_{20}$ straight-chain, branched or cyclic alkinyl group, $C_1$–$C_{20}$ straight-chain, branched or cyclic alkoxyl group, group obtained by substituting at least some of hydrogen atoms in the aforementioned alkyl group by halogen atom and/or hydroxyl group, group obtained by substituting at least some of hydrogen atoms in the aforementioned alkenyl group by halogen atom and/or hydroxyl group or $C_6$–$C_{20}$ substituted or unsubstituted aryl group. Examples of the substituents on the aryl group include alkyl group, nitro group, hydroxyl group, alkoxy group, acyl group, alkoxycarbonyl group, and halogen atom.

$R_{339}$ represents a single bond, $C_1$–$C_{20}$ straight-chain, branched or cyclic alkylene group (The alkylene chain may contain oxygen and nitrogen atoms), $C_1$–$C_{20}$ straight-chain, branched or cyclic alkenylene group, group obtained by substituting at least some of hydrogen atoms in the aforementioned alkyl group by halogen atom and/or hydroxyl group, group obtained by substituting at least some of hydrogen atoms in the aforementioned alkenyl group by halogen atom and/or hydroxyl group or $C_2$–$C_{20}$ alkoxyalkylene group. The plurality of $R_{338}$'s and $R_{339}$'s may be the same or different.

$R_{340}$ represents a hydroxyl group or halogen atom. The plurality of $R_{340}$'s may be the same or different. The suffixes m, n, p and q each independently represent an integer of from 0 to 3, with the proviso that m, n, p and q satisfy the relationships $m+n \leq 5$ and $p+q \leq 5$. The suffix z represents 0 or 1.

Examples of the straight or branched alkyl groups represented by $R_{301}$ to $R_{337}$, Ra, Rb, Rc, Rd and $R_0$ in the formulae (AI) to (AV) include $C_1$–$C_4$ alkyl groups such as methyl, ethyl, propyl, n-butyl, sec-butyl and t-butyl, which may have a substituent. Examples of the cyclic alkyl groups represented by $R_{301}$ to $R_{337}$, Ra, Rb, Rc, Rd and $R_0$ include $C_3$–$C_8$ alkyl groups such as cyclopropyl, cyclopentyl and cyclohexyl which may have substituents.

Examples of the alkoxy groups represented by $R_{301}$ to $R_{337}$, Ra and Rb include $C_1$–$C_4$ alkoxy groups such as methoxy, ethoxy, hydroxyethoxy, propoxy, n-butoxy, isobutoxy, sec-butoxy and t-butoxy.

Examples of the halogen atoms represented by $R_{301}$ to $R_{337}$, Ra, Rb, Rc, Rd and $R_0$ include fluorine atom, chlorine atom, bromine atom, and iodine atom.

Examples of the aryl group represented by $R_0$, Rc and Rd include $C_6$–$C_{14}$ aryl group such as phenyl, tolyl, methoxyphenyl and naphthyl. The aryl group may have substituents.

Preferred examples of these substituents include $C_1$–$C_4$ alkoxy group, halogen atom (fluorine, chlorine, iodine), $C_6$–$C_{10}$ aryl group, $C_2$–$C_6$ alkenyl group, cyano group, hydroxyl group, carboxy group, alkoxycarbonyl group, and nitro group.

Examples of the aromatic cyclic hydrocarbon group or monocyclic or polycyclic hydrocarbon group (which may contain oxygen and nitrogen atoms) formed by the connection of Rc and Rd include benzene structure, naphthalene structure, cyclohexane structure, norbornene structure, oxabicyclo structure.

The sulfonium compound and iodonium compound represented by the formulae (AI) to (AV) to be used in the invention have as its counter anion $X^-$ a group obtained by converting the carboxyl group (—COOH) in at least one of the carboxylic acid compounds represented by the formulae (C1) to (C10) to an anion (—COO$^-$).

The compounds represented by the formulae (AIV) to (AV) to be used in the invention have as substituents X1 and X2 substituents obtained by converting the carboxyl group (—COOH) in at least one of the carboxylic acid compounds represented by the formulae (C1) to (C10) to an ester group (—COO$^-$).

Examples of the $C_1$–$C_{30}$ straight-chain, branched or cyclic alkyl group (The alkyl chain may contain oxygen and nitrogen atoms) in $R_{338}$ include methyl, ethyl, propyl, butyl, pentyl, hexyl, cyclohexyl, dodecyl, 1-ethoxyethyl, and adamanthyl.

Examples of the $C_1$–$C_{20}$ straight-chain, branched or cyclic alkenyl group include ethenyl, propenyl, isopropenyl, and cyclohexene.

Examples of the $C_1$–$C_{20}$ straight-chain, branched or cyclic alkinyl group include acetylene, and propenylene.

Examples of the $C_1$–$C_{20}$ straight-chain, branched or cyclic alkoxy group include methoxy, ethoxy, propyloxy, butoxy, cyclohexyloxy, isobutoxy, and dodecyloxy.

Examples of the $C_6$–$C_{20}$ substituted or unsubstituted aryl group include phenyl, naphthyl, and anthranyl.

Examples of the substituents on the aryl group include alkyl group, nitro group, hydroxyl group, alkoxy group, acyl group, alkoxycarbonyl group, and halogen atom.

Examples of the $C_1$–$C_{20}$ straight-chain, branched or cyclic alkylene group (The alkylene chain may contain oxygen and nitrogen atoms) in $R_{339}$ include methylene, ethylene, propylene, butylene, isobutylene, ethoxyethylene, and cyclohexylene.

Examples of the $C_1$–$C_{20}$ straight-chain, branched or cyclic alkenylene group include vinylene, and arylene.

Specific examples of the sulfonium and iodonium compounds will be given below, but the invention is not limited thereto.

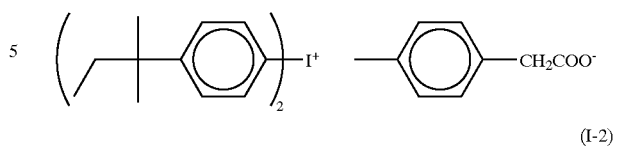
(I-1)

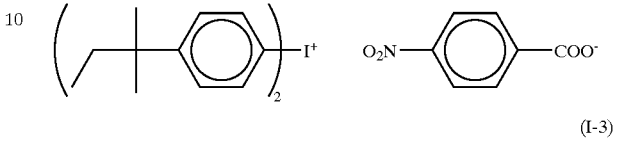
(I-2)

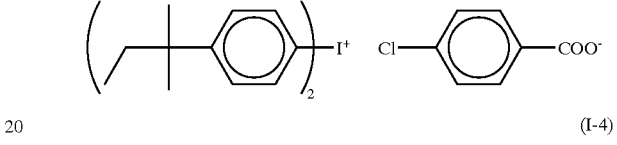
(I-3)

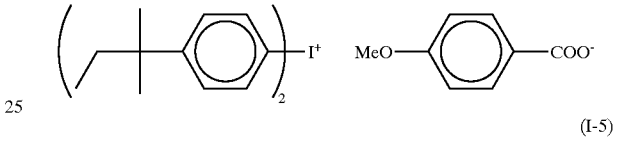
(I-4)

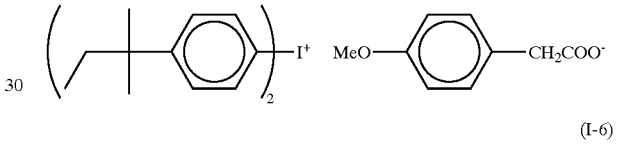
(I-5)

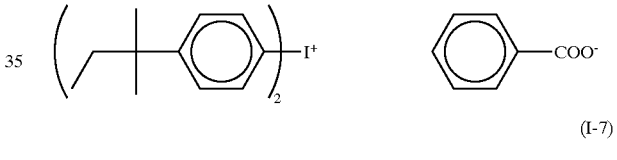
(I-6)

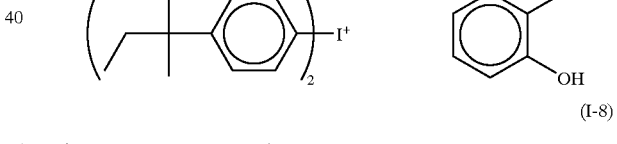
(I-7)

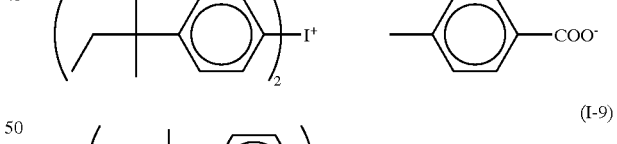
(I-8)

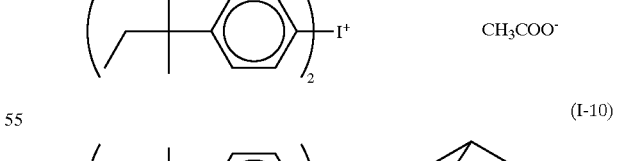
(I-9)

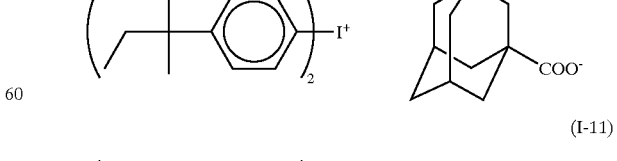
(I-10)

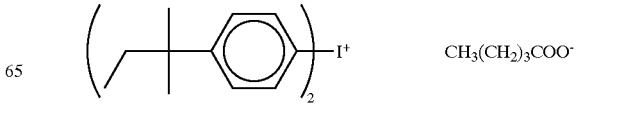
(I-11)

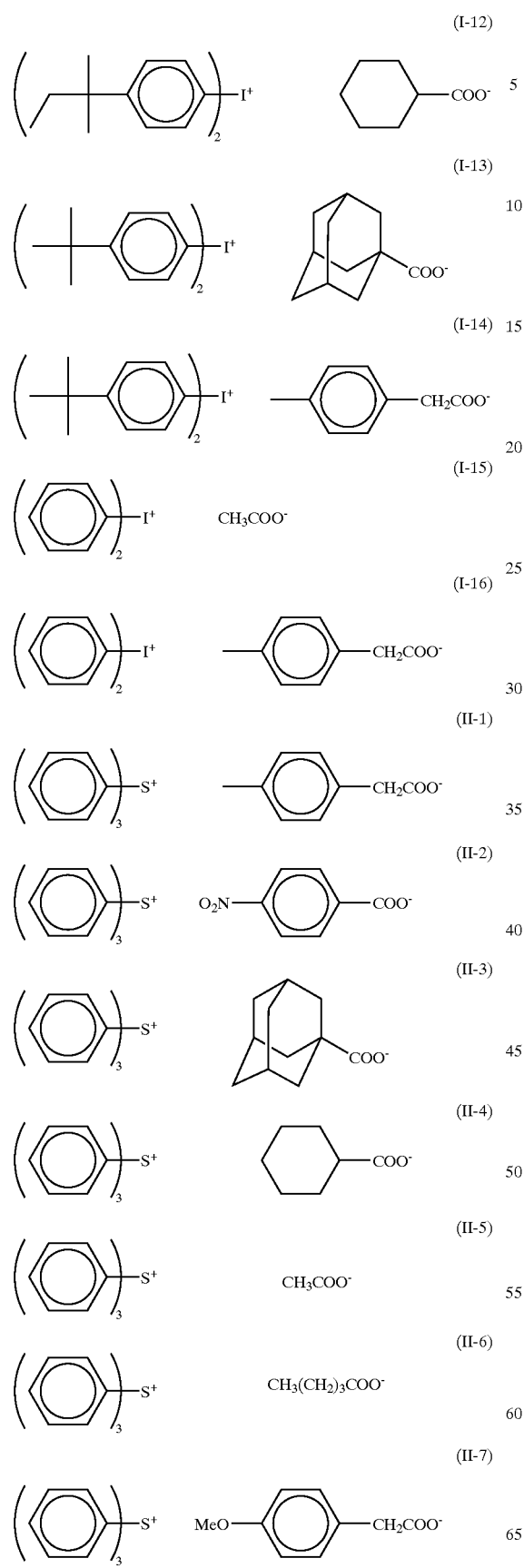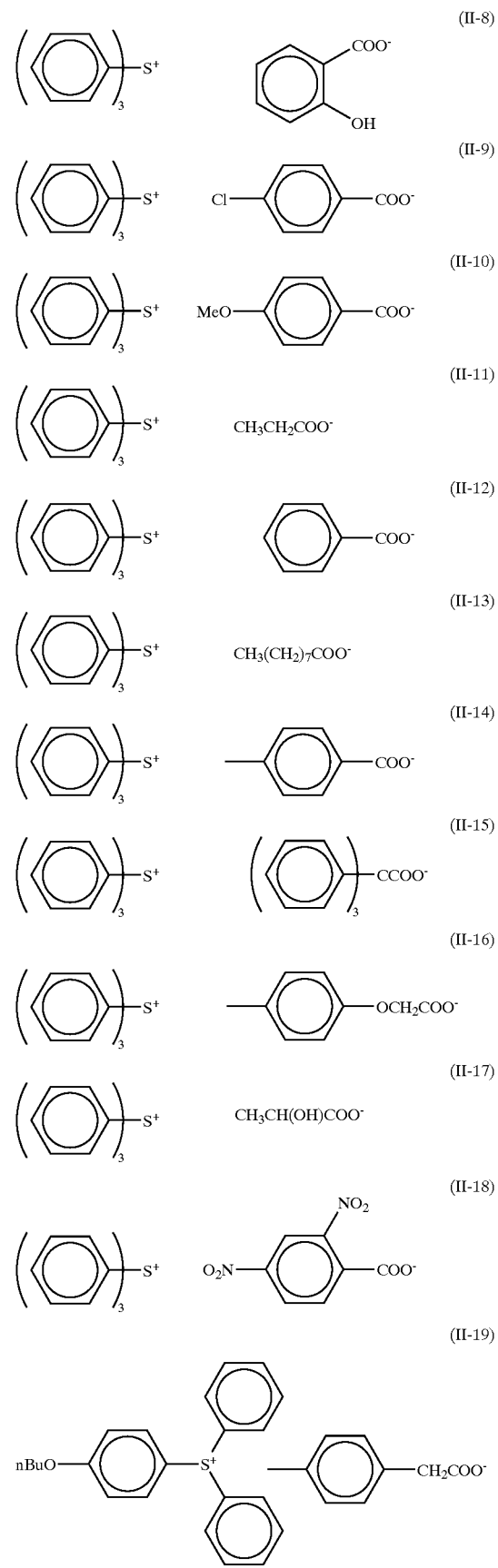

(II-20)
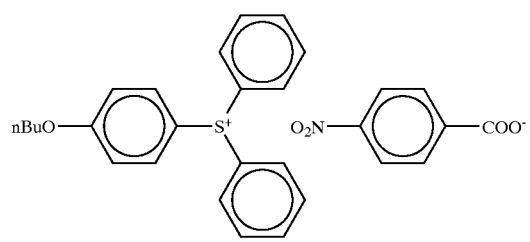
(II-21)
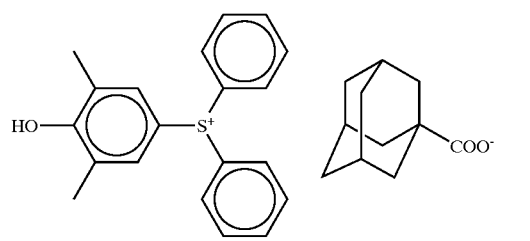
(II-22)
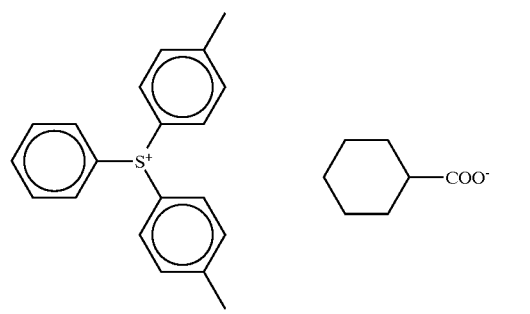
(II-23)
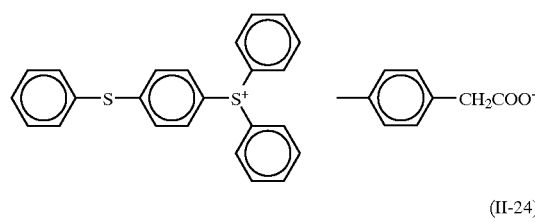
(II-24)
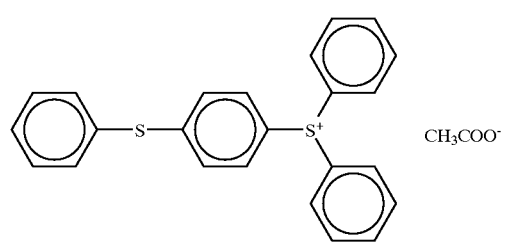
(II-25)
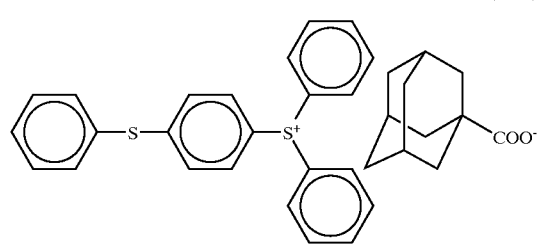
(II-26)
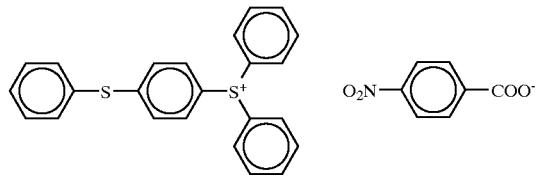
(II-27)
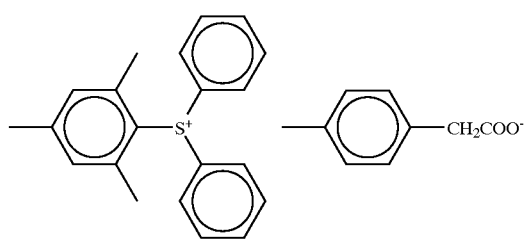
(II-28)
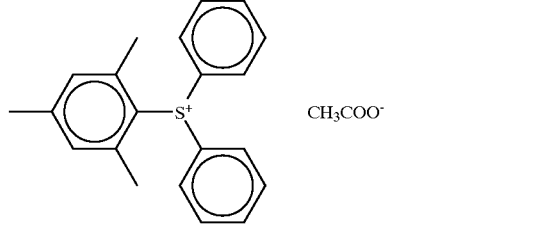
(II-29)
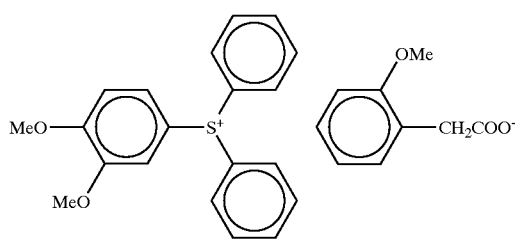
(II-30)
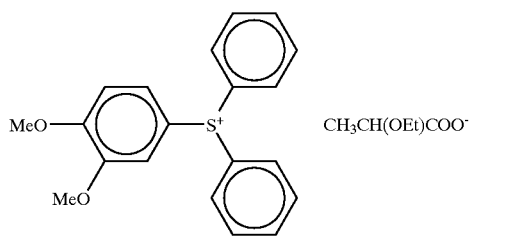
(II-31)
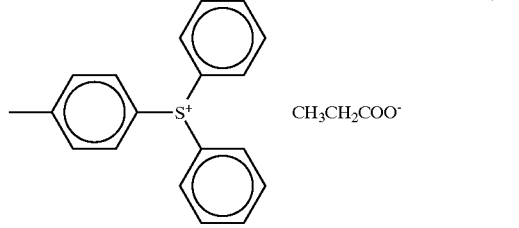

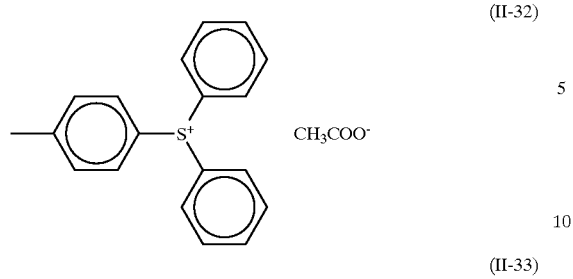
(II-32)
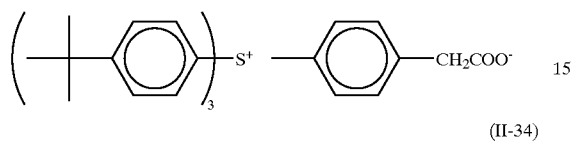
(II-33)
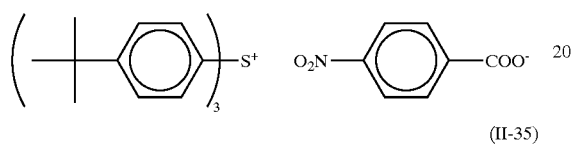
(II-34)
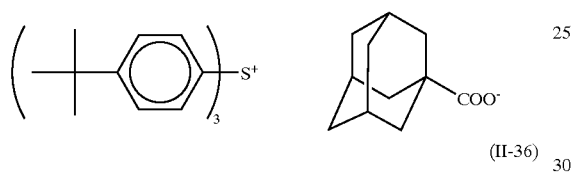
(II-35)
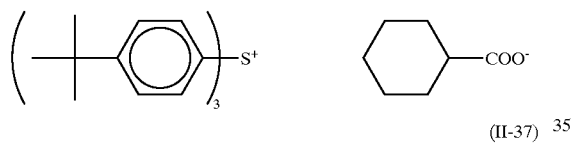
(II-36)
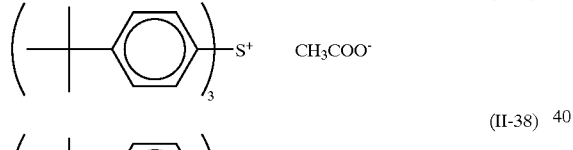
(II-37)
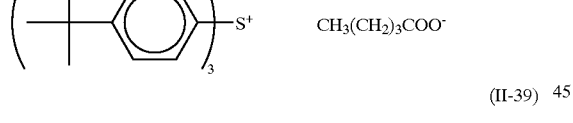
(II-38)
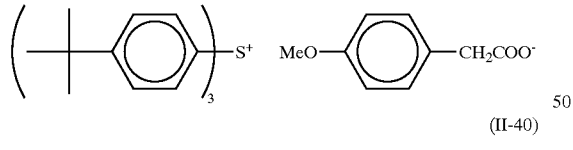
(II-39)
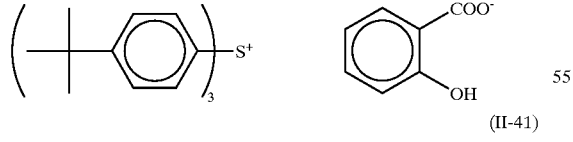
(II-40)
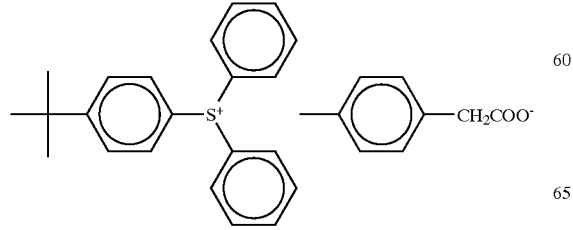
(II-41)
(II-42)
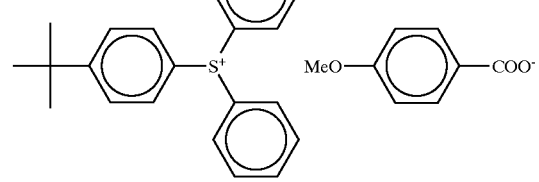
(II-43)
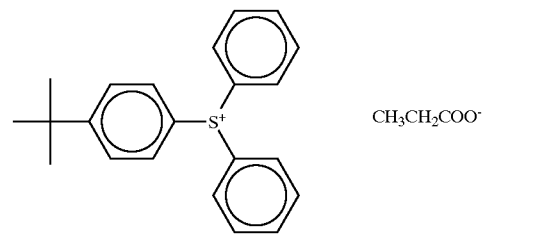
(II-44)
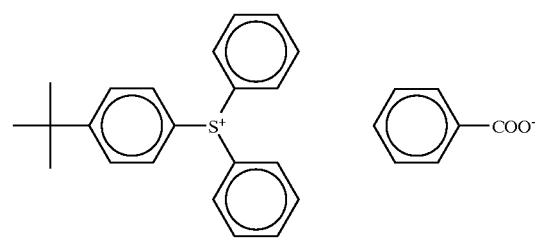
(II-45)
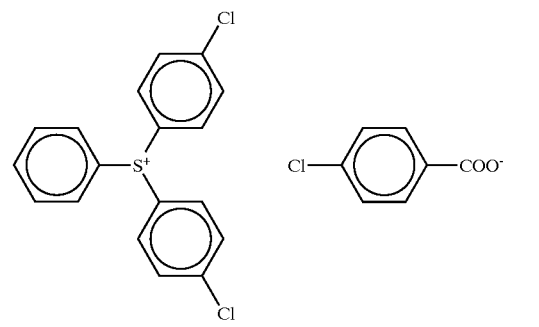
(II-46)
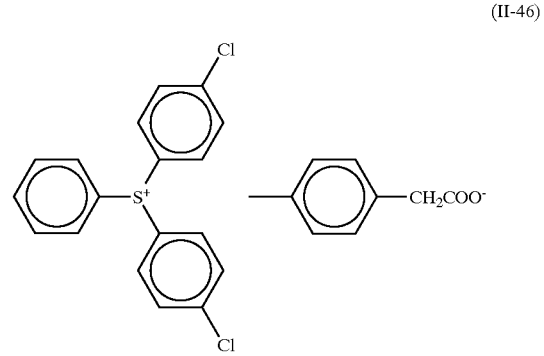

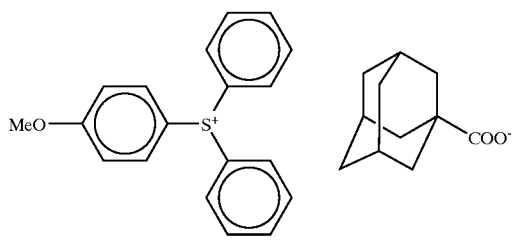
(II-47)

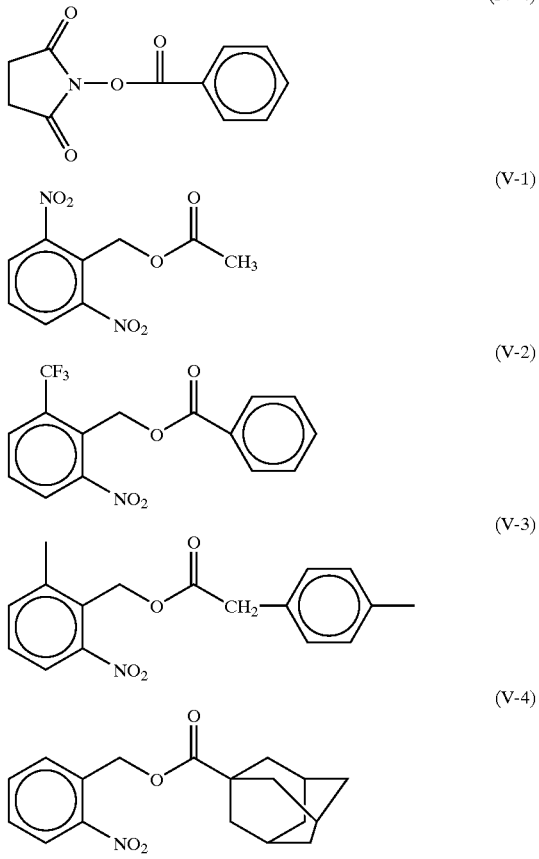
(IV-4)
(V-1)
(V-2)
(V-3)
(V-4)

(II-48)

(III-1)

(III-2)

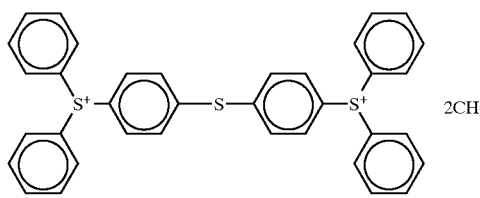
(IV-1)

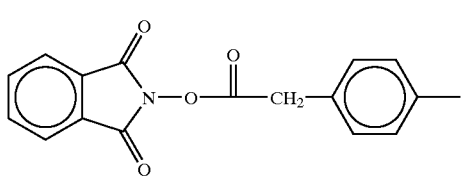
(IV-2)

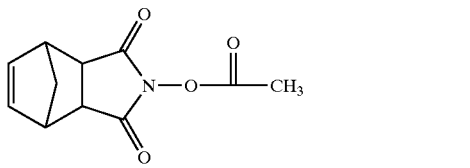
(IV-3)

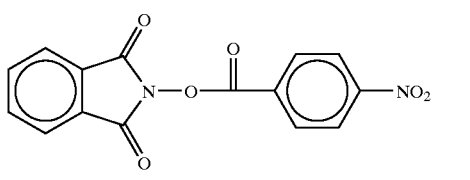

The compounds represented by the formulae (AI), (AII) and (AIII) can be synthesized by exchanging counter anions according to the method described in U.S. Pat. No. 3,734,928, "Macromolecules", vol. 10, 1307 (1977), "Journal of Organic Chemistry", vol. 55, 4222 (1990), and "J. Radiat. Curing", vol. 5 (1), 2 (1978). The compounds represented by the formulae (AIV) and (AV) can be obtained by reacting an N-hydroxyimide compound with carboxylic acid chloride under a basic condition or reacting nitrobenzyl alcohol with carboxylic acid chloride under a basic condition.

In the inventions the combined use of the components (B1) and (B2) makes it possible to enhance the contrast of distribution of concentration of strong acid produced by the irradiation of an actinic ray or radiation in the vicinity of the interface of area irradiated with an actinic ray or radiation with unirradiated area (area irradiated with a low energy actinic ray or radiation).

The weight ratio of the amount of the components (B1) and (B2) to be added is normally from 100/100 to 100/0, preferably from 100/100 to 100/10, particularly from 100/50 to 100/20.

The sum of the content of the components (B1) and (B2) is normally from 0.5% to 20% by weight, preferably from 0.75% to 15% by weight, more preferably from 1% to 10% by weight based on the total solid content of the composition.

A plurality of the components (B1) and (B2) may be incorporated in the composition.

[6] Organic Basic Compound

The composition of the invention preferably comprises an organic basic compound incorporated therein for the purpose of inhibiting the change of properties (formation of T-top shape on pattern, sensitivity change, change of pattern line width, etc.) with time between the irradiation with an active ray or radiation and the heat treatment, the change of properties with time after coating, and excessive diffusion of acid (deterioration of resolution) during the heat treatment after the irradiation with an active ray or radiation. As such an organic basic compound there is preferably used an organic basic compound containing a basic nitrogen having a conjugate acid PKa value of not smaller than 4.

Specific examples of such a compound include those having the following structural formulae (A) to (E).

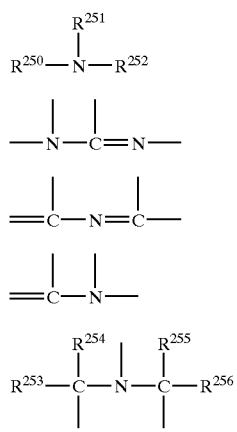

In these formulae, $R^{250}$, $R^{251}$ and $R^{252}$ may be the same or different and each represent a hydrogen atom, $C_1$–$C_6$ alkyl group, $C_1$–$C_6$ aminoalkyl group, $C_1$–$C_6$ hydroxyalkyl group or $C_6$–$C_{20}$ substituted or unsubstituted aryl group. $R^{251}$ and $R^{252}$ may be connected to each other to form a ring.

$R^{253}$, $R^{254}$, $R^{255}$ and $R^{256}$ may be the same or different and each represent a $C_1$–$C_6$ alkyl group.

More preferably, the organic basic compound is a nitrogen-containing basic compound having two or more nitrogen atoms having different chemical atmospheres per molecule, particularly a compound having both a substituted or unsubstituted amino group and a cyclic structure having nitrogen atom or a compound having an alkylamino group.

Preferred examples of such a compound include substituted or unsubstituted guanidine, substituted or unsubstituted aminopyridine, substituted or unsubstituted aminoalkylpyridine, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholine. Preferred examples of the substituents on these compounds include amino group, aminoalkyl group, alkylamino group, aminoaryl group, arylamino group, alkyl group, alkoxy group, acyl group, acyloxy group, aryl group, aryloxy group, nitro group, hydroxyl group, and cyano group.

Particularly preferred examples of the organic basic compound include guanidine, 1,1-dimethylguranine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the invention is not limited to these compounds.

These nitrogen-containing basic compounds may be used singly or in combination of two or more thereof.

The molar ratio of the acid generator to the organic basic compound in the composition (acid generator)/(organic basic compound) is preferably from 2.5 to 300. When the molar ratio falls below 2.5, the resulting composition exhibits a low sensitivity that can deteriorate resolving powder. On the contrary, when the molar ratio exceeds 300, the resist pattern swells much with time between exposure and heat treatment, occasionally deteriorating resolving power. The molar ratio of (acid generator)/(organic basic compound) is preferably from 5.0 to 200, more preferably from 7.0 to 150.

[7] Surfactant

The composition of the invention preferably comprises a surfactant, particularly fluorine-based and/or silicon-based surfactant incorporated therein In other words, the composition of the invention preferably comprises any or two or more of fluorine-based surfactant, silicon-based surfactant and surfactant containing both fluorine and silicon atoms incorporated therein. The addition of the fluorine-based and/or silicon-based surfactant exerts an effect of inhibiting detective development and improving coatability.

Examples of these surfactants include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,296,143, 5,294,511 and 5,824,451. The following commercially available surfactants may be used as they are.

Examples of these commercially available surfactants include fluorine-based surfactants and silicone-based surfactants such as EFTOP EF301, EF303, EF352 (produced by Shinakita Chemical Co., Ltd.), Frorard FC430, 431 (produced by Sumitomo 3M Co., Ltd.), Megafac F171, F173, F176, F189, R08 (produced by DAINIPPON INK AND CHEMICALS, INCORPORATED), Asahi Guard AG710, Surflon S-382, SC101, 103, 104, 105, 105, 106 (produced by ASAHI GLASS COMPANY) and Troysol S-366 (produced by Troychemcial Company). Further, Polysiloxane Polymer KP-341 (produced by Shin-Etsu Chemical Co., Ltd.) may be used as a silicon-based surfactant.

The amount of the surfactant to be incorporated is normally from 0.001% to 2% by weight, preferably from 0.01% to 1% by weight based on the solid content in the composition of the invention. These surfactants may be added singly or in combination.

[8] (C) Solvent

The composition of the invention is prepared by dissolving the aforementioned various components in a solvent, and then applying the solution to a support. Preferred examples of the solvent to be used herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofurane. These solvents may be used singly or in admixture.

In the invention, as the solvent there is preferably used a mixture of a propylene glycol monoalkyl ether acetate such as propylene glycol monomethyl ether acetate and a propylene glycol monoalkyl ether such as propylene glycol monomethyl ether and propylene glycol monoethyl ether or alkyl lactate such as ethyl lactate.

The solid content concentration of the aforementioned various components in the solvent is preferably from 3% to 15% by weight, more preferably from 5% to 10% by weight.

[9] (X) Non-Polymer-Based Dissolution Inhibitor

As the non-polymer-based dissolution inhibitor of the invention there is preferably used a non-polymer-based dissolution inhibitor having a molecular weight of not greater than 3,000 which is capable of decomposing to increase in its solubility in an alkaline developer by the action of an acid (hereinafter referred to as "acid-decomposable dissolution-inhibiting compound").

As the non-polymer-based dissolution inhibitor having a molecular weight of not greater than 3,000 which is capable of decomposing by the action of an acid to increase solubility in an alkaline developer, there is preferably used an alicyclic, aliphatic or aromatic compound containing an acid-decomposable group such as cholic acid derivative containing an acid-decomposable group described in "Proceeding of SPIE", 2724, 355 (1996) because it doesn't deteriorate the transmission at 220 nm or less, particularly a compound having fluorine atoms in its molecule from the standpoint of transparency.

The molecular weight of the acid-decomposable dissolution-inhibiting compound of the invention is not greater than 3,000, preferably from 300 to 3,000, even more preferably from 500 to 2,500.

The amount of the acid-decomposable dissolution-inhibiting compound to be incorporated is preferably from 3% to 50% by weight, more preferably from 5% to 40% by weight based on the total solid content of the composition.

Specific examples of the acid-decomposable dissolution-inhibiting compound will be given below, but the invention is not limited thereto.

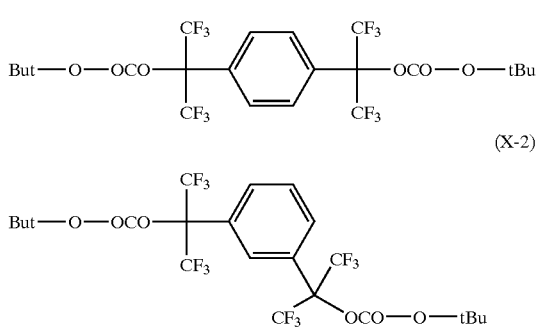

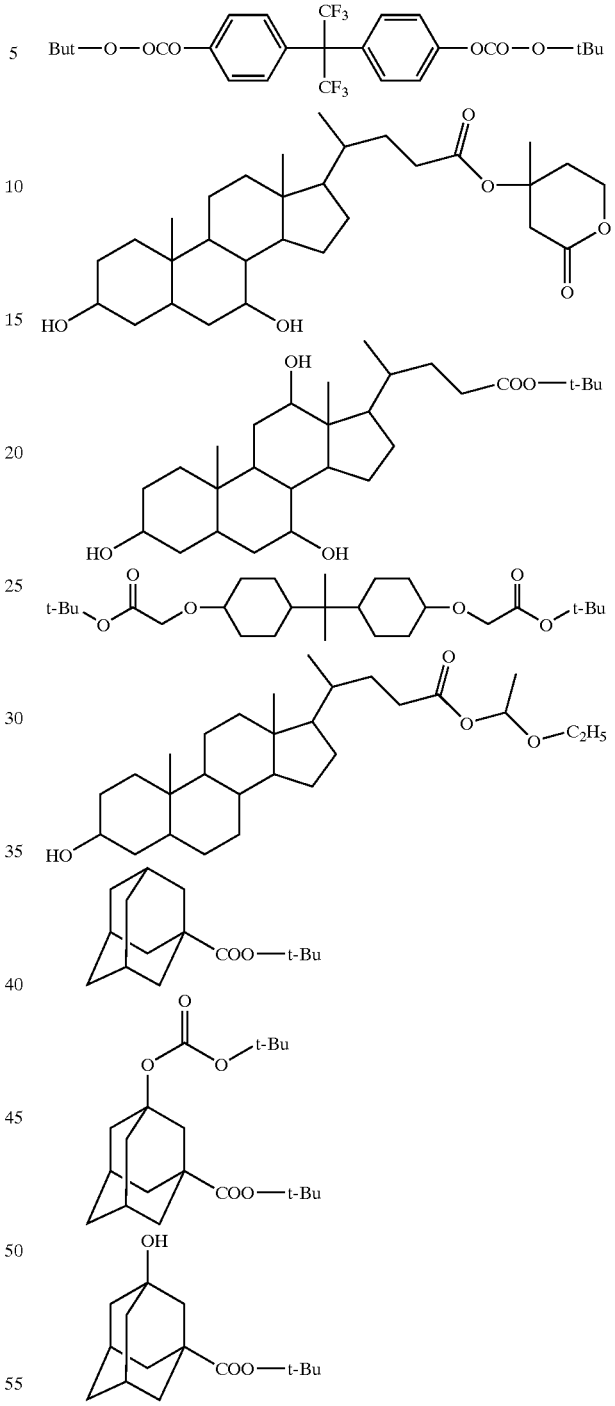

In the production of a precision integrated circuit element or the like, a desired pattern can be formed on the resist film by applying the composition of the invention to a substrate (e.g., transparent substrate such as silicon/silicon dioxide film, glass substrate and ITO substrate), irradiating the coated substrate with an active ray or radiation using a drawing device, and then heating, developing, rising and drying the material. In this manner, a good resist pattern can be formed.

Examples of the developer for the composition of the invention employable herein include aqueous solutions of alkalis such as inorganic alkali (e.g., sodium hydroxide, potassium hydroxide, sodium carbonate, sodium silicate, sodium metasilicate, ammonia), primary amine (e.g., ethylamine and n-propylamine, secondary amine such as diethylamine, di-n-butylamine), tertiary amine (e.g., triethylamine and methyl diethylamine), alcoholamine (e.g., dimethyl ethanolamine, triethanolamine), quaternary ammonium (e.g., tetramethylammonium hydroxide, tetraethylammonium hydroxide, choline) and cyclic amine (e.g., pyrrole, piperidine). The aforementioned aqueous solution of alkali may comprise an alcohol such as isopropyl alcohol or a nonionic or other surface active agent incorporated therein in a proper amount.

Preferred among these developers are quaternary ammoniums, more preferably tetramethylammonium hydroxide and choline.

EXAMPLE

The invention will be further in the following examples, but the invention should not be construed as being limited thereto.

Synthesis of Organic Fluoropolymer

Synthesis Example 1-1 (Synthesis of F-1)

To a mixture of 40.8 g of a monomer represented by the following formula (1) and 13.7 g of a monomer represented by the formula (2) which had been stirred in a nitrogen atmosphere was added 1.24 g of an azo-based polymerization initiator V-65 (produced by Wako Pure Chemical Industries, Ltd.). The mixture was then stirred at a temperature of 65° C. for 1 hour to undergo reaction. To the polymerization reaction solution which had been under reaction was then added dropwise a solution of 40.8 g of a separately prepared monomer represented by the following formula (1) and 13.7 g of a separately prepared monomer represented by the following formula (2) and 2.48 g of V-65 (produced by Wako Pure Chemical Industries, Ltd.) in 60 g of MEK which had been kept at 10° C. in 4 hours.

To the reaction solution was then added 500 ml of hexane to cause the precipitation of the polymer. The resulting upper layer was then removed by decantation. The remaining viscous polymer was then dissolved in 50 ml of acetone. To the solution was then added 1 l of hexane to fractionate the polymer. The unreacted monomer and oligomer were then removed. The polymer thus obtained was then measured for molecular weight by GPC. As a result, the polymer was found to have a weight-average molecular weight of 12,000 and a dispersion degree of 1.5.

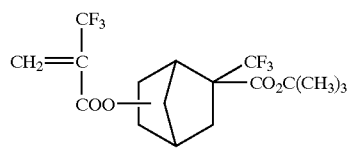

(1)

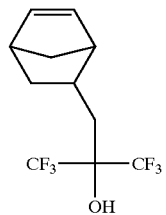

(2)

Synthesis Example 1-2

Synthesis of (F-1) by Living Radical Method

To a mixture of 40.2 g of the same monomer represented by the formula (1) in Synthesis Example 1 and 27.4 g of the same monomer represented by the formula (2) in Synthesis Example 1 which had been stirred in a nitrogen atmosphere were added 1.24 g of AIBN and 1.17 g of TEMPO (2,2,6,6-tetramethylpiperidinyl-1-oxy) as in Synthesis Example 1. The mixture was heated to a temperature of 80° C. where it was then reacted with stirring for 18 hours.

To the reaction solution was then added 500 ml of hexane to cause the precipitation of the polymer. The resulting upper layer was then removed by decantation. The polymer thus obtained was then measured for molecular weight by GPC. As a result, the polymer was found to have a weight-average molecular weight of 13,000 and a dispersion degree of 1.45.

Polymers having the above exemplified structures (F-2) to (F-6) were obtained in the same manner as Synthesis Example 1. The molar ratio, weight-average molecular weight and dispersion degree of the repeating units are as set forth in Table 1-1 below.

TABLE 1-1

| Polymer | Molar composition ratio | Weight-average molecular weight | Dispersion degree |
|---|---|---|---|
| (F-1)-1* | 66/34 | 12,000 | 1.5 |
| (F-1)-2** | 66/34 | 13,000 | 1.45 |
| (F-2) | 60/40 | 13,000 | 1.45 |
| (F-3) | 60/40 | 16,000 | 1.4 |
| (F-4) | 60/40 | 9,500 | 1.5 |
| (F-5) | 60/40 | 8,600 | 1.4 |
| (F-6) | 60/40 | 16,500 | 1.4 |

*Polymer (F-1) obtained in Synthesis Example 1
**Polymer (F-1) obtained in Synthesis Example 2

Synthesis Example 1-3 (Synthesis of Comparative Resin (C-1))

To a mixture of 27.5 g of the monomer of the formula (2) in Synthesis Example 1 and 19.6 g of t-butylester α-trifluoromethylacrylate which had been stirred in a nitrogen atmosphere was added 1.24 g of an azo-based polymerization initiator V-65 (produced by Wako Pure Chemical Industries, Ltd.). The mixture was then stirred at a temperature of 70° C. with stirring for 10 hours to undergo reaction.

To the reaction solution was then added 500 ml of hexane to cause the precipitation of the polymer. The resulting upper layer was then removed by decantation. The remaining viscous polymer was then dissolved in 50 ml of acetone. To the solution was then added 1 l of hexane to fractionate the polymer. The unreacted monomer and oligomer were then removed. The polymer thus obtained was then measured for molecular weight by GPC. As a result, the polymer was found to have a weight-average molecular weight of 8,100 and a dispersion degree of 1.9.

Examples 1 to 7 and Comparative Example 1

An organic fluoropolymer, an acid generator, a surface active agent and an organic basic compound set forth in Table 1-2 below in an amount of 1.2 g, 0.030 g, 100 ppm based on the weight of the polymer solution and 0.0012 g, respectively, were dissolved in 19.6 g of a solvent set forth in Table 1-2. The polymer solution thus obtained was then filtered through a teflon filter having a pore diameter of 0.1 $\mu$m to prepare a positive-working resist solution.

TABLE 1-2

| | Polymer | Acid generator (weight ratio) | Solvent (weight ratio) | Basic compound | Surfactant |
|---|---|---|---|---|---|
| Example | | | | | |
| 1 | (F-1)-1 | (VII-4) | S-2 | N-1 | W-1 |
| 2 | (F-2) | (VII-4) | S-2 | N-1 | W-1 |
| 3 | (F-3) | (VII-24) | S-2 | N-1 | W-1 |
| 4 | (F-4) | (VII-36)/(PAG4-1) 50/50 | S-2/S-3 (80/20) | N-2 | W-2 |
| 5 | (F-5) | (VII-53)/(II-1f) 50/50 | S-2/S-1 (80/20) | N-3 | W-1 |
| 6 | (F-6) | (VII-53)/(II-1f) 50/50 | S-2 | N-1 | W-2 |
| 7 | (F-1)-2 | (VII-4) | S-2 | N-1 | W-1 |
| Comparative Example | | | | | |
| 1 | (C-1) | (VII-4) | S-2 | N-1 | W-1 |

The symbols in Table 2 represent the following meanings.
N-1: Hexamethylene tetramine
N-2: 1,5-Diazabicyclo[4.3.0]-5-nonene
N-3: 1,8-Diazabicyclo[5.4.0]-7-undecene
W-1: Megafac F176 (produced by DAINIPPON INK AND CHEMICALS, INCORPORATED) (fluorine-based)
W-2: Megafac R08 (produced by DAINIPPON INK AND CHEMICALS, INCORPORATED) (fluorine-based and silicon-based)
S-1: Methyl lactate
S-2: Propylene glycol monomethyl ether acetate
S-3: Propylene glycol monomethyl ether Using a spin coater, the positive-working resist solution thus prepared was uniformly applied to a silicon wafer coated with an anti-reflection film (DUV42-6, produced by Brewer Science Inc.). The coated material was then heated and dried at a temperature of 120° C. for 60 seconds to form a positive-working resist layer having a thickness of 0.1 $\mu$m. The resist layer was patternwise exposed to light from a KrF microstepper through a line-and-space mask (line width: 150 nm; line/space=1:1), and then immediately heated to a temperature of 110° C. over a hot plate for 90 seconds. The resin layer was subjected to development in a 2.38 wt-% aqueous solution of tetramethylammonium hydroxide at a temperature of 23° C. for 30 seconds, rinsed with purified water for 30 seconds, and then dried. The pattern thus obtained on the silicon wafer was then evaluated for resist pattern in the following manner.

Line Edge Roughness:

Using a Type S-8840 CD-measurement SEM (produced by Hitachi, Ltd.), the line pattern was measured on 50 points on a 5 $\mu$m longitudinal edge range for distance from the reference line on which edges are to be present. The standard deviation of measurements was then determined to calculate $3\sigma$. The smaller $3\sigma$ is, the smaller is the line edge roughness.

Test for Evaluation of Defective Development:

Using a Type KLA-2112 measuring instrument (produced by KLA-Tenchor Co., Ltd.), the resist pattern thus obtained was measured for defective development. The primary data thus obtained were used as measurements.

Occurrence of Scum:

For the evaluation of occurrence of scum, the amount of development residue (scum) on a resist pattern having a line width of 0.15 $\mu$m was determined. Those showing no scum were judged A. Those showing much scum were judged C. Those showing an intermediate amount of scum were judged B.

The results of property evaluation are set forth in Table 1-3.

TABLE 1-3

| | Line edge roughness (nm) | Number of defective development points | Scum |
|---|---|---|---|
| Example 1 | 10.0 | 28 | A |
| Example 2 | 10.5 | 27 | A |
| Example 3 | 10.3 | 27 | A |
| Example 4 | 11.3 | 30 | B |
| Example 5 | 11.0 | 28 | A |
| Example 6 | 10.8 | 29 | A |
| Example 7 | 10.6 | 34 | A |
| Comparative Example 1 | 14.6 | 69 | C |

As can be seen in the results of Table 1-3, the composition of the invention exhibits little line edge roughness and good development properties.

In accordance with the invention, a positive-working resist composition having improved resistance to line edge roughness, defective development and scum can be provided.

Synthesis of Resin

Synthesis Example 2-1 (Synthesis of Resin (F'-1))

To a mixture of 51.3 g of a monomer represented by the following formula (1) and 13.7 g of a monomer represented by the formula (2) which had been stirred in a nitrogen atmosphere was added 1.24 g of an azo-based polymerization initiator V-65 (produced by Wako Pure Chemical Industries, Ltd.). The mixture was then stirred at a temperature of 65° C. for 1 hour to undergo reaction. To the polymerization reaction solution which had been under reaction was then added dropwise a solution of 51.3 g of a separately prepared monomer represented by the following formula (1) and 13.7 g of a separately prepared monomer represented by the following formula (2) and 2.48 g of V-65 (produced by Wako Pure Chemical Industries, Ltd.) in 60 g of MEK which had been kept at 10° C. in 4 hours.

To the reaction solution was then added 500 ml of hexane to cause the precipitation of the polymer. The resulting upper layer was then removed by decantation. The remaining viscous polymer was then dissolved in 50 ml of acetone. To the solution was then added 1 l of hexane to fractionate the polymer. The unreacted monomer and oligomer were then removed. The resin (F'-1) thus obtained was then measured for molecular weight by GPC. As a result, the polymer was found to have a weight-average molecular weight of 13,500 and a dispersion degree of 1.5.

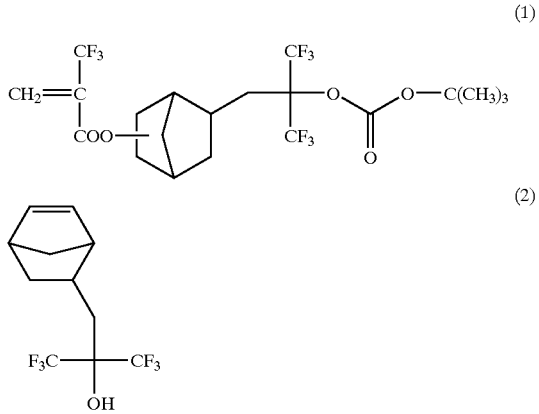

(1)

(2)

Synthesis Example 2-2

Synthesis of Resin (F'-1)A by living Radical Method

To a mixture of 51.3 g of the same monomer represented by the formula (1) and 13.7 g of the same monomer represented by the formula (2) which had been stirred in a nitrogen atmosphere were added 1.24 g of AIBN and 1.17 g of TEMPO (2,2,6,6-tetramethylpiperidinyl-1-oxy). The mixture was heated to a temperature of 80° C. where it was then reacted with stirring for 18 hours.

To the reaction solution was then added 500 ml of hexane to cause the precipitation of the polymer. The resulting upper layer was then removed by decantation. The resin (F'-1) thus obtained was then measured for molecular weight by GPC. As a result, the polymer was found to have a weight-average molecular weight of 13,000 and a dispersion degree of 1.45.

Resins (F'-2) to (F'-6) set forth in Table 2-1 were obtained in the same manner as Synthesis Example 2-1.

TABLE 2-1

| Resin | Molar ratio of repeating units | Weight-average molecular weight | Dispersion degree |
|---|---|---|---|
| (F'-1) | 66/34 | 13,500 | 1.50 |
| (F'-2) | 75/25 | 14,000 | 1.45 |
| (F'-3) | 60/40 | 15,000 | 1.40 |
| (F'-4) | 60/40 | 9.900 | 1.50 |
| (F'-5) | 40/20/40 | 13,000 | 1.40 |
| (F'-6) | 75/25 | 15,000 | 1.40 |
| (F'-1)A | 66/34 | 13,000 | 1.45 |

Synthesis Example 2-3 (Synthesis of Comparative Resin (C'-1)

To a mixture of 27.5 g of the monomer of the formula (2) and 19.6 g of t-butylester α-trifluoromethylacrylate which had been stirred in a nitrogen atmosphere was added 1.24 g of an azo-based polymerization initiator V-65 (produced by Wako Pure Chemical Industries, Ltd.). The mixture was then stirred at a temperature of 70° C. with stirring for 10 hours to undergo reaction.

To the reaction solution was then added 500 ml of hexane to cause the precipitation of the polymer. The resulting upper layer was then removed by decantation. The remaining viscous polymer was then dissolved in 50 ml of acetone. To the solution was then added 1 l of hexane to fractionate the polymer. The unreacted monomer and oligomer were then removed. The resin (C'-1) thus obtained was then measured for molecular weight by GPC. As a result, the polymer was found to have a weight-average molecular weight of 8,100 and a dispersion degree of 1.9.

Examples 2-1 to 2-7 and Comparative Example 2-1

A resin, an acid generator, a surface active agent and an organic basic compound set forth in Table 2-2 below in an amount of 1.2 g, 0.030 g, 100 ppm based on the weight of the resin solution and 0.0012 g, respectively, were dissolved in 19.6 g of a solvent set forth in Table 2-2. The polymer solution thus obtained was then filtered through a teflon filter having a pore diameter of 0.1 μm to prepare a positive-working resist solution.

TABLE 2-2

| Example | Resin | Acid generator (weight ratio) | Solvent (weight ratio) | Basic compound | Surfactant |
|---|---|---|---|---|---|
| 2-1 | (F'-1) | (VII-4) | S-2 | N-1 | W-1 |
| 2-2 | (F'-2) | (VII-4) | S-2 | N-1 | W-1 |
| 2-3 | (F'-3) | (VII-24) | S-2 | N-1 | W-1 |
| 2-4 | (F'-4) | (VII-36)/(PAG4-1) 50/50 | S-2/S-3 (80/20) | N-2 | W-2 |
| 2-5 | (F'-5) | (VII-53)/(II-1f) 50/50 | S-2/S-1 (80/20) | N-3 | W-1 |
| 2-6 | (F'-6) | (VII-53)/(II-1f) 50/50 | S-2 | N-1 | W-2 |
| 2-7 | (F'-1)A | (VII-4) | S-2 | N-1 | W-1 |
| Comparative Example |  |  |  |  |  |
| 2-1 | (C'-1) | (VII-4) | S-2 | N-1 | W-1 |

The symbols in Table 2-2 represent the following meanings.

N-1: Hexamethylene tetramine
N-2: 1,5-Diazabicyclo[4.3.0]-5-nonene
N-3: 1,8-Diazabicyclo[5.4.0]-7-undecene
W-1: Megafac F176 (produced by DAINIPPON INK AND CHEMICALS, INCORPORATED) (fluorine-based)
W-2: Megafac R08 (produced by DAINIPPON INK AND CHEMICALS, INCORPORATED)(fluorine-based and silicon-based)
S-1: Methyl lactate
S-2: Propylene glycol monomethyl ether acetate
S-3: Propylene glycol monomethyl ether Using a spin coater, the positive-working resist solution thus prepared was uniformly applied to a silicon wafer coated with an anti-reflection film (DUV42-6, produced by Brewer Science Inc.). The coated material was then heated and dried at a temperature of 120° C. for 60 seconds to form a positive-working resist layer having a thickness of 0.1 μm. The resist layer was patternwise exposed to light from a KrF microstepper through a line-and-space mask (line width: 150 nm; line/space=1:1), and then immediately heated to a temperature of 110° C. over a hot plate for 90 seconds. The resin layer was subjected to development in a 2.38 wt % aqueous solution of tetramethylammonium hydroxide at a temperature of 23° C. for 30 seconds, rinsed with purified water for 30 seconds, and then dried. The pattern thus obtained on the silicon wafer was then evaluated for resist pattern in the following manner.

Evaluation of Line Edge Roughness:

Using a Type S-8840 CD-measurement SEM (produced by Hitachi, Ltd.), the line pattern was measured on 50 points on a 5 μm longitudinal edge range for distance from the reference line on which edges are to be present. The standard deviation of measurements was then determined to calculate 3σ. The smaller 3σ is, the smaller is the line edge roughness.

Evaluation of Defective Development:

Using a Type KLA-2112 measuring instrument (produced by KLA-Tenchor Co., Ltd.), the resist pattern thus obtained was measured for defective development. The primary data thus obtained were used as measurements.

Evaluation of Occurrence of Scum:

For the evaluation of occurrence of scum, the amount of scum (development residue) on a resist pattern having a line width of 0.15 μm was determined. Those showing no scum were judged A. Those showing much scum were judged C. Those showing an intermediate amount of scum were judged B.

The results of property evaluation are set forth in Table 2-3.

TABLE 2-3

|  | Line edge roughness (nm) | Number of defective development points | Scum |
| --- | --- | --- | --- |
| Example 2-1 | 10.5 | 25 | A |
| Example 2-2 | 11.5 | 21 | A |
| Example 2-3 | 10.9 | 26 | B |
| Example 2-4 | 11.3 | 28 | A |
| Example 2-5 | 10.6 | 28 | A |
| Example 2-6 | 11.5 | 26 | A |
| Example 2-7 | 11.0 | 28 | A |
| Comparative Example 2-1 | 14.6 | 69 | C |

As can be seen in the results of Table 2-3, the positive-working resist composition of the invention exhibits little line edge roughness and good development properties.

In accordance with the invention, a positive-working resist composition having improved resistance to line edge roughness, defective development and scum can be provided.

Synthesis of Monomer (1) Synthesis of Intermediate Product (A)

218.5 g (0.7 mol) of a compound obtained by protecting the alcohol moiety of 2,2-bis(trifluoromethyl)hydroxyacetic acid by t-butoxycarbonyl group (hereinafter referred to as "t-Boc") was dissolved in 500 g of methyl isobutyl ketone. To the solution were then added dropwise 86.78 g (0.7 mol) of 2-bromoethanol and 101.2 g (1.0 mol) of triethylamine in 1 hour. After the dropwise addition, the reaction mixture was then heated to a temperature of 50° C. with stirring for 3 hours. Thereafter, the resulting salt was withdrawn by filtration, neutralized with a 0.1 N aqueous solution of HCl, and then washed with water. The resulting organic phase was then dehydrated over 70 g of magnesium sulfate. The solvent was then distilled off. The residue was then purified through a silica gel chromatography to obtain 199.5 g (yield: 80%) of the following intermediate product (A).

Intermediate Product (A)

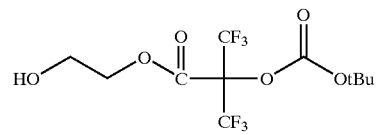

(2) Synthesis of Monomer (1)

39.15 g (0.5 mol) of 5-norbornene-2-carboxylic acid chloride was dissolved in 200 g of tetrahydrofurane. To the solution were then added dropwise 178.1 g (0.5 mol) of the intermediate product (A) and 60.71 g (0.6 mol) of triethylamine while being cooled to 0° C. in 1 hour. After the dropwise addition, the reaction mixture was then stirred at room temperature for 4 hours. To the reaction solution was then added a 0.1 N aqueous solution of HCl to acidify the reaction solution. The reaction solution was then further stirred for 1 hour. Thereafter, the resulting salt was neutralized with a 0.1 N aqueous solution of sodium hydroxide. To the reaction solution was then added 100 ml of ethyl acetate to cause separation. The resulting organic phase was then dehydrated over 20 g of magnesium sulfate. The solvent was then distilled off. The product was then purified through a silica gel chromatography to obtain 146.7 g (yield: 74%) of the following monomer (1).

(3) Synthesis of Monomers (2) and (3)

The following monomers (2) and (3) were obtained in the same manner as in the process (2) except that the alcohol and acid chloride to be added were changed.

(4) Synthesis of Monomer (4)

The following monomer (4) was obtained by reacting α-trifluoromethylacrylic acid and t-Boc-protected 2,2-bis(trifluoromethyl)hydroxyacetic acid as carboxylic acids with a dibromated norbornadiene as a bromo compound in the same manner as in the process (1), and then subjecting the product to deprotection reaction in the same manner as in the latter stage of the process (2).

(5) Synthesis of Monomer (5)

The following monomer (5) was obtained by obtaining t-Boc-protected monomer (5) in the same manner as in the process (1) except that the halogen compound to be added was changed to 4-chloromethylstyrene, and then removing t-Boc group from the product under the same acidic conditions as in the latter stage of the process (2).

Monomers of the Invention

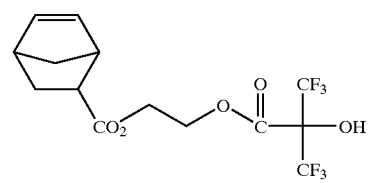

Monomer (1)

Monomer (2)

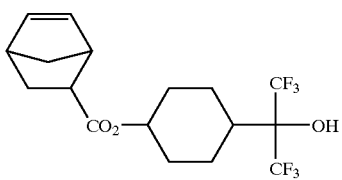

Monomer (3)

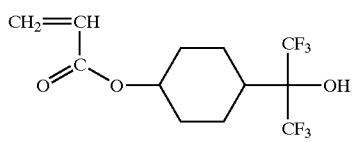

Monomer (4)

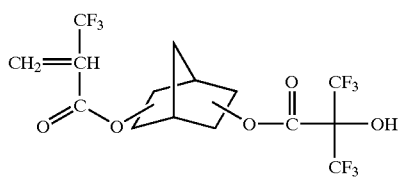

Monomer (5)

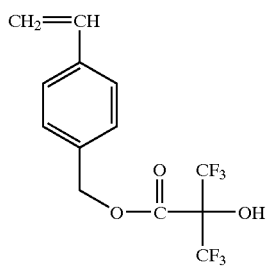

Synthesis of Polymer (1) Synthesis of Polymer (1)

37.63 g (0.1 mol) of the monomer (1), 10.99 g (0.086 mol) of t-butyl acrylate and 9.81 g (0.1 mol) of maleic anhydride were dissolved in 70 g of tetrahydrofurane. The air in the reaction system was then replaced by nitrogen. To the reaction solution was then added 1.48 g (0.009 mol) of a polymerization initiator AIBN. The reaction mixture was then heated to a temperature of 65° C. in a stream of nitrogen through the reaction system for 8 hours. Thereafter, the reaction solution was cooled to room temperature, and then added dropwise to 1.5 l of methanol. The resulting powder was withdrawn by filtration, and then dried at a temperature of 100° C. under reduced pressure to obtain 30.97 g (yield: 53%) of the following polymer (1) in powder form. The polymer (1) thus obtained exhibited a weight-average molecular weight of 9,300 as determined by gel permeation chromatography (GPC) and a dispersion degree of 1.57. The composition ratio of monomer (1)/t-butyl acrylate/maleic anhydride was 32/31/37 as determined by 1H,13C-NMR analysis.

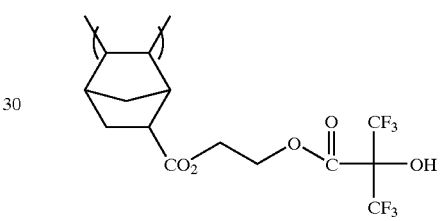

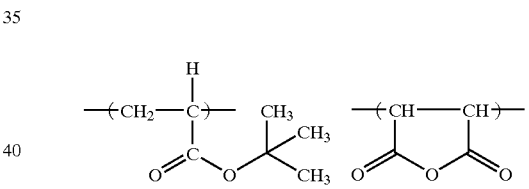

The polymers (1) to (10) set forth in Table 3-1 below were obtained in the same manner as mentioned above except that the monomers to be added were changed.

TABLE 3-1

| Polymer | Monomers (a1), (a2) of the invention | Acid-decomposable monomer (b) | Other monomer (c) | Weight-average molecular weight | Degree of dispersion of molecular weight | Composition ratio (a1)/[(a2)]/(b)/(c) |
|---|---|---|---|---|---|---|
| (1) | (1) | (2) | Maleic anhydride | 9,300 | 1.57 | 32/31/37 |
| (2) | (1) | (3) | Maleic anhydride | 9,100 | 1.53 | 33/32/35 |
| (3) | (2) | (2) | Maleic anhydride | 8,400 | 1.67 | 29/33/38 |
| (4) | (2),(4) | (3) | None | 7,900 | 1.53 | 19/35/46 |
| (5) | (3) | (1) | None | 11,200 | 1.51 | 54/46 |
| (6) | (3) | (3) | None | 10,400 | 1.78 | 48/52 |
| (7) | (4) | (1) | None | 9,600 | 1.67 | 47/53 |
| (8) | (4) | (4) | None | 8,800 | 1.45 | 55/45 |
| (9) | (5) | (1) | None | 9,900 | 1.53 | 52/48 |
| (10) | (5) | (4) | None | 12,400 | 1.61 | 48/52 |

The acid-decomposable monomers (1) to (4) in Table 1 are as follows.

Monomer (1)

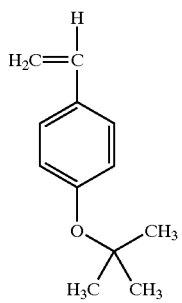

Monomer (2)

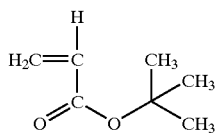

Monomer (3)

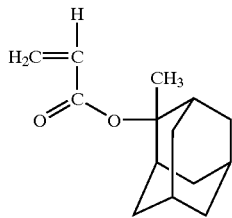

Monomer (4)

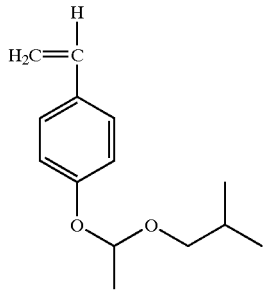

Synthesis of Acid Generator (1) (Synthesis of Triphenylsulfonium Nonafluorobutanesulfonate (VII-4)

20 g of triphenylsulfonium iodide was dissolved in 500 ml of methanol. To the solution was then added 12.5 g of silver oxide. The reaction mixture was then stirred at room temperature for 4 hours. The reaction solution was then filtered to remove the silver compound. To the solution was then added 14.9 g of nonafluorobuanesulfonic acid. The solution was then concentrated. To the resulting oil-based matter was then added 300 ml of diisopropyl ether. The reaction mixture was then thoroughly stirred. Decantation was then effected twice to remove diisopropyl ether. The resulting oil-based matter was then dried under reduced pressure to obtain 18 g of the desired product.

(2) (Synthesis of Triphenylsulfonium 4-dodecylbeznenesulfonate (PAG4-1)

10 g of triphenylsulfonium iodide was dissolved in 500 ml of methanol. To the solution was then added 4.44 g of silver oxide. The reaction mixture was then stirred at room temperature for 4 hours. The reaction solution was then filtered to remove the silver compound. To the solution was then added 4.67 g of 4-dodecylbeznenesulfonic acid. The solution was then concentrated. To the resulting oil-based matter was then added 300 ml of diisopropyl ether. The reaction mixture was then thoroughly stirred. Decantation was then effected twice to remove diisopropyl ether. The resulting oil-based matter was then dried under reduced pressure to obtain 6 g of the desired product.

(3) (Synthesis of Triphenylsulfonium Nonafluoropentanoate (II-4f)

20 g of triphenylsulfonium iodide was dissolved in 500 ml of methanol. To the solution was then added 12.5 g of silver oxide. The reaction mixture was then stirred at room temperature for 4 hours. The reaction solution was then filtered to remove the silver compound. To the solution was then added 14.9 g of nonafluoropentanoic acid. The solution was then concentrated. To the resulting oil-based matter was then added 300 ml of diisopropyl ether. The reaction mixture was then thoroughly stirred. Decantation was then effected twice to remove diisopropyl ether. The resulting oil-based matter was then dried under reduced pressure to obtain 18 g of the desired product.

Examples 3-1 to 3-10 and Comparative Examples 3-1 and 3-2

Measurement of Transmission:

1.36 of each of the polymers (1) to (10) and the comparative polymers (1) and (2) was dissolved in 8.5 g of propylene glycol monomethyl ether acetate. The solution was filtered through a polytetrafluoroethylene filter having a pore diameter of 0.1 $\mu$m, applied to a calcium fluoride disc using a spin coater, and then heated and dried at a temperature of 120° C. for 5 minutes to obtain a film having a thickness of 0.1 $\mu$m. These films were each measured for absorption using a Type CAMS-507 spectrometer produced by Acton Inc. From these measurements were then calculated the transmission at 157 nm. The results are set forth in Table 3-2 below.

TABLE 3-2

| Polymer | % Transmission of film having a thickness of 0.1 $\mu$m at 157 nm |
|---|---|
| Polymer (1) of the invention | 55 |
| Polymer (2) of the invention | 53 |
| Polymer (3) of the invention | 52 |
| Polymer (4) of the invention | 47 |
| Polymer (5) of the invention | 56 |
| Polymer (6) of the invention | 57 |
| Polymer (7) of the invention | 51 |
| Polymer (8) of the invention | 49 |
| Polymer (9) of the invention | 50 |
| Polymer (10) of the invention | 51 |
| Comparative polymer (1) | 24 |
| Comparative polymer (2) | 25 |

The structure of the comparative polymers (1) and (2) set forth in Table 3-2 will be given below.

Comparative polymer (1)

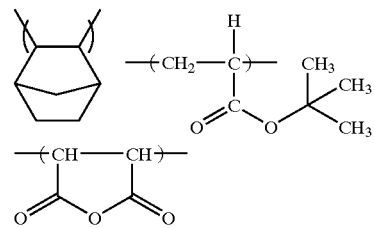

-continued

Comparative polymer (2)

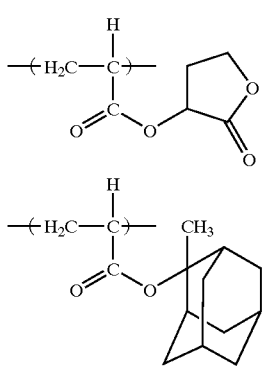

The molar ratio, weight-average molecular weight and molecular weight dispersion degree of the comparative repeating units (1) and (2) are set forth in Table 3-3 below.

TABLE 3-3

| | Composition ratio (components corresponding to the figures shown) | Weight-average molecular weight | Dispersion degree |
|---|---|---|---|
| Comparative polymer (1) | 31/39/30 | 8,200 | 1.52 |
| Comparative polymer (2) | 56/44 | 11,000 | 1.56 |

As can be seen in Table 3-2, the coat layer comprising the resin (A3) exhibited a transmission which is high enough to give a sufficient transparency at 157 nm.

Evaluation of Coatability and Image-Forming Properties:

1.2 g of each of the polymers (1) to (10) and the comparative polymer (1), 0.024 g of the triphenylsulfonium nonafluorobutanesulfonate (VII-4), and optionally 0.24 g of (X) a non-polymer-based dissolution inhibitor set forth in Table 3-4 below and 0.006 g of (B2) component were mixed. The mixture was dissolved in 19.6 g of a propylene glycol monomethyl ether acetate, and then filtered through a polytetrafluoroethylene filter having a pore diameter of 0.1 μm to prepare a positive-working resist composition.

The various positive-working resist compositions were each then applied to a silicon wafer treated with hexamethyl disilazalane to evaluate the coatability thereof.

The wafer thus coated was then heated and dried at a temperature of 120° C. for 60 seconds to form a resist layer having a thickness of 0.1 μm. Using a Type VUVES-4500 157 nm laser exposure/dissolution behavior analyzer (produced by Litho Tech Japan Corporation), the resist layer was then evaluated for sensitivity during exposure at 157 nm and dissolution contrast at exposed/unexposed area.

Sensitivity:

The wafer which had been exposed was heated and dried at a temperature of 130° C. for 90 seconds, subjected to development with a 2.38 wt % aqueous solution of tetramethylammonium hydroxide at a temperature of 23° C. for 60 seconds, rinsed with purified water for 30 seconds, dried, and then measured for layer thickness. The sensitivity is defined by the minimum exposure at which the layer thickness is zero.

Dissolution contrast:

The dissolution contrast is defined by the gradient (tan θ) of the exposure-dissolution rate curve.

Coatability:

G: No defective coating; F: Radial streak-like pattern observed; P: Very poor (not uniformly coatable)

The results are set forth in Table 3-4.

TABLE 3-4

| Polymer | (X) inhibitor | (B2) component | Coatability | Sensitivity (mJ/cm$^2$) | Dissolution contrast |
|---|---|---|---|---|---|
| Polymer (1) of the invention | — | — | F | 3.0 | 5.9 |
| Polymer (1) of the invention | (X-1) | — | F | 2.5 | 5.6 |
| Polymer (1) of the invention | — | (PAG4-1) | G | 3.0 | 6.2 |
| Polymer (2) of the invention | — | — | F | 3.0 | 5.9 |
| Polymer (2) of the invention | (X-2) | — | F | 2.6 | 6.3 |
| Polymer (2) of the invention | — | (PAG4-34) | G | 3.0 | 6.5 |
| Polymer (3) of the invention | — | — | F | 2.5 | 5.8 |
| Polymer (4) of the invention | — | — | F | 3.5 | 5.7 |
| Polymer (5) of the invention | — | — | G | 4.0 | 6.0 |
| Polymer (6) of the invention | — | — | F | 2.5 | 5.8 |
| Polymer (7) of the invention | — | — | F | 1.5 | 5.6 |
| Polymer (8) of the invention | — | — | F | 3.0 | 5.8 |
| Polymer (8) of the invention | (X-3) | — | F | 2.6 | 6.2 |
| Polymer (9) of the invention | — | — | F | 3.0 | 6.1 |
| Polymer (10) of the invention | — | — | F | 3.5 | 5.9 |
| Comparative polymer (1) | — | — | G | 8.5 | 5.2 |

As can be seen in Table 3-4, the positive-working resist composition of the invention exhibits a high sensitivity when exposed at 157 nm, a great dissolution contrast and a high resolution. It can be also seen that the addition of (X) non-polymer-based dissolution inhibitor and (B1b) component or (B2) component makes it possible to enhance the sensitivity and resolution of the composition.

Evaluation of Coatability and Image-Forming Properties of Composition Further Comprising (B1b) Component or (B2) Component Incorporated therein:

1.2 g of each of the polymers (1) to (10) and the comparative polymer (1) were mixed with 0.024 g of triphenylsulfonium nonafluorobutanesulfonate (VII-4) and 0.006 g of (B1b) or (B2) component set forth in Table 3-5 below. The mixture was then dissolved in 19.6 g of propylene glycol monomethyl ether acetate. The solution was then filtered through a polytetrafluoroethylene filter having a pore diameter of 0.1 μm to prepare a positive-working resist composition.

The resist composition thus obtained was then evaluated in the same manner as mentioned above. The results are set forth in Table 3-5 below.

TABLE 3-5

| Polymer | (B1b) or (B2) component | Coat-ability | Sensitivity (mJ/cm$^2$) | Dissolution contrast |
|---|---|---|---|---|
| Polymer (1) of the invention | (PAG4-1) | G | 3.0 | 6.2 |
| Polymer (2) of the invention | (PAG4-1) | G | 3.0 | 6.5 |
| Polymer (3) of the invention | (PAG4-34) | G | 3.0 | 6.7 |
| Polymer (4) of the invention | (PAG4-34) | G | 4.0 | 6.4 |
| Polymer (5) of the invention | (PAG4-34) | G | 4.5 | 6.7 |
| Polymer (6) of the invention | (II-4f) | G | 3.5 | 6.5 |
| Polymer (7) of the invention | (II-5f) | G | 2.0 | 6.7 |
| Polymer (8) of the invention | (II-49f) | G | 3.5 | 6.6 |
| Polymer (9) of the invention | (III-3f) | G | 3.5 | 6.9 |
| Polymer (10) of the invention | (PAG4-1) | G | 4.0 | 6.5 |
| Comparative polymer (1) | (PAG4-1) | G | 10.0 | 5.3 |

As can be seen in Table 3-5, the coat layer comprising the resin (A3) of the invention exhibits an excellent sensitivity and resolution when exposed at 157 nm. It can also be seen that the addition of (B1b) or (B2) component makes it possible to further enhance the resolution of the composition and improve the coatability of the composition.

In accordance with the invention, a positive-working resist composition which exhibits an excellent transmission when exposed at 157 nm and excellent coatability, sensitivity and resolution can be provided.

Synthesis of Monomer

Synthesis Example 1 (Synthesis of Monomer (M1) Corresponding to Repeating Unit (A1-5))

20.6 g of the following compound (D), 27.8 g of the following compound (F) and 5 g of triphenyl phosphine were mixed, and then reacted at a temperature of 150° C. in an autoclave for 10 hours. The reaction solution was then purified through a silica gel column chromatography to obtain 46 g of the following monomer (M1) corresponding to the repeating unit (A1-5).

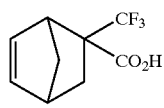
(D)

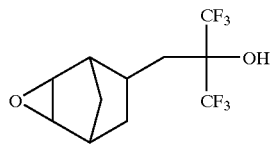
(F)

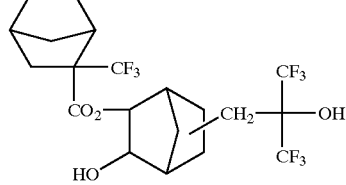
(M1)

Synthesis Example 2 (Synthesis of Monomer Corresponding to Repeating Unit (A2-6))

20.6 g of the following compound (D), 28.0 g of the following compound (E) and 5 g of triphenyl phosphine were mixed, and then reacted at a temperature of 150° C. in an autoclave for 10 hours. The reaction solution was then purified through a silica gel column chromatography to obtain 46 g of the following monomer corresponding to the repeating unit (A2-6).

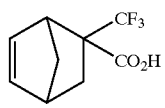
(D)

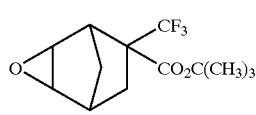
(E)

Synthesis of Resin (A4)

Synthesis Example 1 (Synthesis of Resin (R1))

To a mixture of 48.0 g of the following monomer (M1) and 28.8 g of the following monomer (M2) which had been stirred in a nitrogen atmosphere was added 1.24 g of AIBN. Thereafter, to the mixture was added 1.24 g of an azo-based polymerization initiator V-65 (produced by Wako Pure Chemical Industries, Ltd.). The mixture was then stirred at a temperature of 70° C. for 10 hours to undergo reaction.

To the reaction solution was then added 500 ml of hexane to cause the precipitation of the polymer. The resulting upper layer was then removed by decantation. The remaining viscous polymer was then dissolved in 50 ml of acetone. To the solution was then added 1 l of hexane to fractionate the polymer. The unreacted monomer and oligomer were then removed. The polymer thus obtained was then measured for molecular weight by GPC. As a result, the polymer was found to have a weight-average molecular weight of 8,100 and a dispersion degree of 1.9.

This polymer was then again dissolved in 50 ml of acetone. To the solution was then added 1 l of hexane to fractionate the resin (R1). The unreacted monomer and oligomer were then removed. The resin (R1) thus obtained was then measured for molecular weight by GPC. As a result, the resin was found to have a weight-average molecular weight of 9,800 and a dispersion degree of 1.4.

Resins (R-2) to (R-12) were obtained in the same manner as mentioned above.

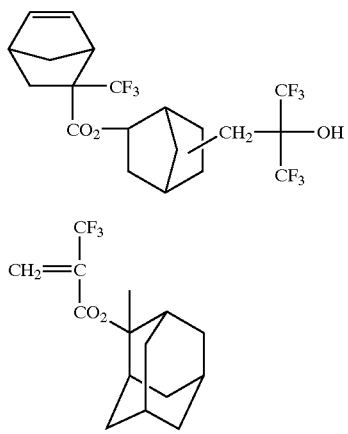

(M1)

(M2)

The molar composition ratio, weight-average molecular weight and dispersion degree of the resins (R-1) to (R-12) are set forth in Table 4-1 below.

TABLE 4-1

| Resin | Molar composition ratio (NMR) (The figures correspond to the ratio of various repeating units in the order shown) | Weight-average molecular weight | Dispersion degree |
|---|---|---|---|
| (R1) | 60/40 | 9,800 | 1.40 |
| (R2) | 60/40 | 13,000 | 1.45 |
| (R3) | 60/40 | 12,000 | 1.40 |
| (R4) | 60/40 | 9,400 | 1.50 |
| (R5) | 60/40 | 10,000 | 1.40 |
| (R6) | 60/40 | 7,500 | 1.40 |
| (R7) | 25/25/50 | 8,500 | 1.40 |
| (R8) | 25/25/50 | 12,000 | 1.40 |
| (R9) | 25/25/50 | 9,000 | 1.40 |
| (R10) | 25/25/50 | 10,500 | 1.40 |
| (R11) | 25/25/50 | 14,500 | 1.40 |
| (R12) | 25/25/50 | 8,500 | 1.40 |

Synthesis of Comparative Resin

Synthesis Example 1 (Synthesis of Comparative Resin (C-1))

To a mixture of 27.5 g of 3-(5-bicyclo[2.2.1]heptene-2-il)-1,1,1-trifluoro-2-(trifluoromethyl)-2-propane-2-ol and 19.6 g of t-butylester α-trifluoromethylacrylate which had been stirred in a nitrogen atmosphere was added 1.24 g of an azo-based polymerization initiator V-65 (produced by Wako Pure Chemical Industries, Ltd.). The mixture was then stirred at a temperature of 70° C. for 10 hours to undergo reaction.

To the reaction solution was then added 500 ml of hexane to cause the precipitation of the polymer. The resulting upper layer was then removed by decantation. The remaining viscous polymer was then dissolved in 50 ml of acetone. To the solution was then added 1 l of hexane to fractionate the comparative resin (C-1). The unreacted monomer and oligomer were then removed. The comparative resin (C-1) thus obtained was then measured for molecular weight by GPC. As a result, the polymer was found to have a weight-average molecular weight of 8,100 and a dispersion degree of 1.9.

Examples 4-1 to 4-12 and Comparative Example 4-1

A resin, an acid generator, a surface active agent and an organic basic compound set forth in Table 4-2 below in an amount of 1.2 g, 0.030 g, 100 ppm based on the weight of the resin solution and 0.0012 g, respectively, were dissolved in 19.6 g of a solvent set forth in Table 4-2. The polymer solution thus obtained was then filtered through a teflon filter having a pore diameter of 0.1 μm to prepare a positive-working resist solution.

TABLE 4-2

| | Resin | Acid generator (weight ratio) | Organic basic compound | Surface active agent | Solvent (weight ratio) |
|---|---|---|---|---|---|
| Example | | | | | |
| 4-1 | (R1) | (VII-4) | N-1 | W-1 | S-2 |
| 4-2 | (R2) | (VII-4) | N-1 | W-1 | S-2 |
| 4-3 | (R3) | (VII-24) | N-1 | W-1 | S-2 |
| 4-4 | (R4) | (VII-36)/(PAG4-1) 50/50 | N-2 | W-2 | S-2/S-3 (80/20) |
| 4-5 | (R5) | (VII-53)/(II-1f) 50/50 | N-3 | W-1 | S-2/S-1 (80/20) |
| 4-6 | (R6) | (VII-53)/(II-1f) 50/50 | N-1 | W-2 | S-2 |
| 4-7 | (R7) | (VII-24) | N-1 | W-1 | S-2 |
| 4-8 | (R8) | (VII-4) | N-1 | W-1 | S-2 |
| 4-9 | (R9) | (VII-24) | N-1 | W-1 | S-2 |
| 4-10 | (R10) | (VII-36)/(PAG4-1) 50/50 | N-2 | W-2 | S-2/S-3 (80/20) |
| 4-11 | (R11) | (VII-53)/(II-1f) 50/50 | N-3 | W-1 | S-2/S-1 (80/20) |
| 4-12 | (R12) | (VII-53)/(II-1f) 50/50 | N-1 | W-2 | S-2 |
| Comparative Example | | | | | |
| 4-1 | (C-1) | (VII-4) | N-1 | W-1 | S-2 |

The symbols in Table 4-2 represent the following meanings.

N-1: Hexamethylene tetramine
N-2: 1,5-Diazabicyclo[4.3.0]-5-nonene
N-3: 1,8-Diazabicyclo[5.4.0]-7-undecene
W-1: Megafac F176 (produced by DAINIPPON INK AND CHEMICALS, INCORPORATED) (fluorine-based)
W-2: Megafac R08 (produced by DAINIPPON INK AND CHEMICALS, INCORPORATED)(fluorine-based and silicon-based)
S-1: Methyl lactate
S-2: Propylene glycol monomethyl ether acetate
S-3: Propylene glycol monomethyl ether Using a spin coater, the positive-working resist solution thus prepared was uniformly applied to a silicon wafer coated with an anti-reflection film (DUV42-6, produced by Brewer Science Inc.). The coated material was then heated and dried at a temperature of 120° C. for 60 seconds to form a positive-working resist layer having a thickness of 0.1 μm. The resist layer was patternwise exposed to light from a KrF microstepper through a line-and-space mask (line width: 150 nm; line/space=1:1), and then immediately heated to a temperature of 110° C. over a hot plate for 90 seconds. The resin layer was subjected to development in a 2.38 wt % aqueous solution of tetramethylammonium hydroxide at a temperature of 23° C. for 30 seconds, rinsed with purified water for 30 seconds, and then dried. The pattern thus obtained on the silicon wafer was then evaluated for resist pattern in the following manner.

Line Edge Roughness:

Using a Type S-8840 CD-measurement SEM (produced by Hitachi, Ltd.), the line pattern was measured on 50 points on a 5 μm longitudinal edge range for distance from the reference line on which edges are to be present. The standard deviation of measurements was then determined to calculate 3σ. The smaller 3σ is, the smaller is the line edge roughness.

Test for Evaluation of Detective Development:

Using a Type KLA-2112 measuring instrument (produced by KLA-Tenchor Co., Ltd.), the resist pattern thus obtained was measured for defective development. The primary data thus obtained were used as measurements.

Occurrence of Scum:

For the evaluation of occurrence of scum, the amount of scum (development residue) on a resist pattern having a line width of 0.15 μm was determined. Those showing no scum were judged A. Those showing much scum were judged C. Those showing an intermediate amount of scum were judged B.

The results of property evaluation are set forth in Table 4-3.

TABLE 4-3

| | Line edge roughness (nm) | Number of defective development points | Scum |
|---|---|---|---|
| Example 4-1 | 8.9 | 23 | A |
| Example 4-2 | 10.2 | 29 | A |
| Example 4-3 | 9.5 | 36 | B |
| Example 4-4 | 10.4 | 31 | A |
| Example 4-5 | 9.7 | 29 | A |
| Example 4-6 | 9.4 | 36 | A |
| Example 4-7 | 9.5 | 37 | B |
| Example 4-8 | 9.9 | 26 | A |
| Example 4-9 | 8.9 | 34 | A |
| Example 4-10 | 9.6 | 31 | A |
| Example 4-11 | 10.8 | 39 | B |
| Example 4-12 | 10.5 | 29 | A |
| Comparative Example 4-1 | 12.9 | 67 | C |

As can be seen in the results of Table 4-3, the positive-working resist composition of the invention exhibits little line edge roughness and good development properties.

In accordance with the invention, a positive-working resist composition having improved resistance to line edge roughness, defective development and scum can be provided.

What is claimed is:

1. A positive-working resist composition comprising:

(A2) a resin containing a repeating unit represented by the following formula (Ia), and at least one selected from the group consisting of repeating units represented by the following formulae (II) to (IV), which increases the solubility in an alkali developing solution by the action of an acid, and (B) a compound capable of generating an acid upon irradiation with one of actinic rays and radiation:

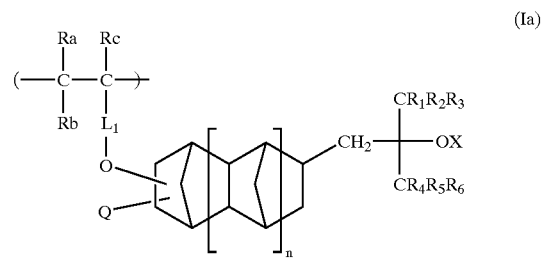

wherein Ra, Rb and Rc each independently represents a hydrogen atom, a fluorine atom or a fluoroalkyl group, $L_1$ represents a single bond or a divalent connecting group, $R_1$ to $R_6$ each independently represents a hydrogen atom, a fluorine atom or a fluoroalkyl group, with the proviso that at least one of $R_1$ to $R_6$ is not a hydrogen atom, X represents a hydrogen atom or a group capable of decomposing by the action of an acid, n represents 0 or 1, Q represents a hydrogen atom or a hydroxyl group:

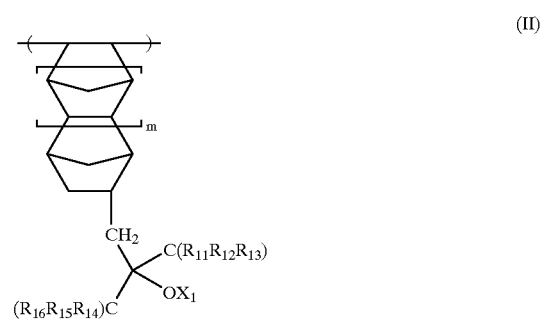

wherein $R_{11}$ to $R_{16}$ each independently represents a hydrogen atom, a fluorine atom or a fluoroalkyl group, with the proviso that ay least one of $R_{11}$ to $R_{16}$ is not a hydrogen atom, $X_1$ represents a hydrogen atom or a group capable of decomposing by the action of an acid, m represents 0 or 1:

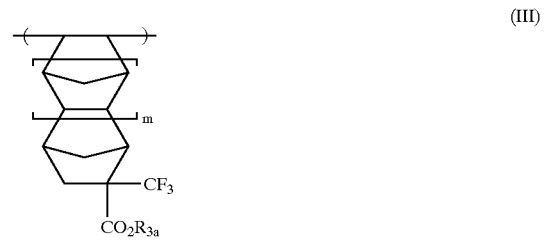

wherein $R_{3a}$ represents a hydrogen atom or a group capable of decomposing by the action of an acid, m represents 0 or 1:

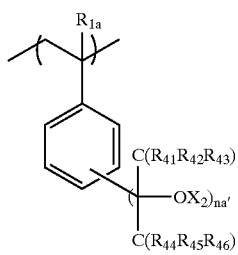

(IV)

wherein R1a represents a hydrogen atom, a fluorine atom, a chlorine atom, a bromine atom, a cyano group or a trifluoromethyl group, R41 to $R_{46}$ each independently represents a hydrogen atom, a fluorine atom or a fluoroalkyl group, with the proviso that at least one of $R_{41}$ to $R_{46}$ is not a hydrogen atom, $X_2$ represents a hydrogen atom or a group capable of decomposing by the action of an acid, na' represents an integer of from 1 to 5, with the proviso that when n is 2 or greater, the two or more $R_{41}$'s to $R_{46}$'s and $X_2$'s may be the same or different.

2. The composition according to claim 1, wherein Rc is a fluorine atom or a trifluoromethyl group.

3. The composition according to claim 1, wherein $L_1$ is a carbonyl group, an ethylene group or a single bond.

4. The composition according to claim 1, wherein $R_{3a}$ is a tertiary alkyl group having an alicyclic group.

5. The composition according to claim 1, wherein the resin has a weight-average molecular weight of from 3,000 to 30,000 and a molecular weight dispersion degree of from 1.1 to 1.5.

6. The composition according to claim 1, wherein the resin is obtained by a process which comprises removing low molecular components from a polymer obtained by a radical polymerization method.

7. The composition according to claim 1, wherein the resin is obtained by a living polymerization method.

8. The composition according to claim 1, wherein the resin is obtained by a dropping polymerization method which comprises further adding a monomer continuously or intermittently during the radical polymerization of the monomer in the presence of a radical polymerization initiator.

9. The composition according to claim 1, wherein the compound (B) comprises a compound (B1) which is capable of generating an organic sulfonic acid by irradiation of actinic ray or radiation.

10. The composition according to claim 1, wherein the compound (B) comprises a compound (B2) which is capable of generating a carboxylic acid by irradiation of actinic ray or radiation.

11. The composition according to claim 1, which further comprises a solvent (C) comprising a mixture solvent of propylene glycol monoalkyl ether acetates with propylene glycol monoalkyl ethers or alkyl lactates.

\* \* \* \* \*